(12) United States Patent
Boundy et al.

(10) Patent No.: US 11,592,039 B1
(45) Date of Patent: Feb. 28, 2023

(54) DILATANT FLUID BASED OBJECT MOVEMENT CONTROL MECHANISM

(71) Applicant: Moshun, LLC, Oak Brook, IL (US)

(72) Inventors: Timothy John Boundy, Deer Park, IL (US); Steven Michael Barger, Bartlett, IL (US); Terence Michael Lydon, Westmont, IL (US); Richard Michael Lang, Howey In The Hills, FL (US); Wilfredo Gonzalez, Jr., Plainfield, IL (US); Darren Michael Boundy, Long Grove, IL (US); Eric McHugh, Naperville, IL (US); David Schuda, Wheaton, IL (US); George L. Wilson, IV, Kalamazoo, MI (US); Gary W. Grube, Barrington Hills, IL (US); Jason K. Resch, Warwick, RI (US); Mario F. DeRango, Cary, IL (US); John Edward Buchalo, South Barrington, IL (US); Richard A. Herbst, Clarendon Hills, IL (US); Kurt Estes, Lake Zurich, IL (US); Evan Anderson, Naples, FL (US)

(73) Assignee: Moshun, LLC, Oak Brook, IL (US)

( * ) Notice: Subject to any disclaimer, the term of this patent is extended or adjusted under 35 U.S.C. 154(b) by 26 days.

(21) Appl. No.: 17/515,007

(22) Filed: Oct. 29, 2021

Related U.S. Application Data

(60) Provisional application No. 63/250,700, filed on Sep. 30, 2021.

(51) Int. Cl.
*F15B 15/20* (2006.01)

(52) U.S. Cl.
CPC .................... *F15B 15/204* (2013.01)

(58) Field of Classification Search
CPC .............. F15B 15/1447; F15B 15/2815; F15B 15/204; F15B 9/53; F15B 9/006; F15B 9/19; F15B 2224/041
See application file for complete search history.

(56) References Cited

U.S. PATENT DOCUMENTS

| | | | |
|---|---|---|---|
| 7,918,167 B2 | 4/2011 | Tanielian et al. | |
| 8,276,497 B2 | 10/2012 | Hunn | |
| 8,499,908 B2 | 8/2013 | Barker et al. | |
| 9,303,709 B2 * | 4/2016 | Manes | F16F 9/10 |
| 9,453,550 B2 | 9/2016 | Smith et al. | |
| 9,498,690 B2 | 11/2016 | Carlson et al. | |

(Continued)

*Primary Examiner* — Jason H Duger
(74) *Attorney, Agent, or Firm* — Gary W. Grube

(57) ABSTRACT

A method for execution by a computing entity includes interpreting a fluid flow response from fluid flow sensors to produce a piston velocity and a piston position of a piston associated with a head unit device. The head unit device includes a chamber filled with a shear thickening fluid (STF) and a variable partition positioned within the chamber between the piston and a closed end of the chamber to dynamically affect volume of the chamber based on activation of the variable partition. The method further includes determining a shear force based on the piston velocity and the piston position. The method further includes determining a desired response for the STF based on the shear force, the piston velocity, and the piston position. The method further includes activating the variable partition using the desired response for the STF to adjust the volume of the chamber.

19 Claims, 33 Drawing Sheets

(56) References Cited

U.S. PATENT DOCUMENTS

| | | |
|---|---|---|
| 9,970,831 B2 | 5/2018 | Shih |
| 10,017,082 B2 | 7/2018 | Zwaan |
| 10,161,173 B2 | 12/2018 | Kruedener et al. |
| 10,371,097 B2 | 8/2019 | Sellinger et al. |
| 10,443,678 B2 | 10/2019 | Galindo Rosales et al. |
| 10,462,578 B2 | 10/2019 | Hoskins et al. |
| 10,480,281 B2 | 11/2019 | Al-Olayan et al. |
| 10,580,231 B2 | 3/2020 | Lin |
| 2016/0215552 A1 | 7/2016 | Lohken et al. |
| 2016/0238100 A1* | 8/2016 | Smith ............... B64C 25/58 |
| 2017/0210458 A1 | 7/2017 | Tothill et al. |
| 2017/0226682 A1 | 8/2017 | Duckworth |
| 2019/0371090 A1 | 12/2019 | Lin et al. |
| 2020/0011110 A1 | 1/2020 | Boundy |
| 2020/0238780 A1* | 7/2020 | Dhaens ............... B60G 17/08 |

\* cited by examiner

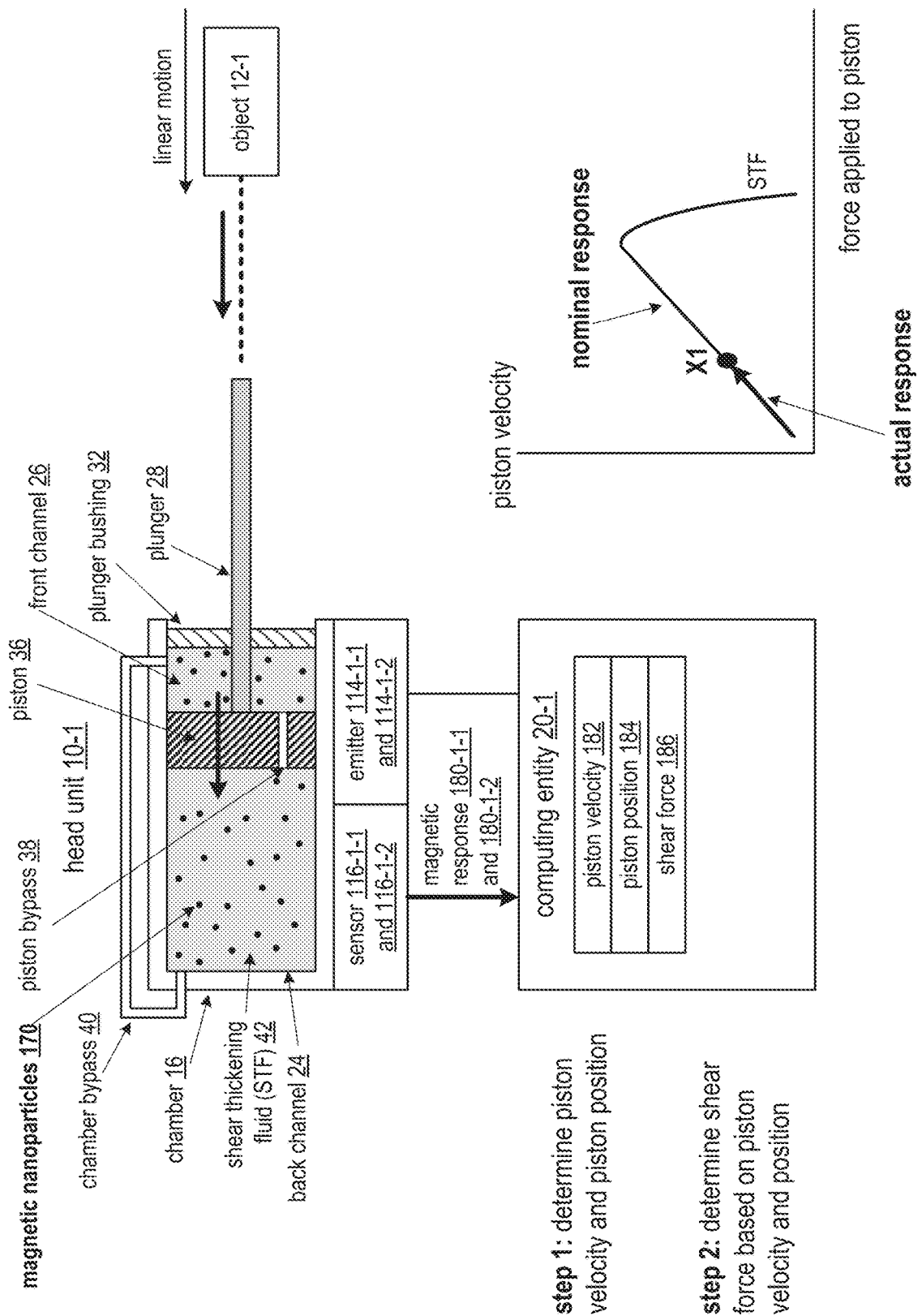

DILATANT FLUID BASED OBJECT MOVEMENT CONTROL MECHANISM

CROSS-REFERENCE TO RELATED APPLICATIONS

The present U.S. Utility Patent application claims priority pursuant to 35 U.S.C. § 119(e) to U.S. Provisional Application No. 63/250,700, entitled "DILATANT FLUID BASED OBJECT MOVEMENT CONTROL MECHANISM" filed Sep. 30, 2021, which is hereby incorporated herein by reference in its entirety and made part of the present U.S. Utility Patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to systems that measure and control mechanical movement and more particularly to sensing and controlling of a linear and/or rotary movement mechanism that includes a chamber with dilatant fluid (e.g., a shear thickening fluid).

Description of Related Art

Many mechanical mechanisms are subject to undesired movement that can lead to annoying sounds, property damage and/or loss, and personal injury and even death. Desired and undesired movements of the mechanical mechanisms may involve a wide range of forces. A need exists to control the wide range of forces to solve these problems.

BRIEF DESCRIPTION OF THE SEVERAL VIEWS OF THE DRAWING(S)

FIGS. 6A-6C are schematic block diagrams of another embodiment of a mechanical and computing system illustrating an example of controlling operational aspects in accordance with the present invention;

DETAILED DESCRIPTION OF THE INVENTION

Figure 1A:
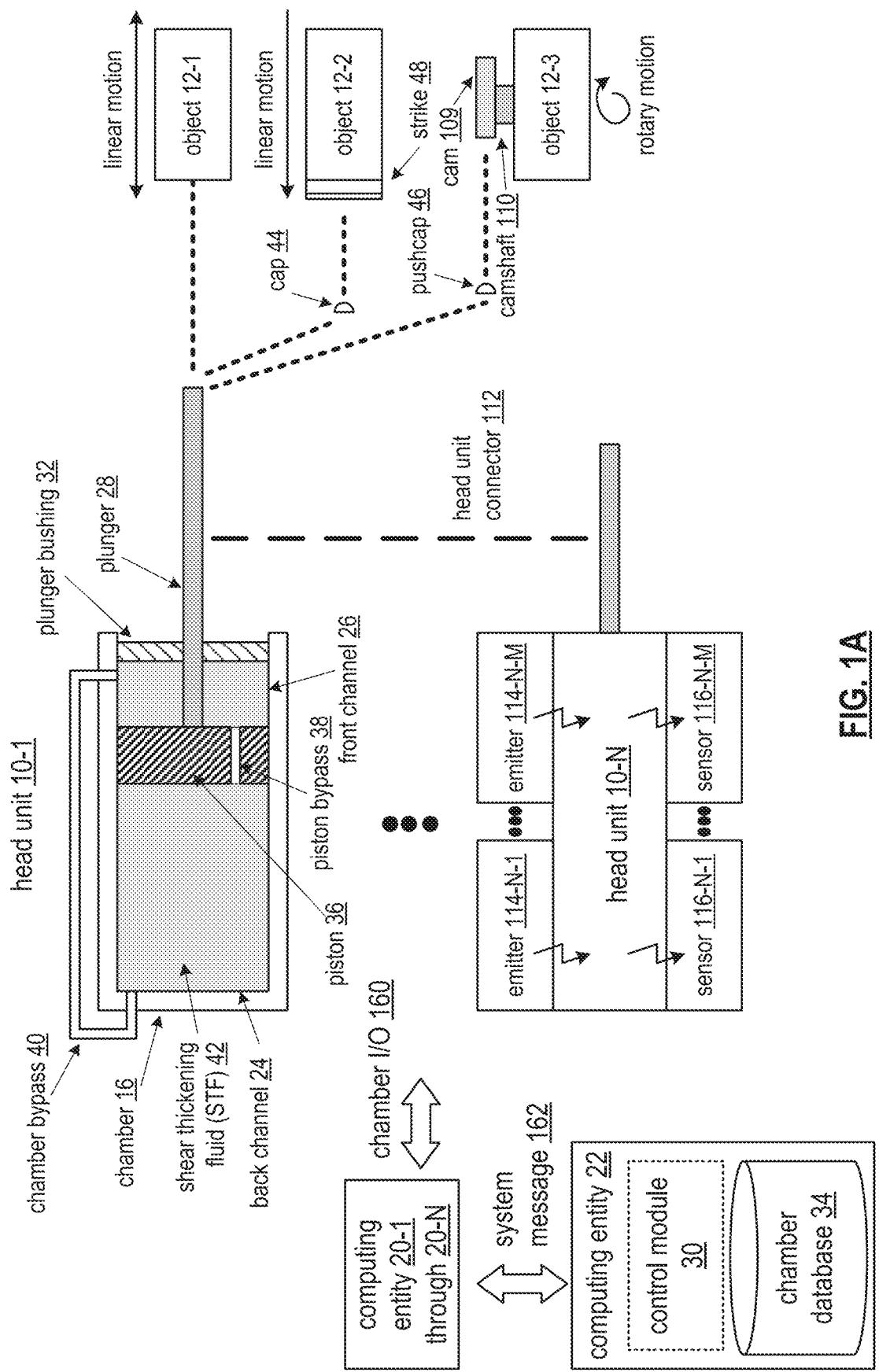
FIG. 1A is a schematic block diagram of an embodiment of a mechanical and computing system in accordance with the present invention.

FIG. 1A is a schematic block diagram of an embodiment of a mechanical and computing system that includes a set of head units 10-1 through 10-N, objects 12-1 through 12-3, computing entities 20-1 through 20-N associated with the head units 10-1 through 10-N, and a computing entity 22. The objects include any object that has mass and moves. Examples of an object include a door, an aircraft wing, a portion of a building support mechanism, and a particular drivetrain, etc.

The cross-sectional view of FIG. 1A illustrates a head unit that includes a chamber 16, a piston 36, a plunger 28, a plunger bushing 32, and a chamber bypass 40. The chamber 16 contains a shear thickening fluid (STF) 42. The chamber 16 includes a back channel 24 and a front channel 26, where the piston partitions the back channel 24 and the front channel 26. The piston 36 travels axially within the chamber 16. The chamber 16 may be a cylinder or any other shape that enables movement of the piston 36 and compression of the STF 42. The STF 42 is discussed in greater detail with reference to FIGS. 1B and 1C.

The plunger bushing 32 guides the plunger 28 into the chamber 16 in response to force from the object 12-1. The plunger bushing 32 facilitates containment of the STF within the chamber 16. The plunger bushing 32 remains in a fixed position relative to the chamber 16 when the force from the object moves the piston 36 within the chamber 16. In an embodiment the plunger bushing 32 includes an O-ring between the plunger bushing 32 and the chamber 16. In another embodiment the plunger bushing 32 includes an O-ring between the plunger bushing 32 and the plunger 28.

The piston 36 includes a piston bypass 38 between opposite sides of the piston to facilitate flow of a portion the STF between the opposite sides of the piston (e.g., between the back channel 24 and the front channel 26) when the piston travels through the chamber in an inward or an outward direction.

Alternatively, or in addition to, the chamber bypass 40 is configured between opposite ends of the chamber 16, wherein the chamber bypass 40 facilitates flow of a portion of the STF between the opposite ends of the chamber when the piston travels through the chamber in the inward or outward direction (e.g., between the back channel 24 and the front channel 26).

In alternative embodiments, the piston bypass 38 and the chamber bypass 40 includes mechanisms to enable STF flow in one direction and not an opposite direction. In further alternative embodiments, a control valve within the piston bypass 38 and/or the chamber bypass 40 controls the STF flow between the back channel 24 and the front channel 26.

The plunger 28 is operably coupled to a corresponding object by one of a variety of approaches. A first approach includes a direct connection of the plunger 28 to the object 12-1 such that linear motion in any direction couples from the object 12-1 to the plunger 28. A second approach includes the plunger 28 coupled to a cap 44 which receives a one way force from a strike 48 attached to the object 12-2. A third approach includes a pushcap 46 that receives a force from a rotary-to-linear motion conversion component that is attached to the object 12-3. In an example, the object 12-3 is connected to a camshaft 110 which turns a cam 109 to strike the pushcap 46.

In an embodiment, two or more of the head units are coupled by a head unit connector 112. When so connected, actuation of a piston in a first head unit is essentially replicated in a piston of a second head unit. The head unit connector 112 includes a mechanical element between plungers of the two or more head units and/or direct connection of two or more plungers to a common object. For example, plunger 28 of head unit 10-1 and plunger 28 of head unit 10-2 are directly connected to object 12-1 when utilizing a direct connection.

Further associated with each head unit is a set of emitters and a set of sensors. For example, head unit 10-N includes a set of emitters 114-N-1 through 114-N-M and a set of sensors 116-N-1 through 116-N-M. Emitters includes any type of energy and or field emitting device to affect the STF, either directly or indirectly via other nanoparticles suspended in the STF. Examples of emitter categories include light, audio, electric field, magnetic field, wireless field, etc. Specific examples of fluid manipulation emitters include a mechanical vibration generator, an image generator, a light emitter, an audio transducer, a speaker, an ultrasonic sound transducer, an electric field generator, a magnetic field generator, and a radio frequency wireless field transmitter. Specific examples of magnetic field emitters include a Helmholtz coil, a Maxwell coil, a permanent magnet, a solenoid, a superconducting electromagnet, and a radio frequency transmitting coil.

Sensors include any type of energy and/or field sensing device to output a signal that represents a reaction, motion or position of the STF. Examples of sensor categories include mechanical position, image, light, audio, electric field, magnetic field, wireless field, etc. Specific examples of fluid flow sensors include a mechanical position sensor, an image sensor, a light sensor, an audio sensor, a microphone, an ultrasonic sound sensor, an electric field sensor, a magnetic field sensor, and a radio frequency wireless field sensor. Specific examples of magnetic field sensors include a Hall effect sensor, a magnetic coil, a rotating coil magnetometer, an inductive pickup coil, an optical magnetometry sensor, a nuclear magnetic resonance sensor, and a caesium vapor magnetometer.

The computing entities 20-1 through 20-N are discussed in detail with reference to FIG. 2A. The computing entity 22 includes a control module 30 and a chamber database 34 to facilitate storage of history of operation, desired operations, and other aspects of the system.

In an example of operation, the head unit 10-1 controls motion of the object 12-1 and includes the chamber 16 filled at least in part with the shear thickening fluid 42, the piston 36 housed at least partially radially within the chamber 16, and the piston 36 is configured to exert pressure against the shear thickening fluid 42 in response to movement of the piston 36 from a force applied to the piston from the object 12-1. The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates.

The shear thickening fluid 42 (e.g., dilatant non-Newtonian fluid) has nanoparticles of a specific dimension that are mixed in a carrier fluid or solvent. Force applied to the shear thickening fluid 42 results in these nanoparticles stacking up, thus stiffening and acting more like a solid than a flowable liquid when a shear threshold is reached. In particular, viscosity of the shear thickening fluid 42 rises significantly when shear rate is increased to a point of the shear threshold. The relationship between viscosity and shear rates is discussed in greater detail with reference to FIGS. 1A and 1B.

In another example of operation, the object 12-1 applies an inward motion force on the plunger 28 which moves the piston 36 in words within the chamber 16. As the piston moves inward, shear rate of the shear thickening fluid 42 changes. A sensor 116-1-1 associated with the chamber 16 of the head unit 10-1 outputs chamber I/O 160 to the computing entity 20-1, where the chamber I/O 160 includes a movement data associated with the STF 42 as a result of the piston 36 moving inwards. Having received the chamber I/O 160, the computing entity 20-1 interprets the chamber I/O 160 to reproduce the movement data.

The computing entity 20-1 outputs the movement data as a system message 162 to the computing entity 22. The control module 30 stores the movement data in the chamber database 34 and interprets the movement data to determine whether to dynamically adjust the viscosity of the shear thickening fluid. Dynamic adjustment of the viscosity results in dynamic control of the movement of the piston 36, the plunger 28, and ultimately the object 12-1. Adjustment of the viscosity affects velocity, acceleration, and position of the piston 36.

The control module 30 determines whether to adjust the viscosity based on one or more desired controls of the object 12-1. The desired controls include accelerating, deaccelerating, abruptly stopping, continuing on a current trajectory, continuing at a constant velocity, or any other movement control. For example, the control module 30 determines to abruptly stop the movement of the object 12-1 when the object 12-1 is a door and the door is detected to be closing at a rate above a maximum closing rate threshold level and when the expected shear rate versus viscosity of the shear thickening fluid 42 requires modification (e.g., boost the viscosity now to slow the door from closing too quickly).

When determining to modify the viscosity, the control module 30 outputs a system message 162 to the computing entity 20-1, where the system message 162 includes instructions to immediately boost the viscosity beyond the expected shear rate versus viscosity of the shear thickening fluid 42. Alternatively, the system message 162 includes specific information on the relationship of viscosity versus shear rate.

Having received the system message 162, the computing entity 20-1 determines a set of adjustments to make with regards to the shear thickening fluid 42 within the chamber 16. The set of adjustments includes one or more of adjusting STF 42 flow through the chamber bypass 40, adjusting STF 42 flow through the piston bypass 38, and activating an emitter of a set of emitters 114-1-1 through 114-N-1. The flow adjustments include regulating within a flow range, stopping, starting, and allowing in one particular direction. For example, the computing entity 20-1 determines to activate emitter 114-1-1 to produce a magnetic field such as to interact with magnetic nanoparticles within the STF 42 to raise the viscosity. The computing entity 20-1 issues another chamber I/O 160 to the emitter 114-1-1 to initiate a magnetic influence process to boost the viscosity of the STF 42.

In an alternative embodiment, the computing entity 22 issues another system message 162 to two or more computing entities (e.g., 20-1 and 20-2) to boost the viscosity for corresponding head units 10-1 and 10-2 when the head unit connector 112 connects head units 10-1 and 10-2 and both head units are controlling the motion of the object 12-1. For instance, one of the head units informs the computing entity 22 that the object 12-1 is moving too quickly inward and the predicted stopping power of the expected viscosity versus shear rate of the STF 42 of the head unit, even when boosted, will not be enough to slow the object 12-1 to a desired velocity or position. When informed that one head unit, even with a modified viscosity, is not enough to control the object 12-1, the control module 30 determines how many other head units (e.g., connected via the head unit connector 112) to apply and to dynamically modify the viscosity.

In yet another alternative embodiment, the computing entity 22 issues a series of system messages 162 to a set of computing entities associated with a corresponding set of head units to produce a cascading effect of altering of the viscosity of the STF 42 of each of the chambers 16 associated with the set of head units. For example, 3 head units are controlled by 3 corresponding computing entities to adjust viscosity in a time cascaded manner. For instance, head unit 10-1 abruptly changes the viscosity to attempt to slow the object 12-1 followed seconds later by head unit 10-2 abruptly changing the viscosity to attempt to further slow the object 12-1, followed seconds later by head unit 12-3 abruptly changing the viscosity to attempt to further slow the object 12-1.

In a still further alternative embodiment, the computing entity 22 conditionally issues each message of the series of system messages 162 to the set of computing entities associated with the corresponding set of head units to produce the cascading effect of altering of the viscosity of the STF 42 of each of the chambers 16 associated with the set of head units only when a most recent adaptation of viscosity is not enough to slow the object 12-1 with desired results. For example, the 3 head units are controlled by the 3 corresponding computing entities to adjust viscosity in a conditional time cascaded manner. For instance, head unit 10-1 abruptly changes the viscosity to attempt to slow the object 12-1 followed seconds later by head unit 10-2 abruptly changing the viscosity if head unit 10-1 was unsuccessful to attempt to further slow the object 12-1, followed seconds later by head unit 12-3 abruptly changing the viscosity if head unit 10-2 was unsuccessful to attempt to further slow the object 12-1.

Figure 1B:
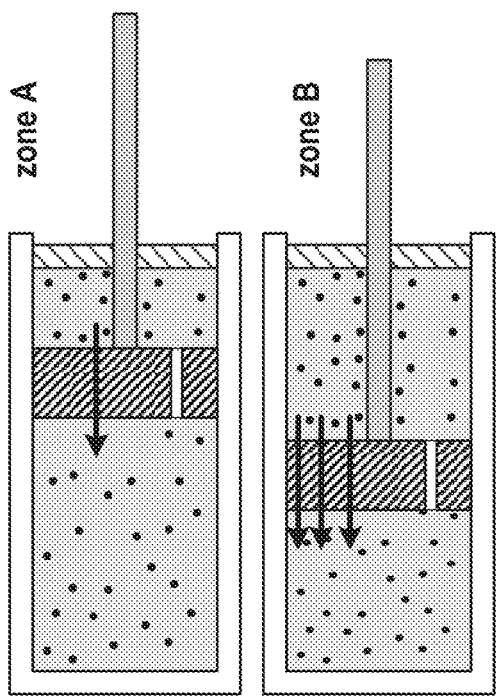
FIG. 1B is a graph of viscosity vs. shear rate for an aspect of an embodiment of a mechanical and computing system in accordance with the present invention.
Figure 1B:
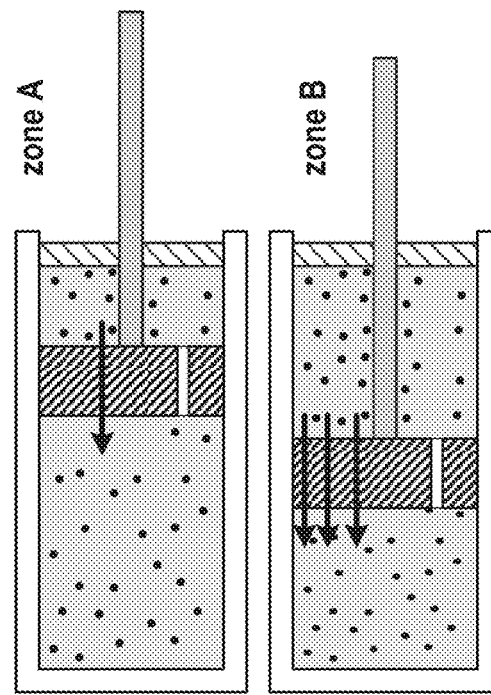
Figure 1B:
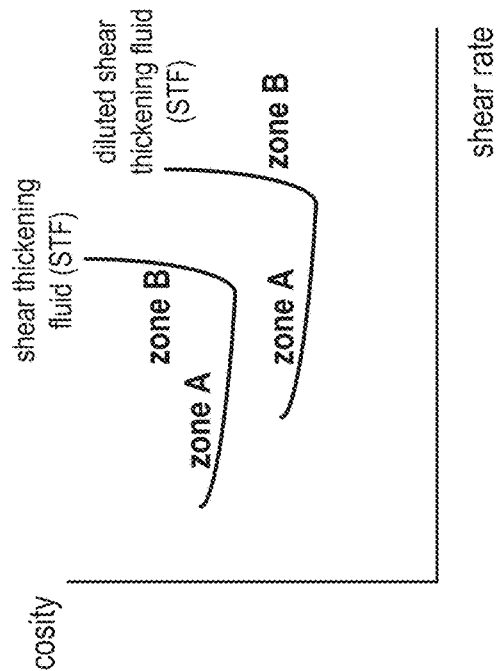

FIG. 1B is a graph of viscosity vs. shear rate for an aspect of an embodiment of a mechanical and computing system that includes a chamber, a shear thickening fluid, and a piston that moves through the chamber applying forces on the shear thickening fluid. The shear thickening fluid includes a non-Newtonian fluid since the relationship between shear rate and viscosity is nonlinear.

A relationship between compressive impulse (e.g., shear rate) and the viscosity of the shear thickening fluid is nonlinear and may comprise one or more inflection points as the piston travels within the chamber in response to different magnitudes of forces and different accelerations. The viscosity of the STF may also be a function of other influences, such as electric fields, acoustical waves, magnetic fields, and other similar influences. As a first example of a response of a shear thickening fluid, a first range of shear rates in zone A has a decreasing viscosity as the shear rate increases and then in a second range of shear rates in zone B the viscosity increases abruptly. As a second example of a response of a diluted shear thickening fluid, the first range of shear rates in zone A extends to a higher level of shear rates with the decreasing viscosity and then in the still higher second range of shear rates in zone B the viscosity increases abruptly similar to that of the shear thickening include.

The shear thickening fluid includes particles within a solvent. Examples of particles of the shear thickening fluid include oxides, calcium carbonate, synthetically occurring minerals, naturally occurring minerals, polymers, or a mixture thereof. Further examples of the particles of the shear thickening fluid include $SiO_2$, polystyrene, or polymethylmethacrylate.

The particles are suspended in a solvent. Example components of the solvent include water, a salt, a surfactant, and a polymer. Further example components of the solvent include ethylene glycol, polyethylene glycol, ethanol, silicon oils, phenyltrimethicone or a mixture thereof. Example particle diameters range from less than 100 μm to less than 1 millimeter. In an instance, the shear thickening fluid is made of silica particles suspended in polyethylene glycol at a volume fraction of approximately 0.57 with the silica particles having an average particle diameter of approximately 446 nm. As a result, the shear thickening fluid exhibits a shear thickening transition at a shear rate of approximately $10^2$-$10^3$ s−1.

A volume fraction of particles dispersed within the solvent distinguishes the viscosity versus shear rate of different shear thickening fluids. The viscosity of the STF changes in response to the applied shear stress. At rest and under weak applied shear stress, a STF may have a fairly constant or even slightly decreasing viscosity because the random distribution of particles causes the particles to frequently collide. However, as a greater shear stress is applied so that the shear rate increases, the particles flow in a more streamlined manner. However, as an even greater shear stress is applied so that the shear rate increases further, a hydrodynamic coupling between the particles may overcome the interparticle forces responsible for Brownian motion. The particles may be driven closer together, and the microstructure of the colloidal dispersion may change, so that particles cluster together in hydroclusters.

The viscosity curve of the STF can be fine-tuned through changes in the characteristics of the particles suspended in the solvent. For example, the particles shape, surface chemistry, ionic strength, and size affect the various interparticle forces involved, as does the properties of the solvent. However, in general, hydrodynamic forces dominate at a high shear stress, which also makes the addition of a polymer attached to the particle surface effective in limiting clumping in hydroclusters. Various factors influence this clumping behavior, including, fluid slip, adsorbed ions, surfactants, polymers, surface roughness, graft density (e.g., of a grafted polymer), molecular weight, and solvent, so that the onset of shear thickening can be modified. In general, the onset of shear thickening can be slowed by the introduction of techniques to prevent the clumping of particles. For example, influencing the STF with emissions from an emitter in proximal location to the chamber.

Figure 1C:
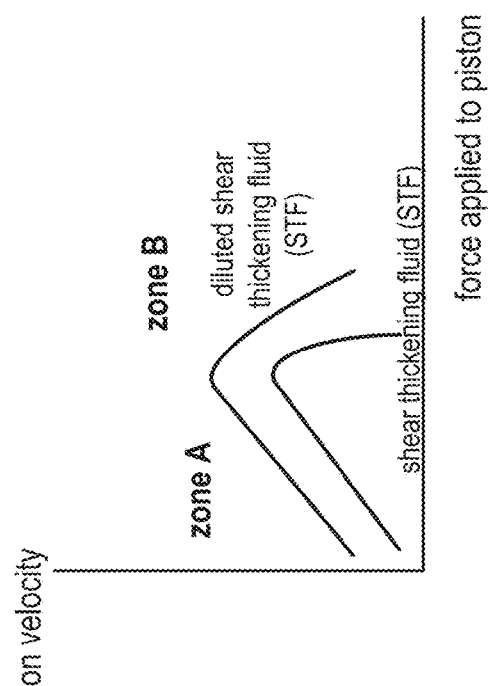
FIG. 1C is a graph of plunger velocity vs. force applied to the plunger for an aspect of an embodiment of a mechanical and computing system in accordance with the present invention.

FIG. 1C is a graph of piston velocity vs. force applied to the piston for an aspect of an embodiment of a mechanical and computing system that includes a chamber, a shear thickening fluid, and a piston that moves through the chamber applying forces on the shear thickening fluid. The shear thickening fluid includes a non-Newtonian fluid since the relationship between shear rate and viscosity is nonlinear.

An example curve for a shear thickening fluid indicates that as more force is applied to the piston in zone A, a higher piston velocity is realized until the corresponding transition to zone B occurs where the shear threshold affect takes hold and the viscosity abruptly increases significantly. When the viscosity increases abruptly, the piston velocity slows back down and may even stop.

Another example curve for a diluted shear thickening fluid indicates that as more force is applied to the piston in zone A, an even higher piston velocity is realized until the corresponding transition to zone B occurs where the shear threshold affect takes hold and the viscosity abruptly increases significantly. When the viscosity increases abruptly, the piston velocity slows back down and may even stop.

Figure 2A:
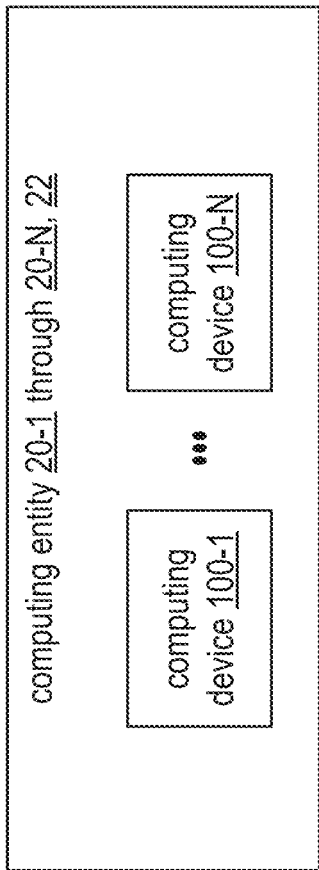
FIG. 2A is a schematic block diagram of an embodiment of a computing entity of a computing system in accordance with the present invention.

FIG. 2A is a schematic block diagram of an embodiment of the computing entity (e.g., 20-1 through 20-N; and 22) of the mechanical and computing system of FIG. 1. The computing entity includes one or more computing devices 100-1 through 100-N. A computing device is any electronic device that communicates data, processes data, represents data (e.g., user interface) and/or stores data.

Computing devices include portable computing devices and fixed computing devices. Examples of portable computing devices include an embedded controller, a smart sensor, a social networking device, a gaming device, a smart phone, a laptop computer, a tablet computer, a video game controller, and/or any other portable device that includes a computing core. Examples of fixed computing devices includes a personal computer, a computer server, a cable set-top box, a fixed display device, an appliance, and industrial controller, a video game counsel, a home entertainment controller, a critical infrastructure controller, and/or any type of home, office or cloud computing equipment that includes a computing core.

Figure 2B:
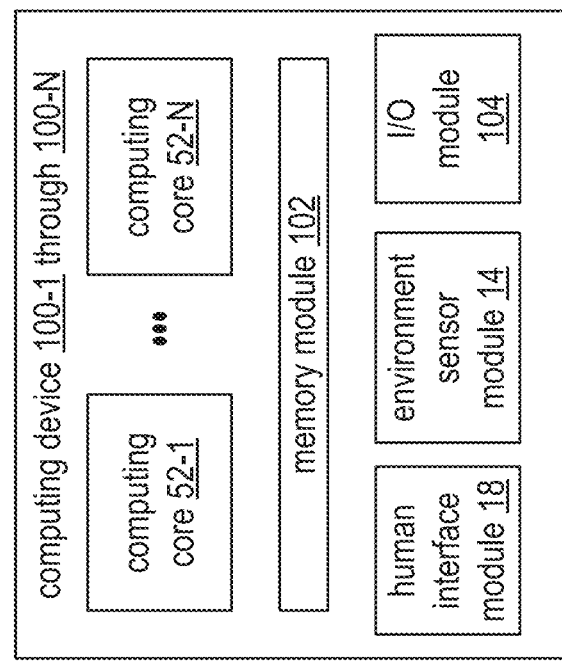
FIG. 2B is a schematic block diagram of an embodiment of a computing device of a computing system in accordance with the present invention.

FIG. 2B is a schematic block diagram of an embodiment of a computing device (e.g., 100-1 through 100-N) of the computing entity of FIG. 2A that includes one or more computing cores 52-1 through 52-N, a memory module 102, a human interface module 18, an environment sensor module 14, and an input/output (I/O) module 104. In alternative embodiments, the human interface module 18, the environment sensor module 14, the I/O module 104, and the memory module 102 may be standalone (e.g., external to the computing device). An embodiment of the computing device is discussed in greater detail with reference to FIG. 3.

Figure 3:
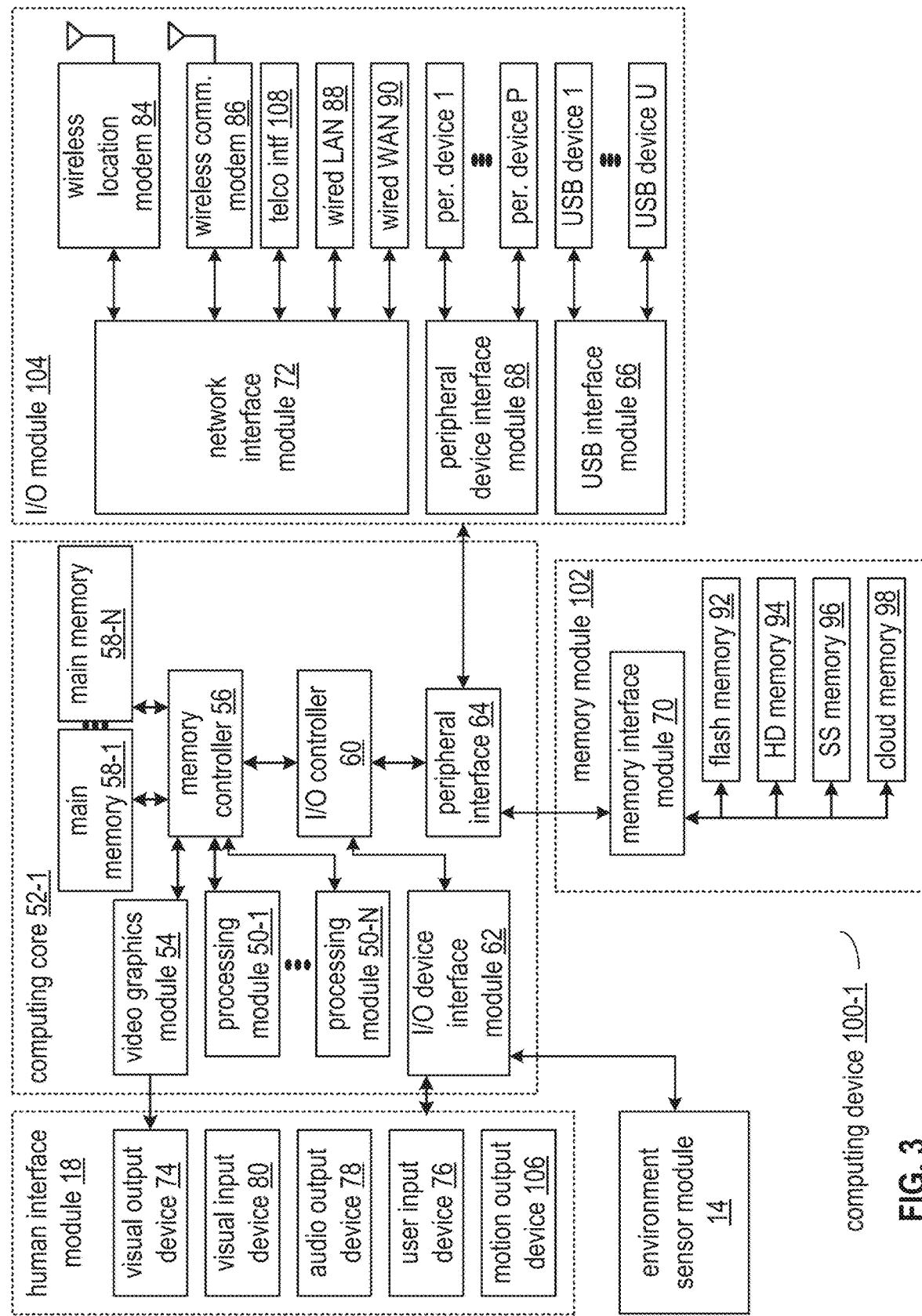
FIG. 3 is a schematic block diagram of another embodiment of a computing device of a computing system in accordance with the present invention.

FIG. 3 is a schematic block diagram of another embodiment of the computing device 100-1 of the mechanical and computing system of FIG. 1 that includes the human interface module 18, the environment sensor module 14, the computing core 52-1, the memory module 102, and the I/O module 104. The human interface module 18 includes one or more visual output devices 74 (e.g., video graphics display, 3-D viewer, touchscreen, LED, etc.), one or more visual input devices 80 (e.g., a still image camera, a video camera, a 3-D video camera, photocell, etc.), and one or more audio output devices 78 (e.g., speaker(s), headphone jack, a motor, etc.). The human interface module 18 further includes one or more user input devices 76 (e.g., keypad, keyboard, touchscreen, voice to text, a push button, a microphone, a card reader, a door position switch, a biometric input device, etc.) and one or more motion output devices 106 (e.g., servos, motors, lifts, pumps, actuators, anything to get real-world objects to move).

The computing core 52-1 includes a video graphics module 54, one or more processing modules 50-1 through 50-N, a memory controller 56, one or more main memories 58-1 through 58-N (e.g., RAM), one or more input/output (I/O) device interface modules 62, an input/output (I/O) controller 60, and a peripheral interface 64. A processing module is as defined at the end of the detailed description.

The memory module 102 includes a memory interface module 70 and one or more memory devices, including flash memory devices 92, hard drive (HD) memory 94, solid state (SS) memory 96, and cloud memory 98. The cloud memory 98 includes an on-line storage system and an on-line backup system.

The I/O module 104 includes a network interface module 72, a peripheral device interface module 68, and a universal serial bus (USB) interface module 66. Each of the I/O device interface module 62, the peripheral interface 64, the memory interface module 70, the network interface module 72, the peripheral device interface module 68, and the USB interface modules 66 includes a combination of hardware (e.g., connectors, wiring, etc.) and operational instructions stored on memory (e.g., driver software) that are executed by one or more of the processing modules 50-1 through 50-N and/or a processing circuit within the particular module.

The I/O module 104 further includes one or more wireless location modems 84 (e.g., global positioning satellite (GPS), Wi-Fi, angle of arrival, time difference of arrival, signal strength, dedicated wireless location, etc.) and one or more wireless communication modems 86 (e.g., a cellular network transceiver, a wireless data network transceiver, a Wi-Fi transceiver, a Bluetooth transceiver, a 315 MHz transceiver, a zig bee transceiver, a 60 GHz transceiver, etc.). The I/O module 104 further includes a telco interface 108 (e.g., to interface to a public switched telephone network), a wired local area network (LAN) 88 (e.g., optical, electrical), and a wired wide area network (WAN) 90 (e.g., optical, electrical). The I/O module 104 further includes one or more peripheral devices (e.g., peripheral devices 1-P) and one or more universal serial bus (USB) devices (USB devices 1-U). In other embodiments, the computing device 100-1 may include more or less devices and modules than shown in this example embodiment.

Figure 4:
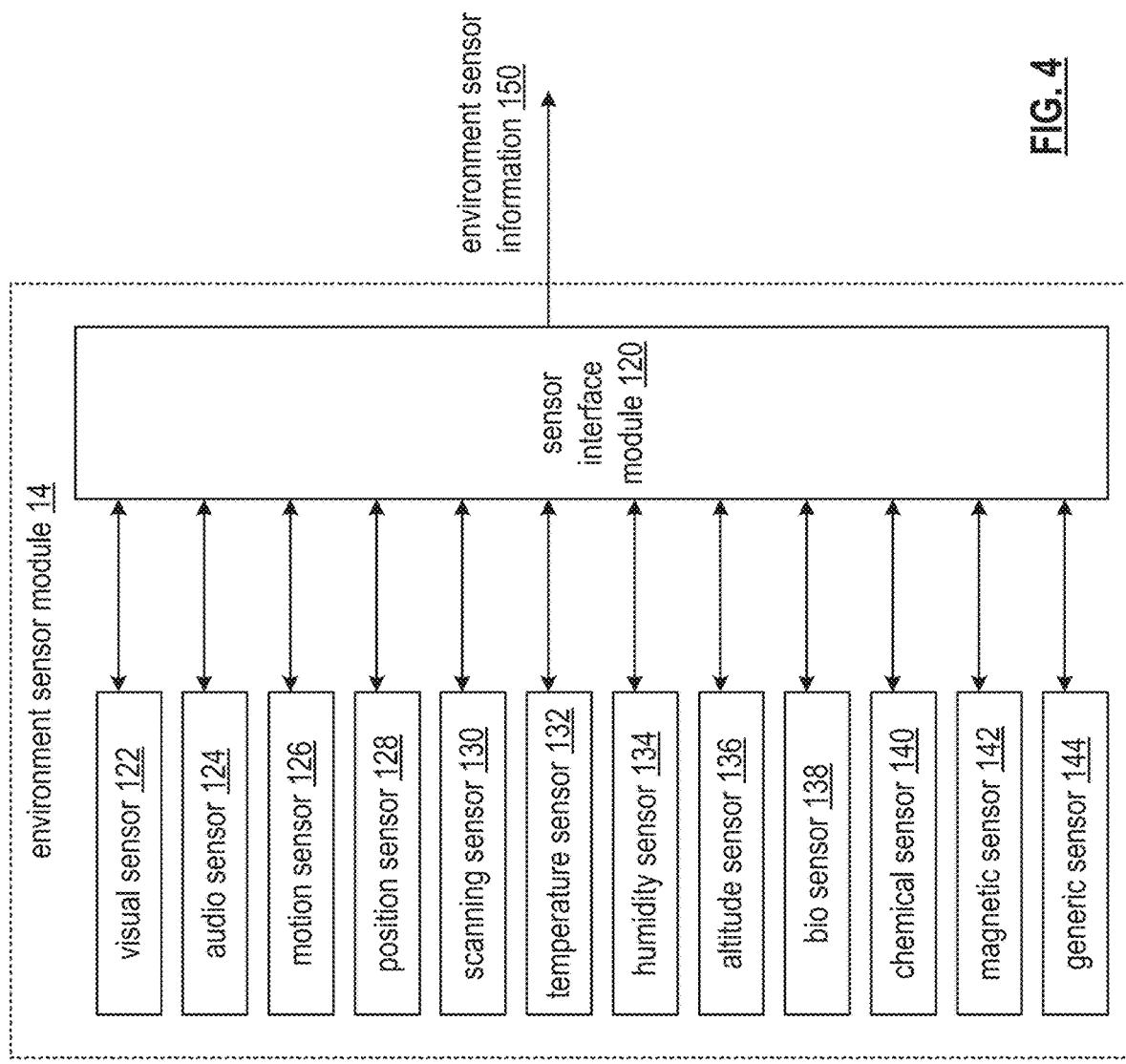
FIG. 4 is a schematic block diagram of an embodiment of an environment sensor module of a computing system in accordance with the present invention.

FIG. 4 is a schematic block diagram of an embodiment of the environment sensor module 14 of the computing device of FIG. 2B that includes a sensor interface module 120 to output environment sensor information 150 based on information communicated with a set of sensors. The set of sensors includes a visual sensor 122 (e.g., to the camera, 3-D camera, 360° view camera, a camera array, an optical spectrometer, etc.) and an audio sensor 124 (e.g., a microphone, a microphone array). The set of sensors further includes a motion sensor 126 (e.g., a solid-state Gyro, a vibration detector, a laser motion detector) and a position sensor 128 (e.g., a Hall effect sensor, an image detector, a GPS receiver, a radar system).

The set of sensors further includes a scanning sensor 130 (e.g., CAT scan, MRI, x-ray, ultrasound, radio scatter, particle detector, laser measure, further radar) and a temperature sensor 132 (e.g., thermometer, thermal coupler). The set of sensors further includes a humidity sensor 134 (resistance based, capacitance based) and an altitude sensor 136 (e.g., pressure based, GPS-based, laser-based).

The set of sensors further includes a biosensor 138 (e.g., enzyme, microbial) and a chemical sensor 140 (e.g., mass spectrometer, gas, polymer). The set of sensors further includes a magnetic sensor 142 (e.g., Hall effect, piezo electric, coil, magnetic tunnel junction) and any generic sensor 144 (e.g., including a hybrid combination of two or more of the other sensors).

FIGS. 5A-5D are schematic block diagrams of another embodiment of a mechanical and computing system illustrating an example of determining operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes a chamber 16 filled at least in part with a shear thickening fluid (STF) 42, where the STF includes a multitude of magnetic nanoparticles 170. The head unit 10-1 further includes a piston 36 housed at least partially radially within the chamber 16. The piston 36 is configured to exert pressure against the shear thickening fluid 42 in response to movement of the piston 36 from a force applied to the piston 36 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates. The head unit 10-1 further includes a set of magnetic field sensors 116-1-1 and 116-1-2 positioned proximal to the chamber 16. For instance, the magnetic field sensors are implemented utilizing Hall effect sensors.

Figure 5A:
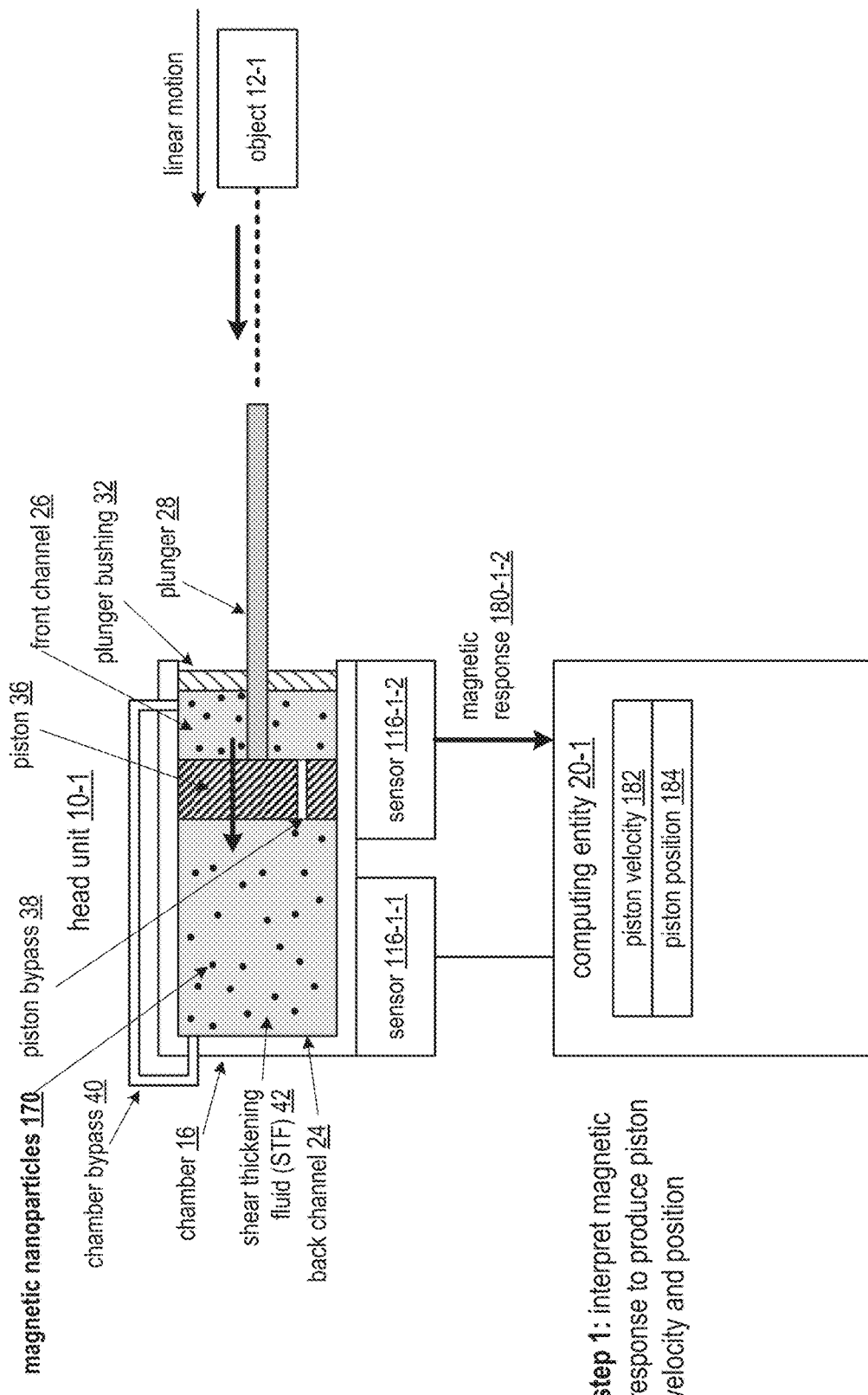
FIGS. 5A-5D are schematic block diagrams of another embodiment of a mechanical and computing system illustrating an example of determining operational aspects in accordance with the present invention.

FIG. 5A illustrates an example of operation of a method for the determining the operational aspects. A first step of the example of operation includes the computing entity 20-1 interpreting magnetic response 180-1-2 from the set of magnetic fields sensors (e.g., in response to varying fields from the magnetic nanoparticles 170) to produce a piston velocity and position. The set of magnetic field sensors are positioned proximal to the head unit 10-1 for controlling motion of the object 12-1, where the head unit includes the chamber filled at least in part with a shear thickening fluid (STF). The STF includes a multitude of magnetic nanoparticles. The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates.

As an example of interpreting the magnetic response 180-1-2, the computing entity 20-1 compares the magnetic response 180-1-2 to previous measurements of magnetic fields versus piston velocity and position to produce the piston velocity 182 and piston position 184. As another example of the interpreting the magnetic response 180-1-2, the computing entity 20-1 extracts the piston velocity 182 and the piston position 184 directly from the magnetic response 180-1-2 when the sensor 116-1-2 generates the velocity and piston position directly.

Figure 5B:
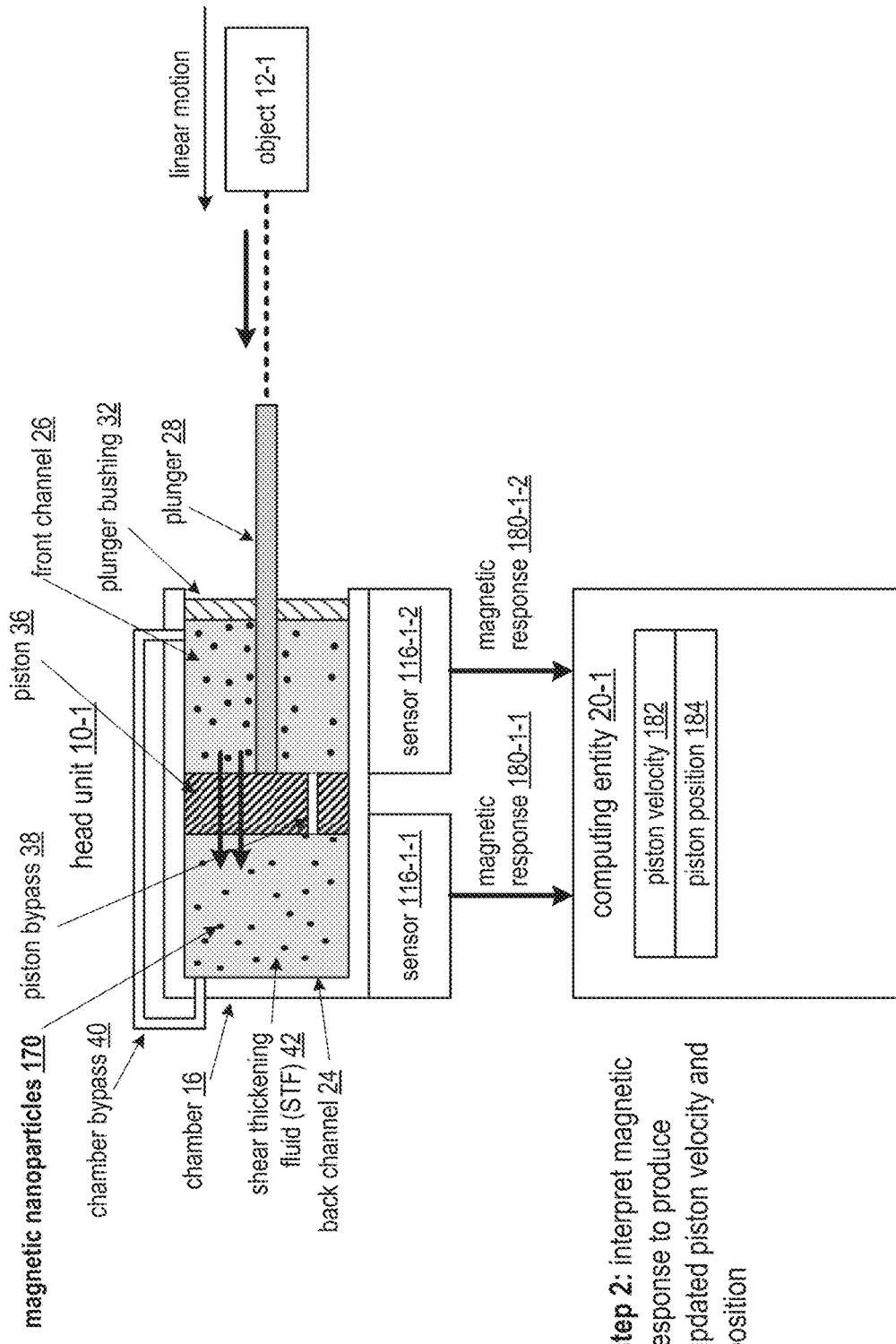

FIG. 5B further illustrates the example of operation of the method for the determining the operational aspects. A second step of the example of operation includes the computing entity 20-1 interpreting magnetic response 180-1-1 from the set of magnetic field sensors to produce updated piston velocity and position as previously discussed. For example, the computing entity 20-1 interprets the magnetic response 180-1-1 to determine the updated piston velocity 182 and piston position 184. For instance, the computing entity 20-1 determines that the position of the piston is further inward within the chamber 16 and moving inward with a higher velocity as compared to the previous interpretation step.

Figure 5C:
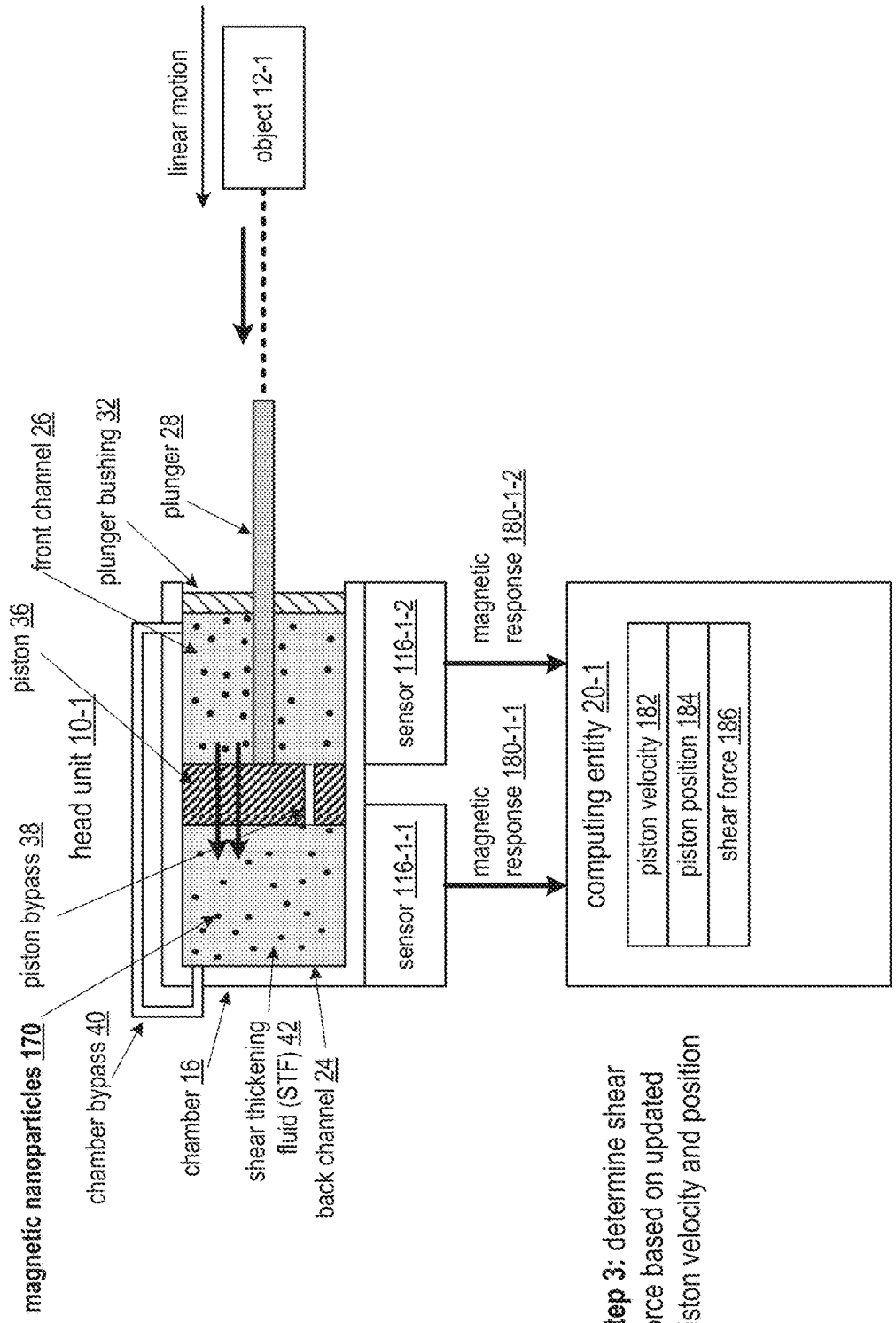

FIG. 5C further illustrates the example of operation of the method for the determining the operational aspects. A third step of the example of operation includes the computing entity 20-1 determining a shear force 186 based on the updated piston velocity 182 and piston position 184. For example, the computing entity 20-1 compares the updated velocity and position to stored data for instantaneous velocity and position verses shear force for the STF 42. As another example, the computing entity 20-1 receives the shear force 186 from at least one of the set of sensors when at least one sensor provides the shear force 186 directly.

Figure 5D:
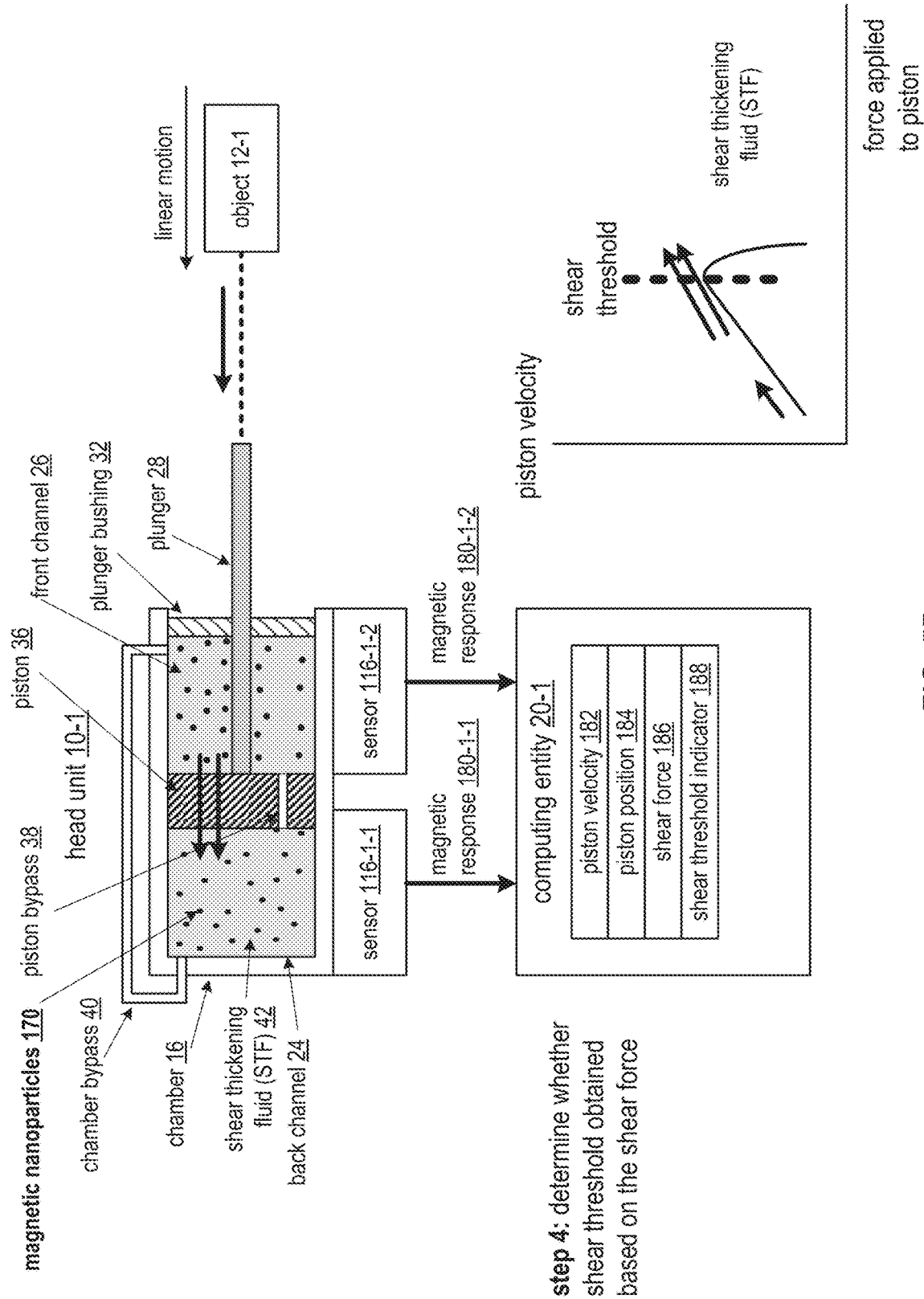

FIG. 5D further illustrates the example of operation of the method for the determining the operational aspects. A fourth step of the example of operation includes the computing entity 20-1 determining whether a shear threshold has been obtained based on the shear force 186. The shear threshold is associated with the increasing viscosity in response to the second range of shear rates. For example, the computing entity 20-1 compares the shear force 186 to data associated with the viscosity versus shear rate curve and indicates via a shear threshold indicator 188 that the shear threshold has been obtained when the shear force 186 compares favorably to the data associated with the viscosity versus shear rate curve for the shear threshold effect. As another example, the computing entity 20-1 interprets the piston velocity 182 over time to produce acceleration and indicates the shear threshold via the shear threshold indicator 188 when detecting a sudden deceleration.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 6B:
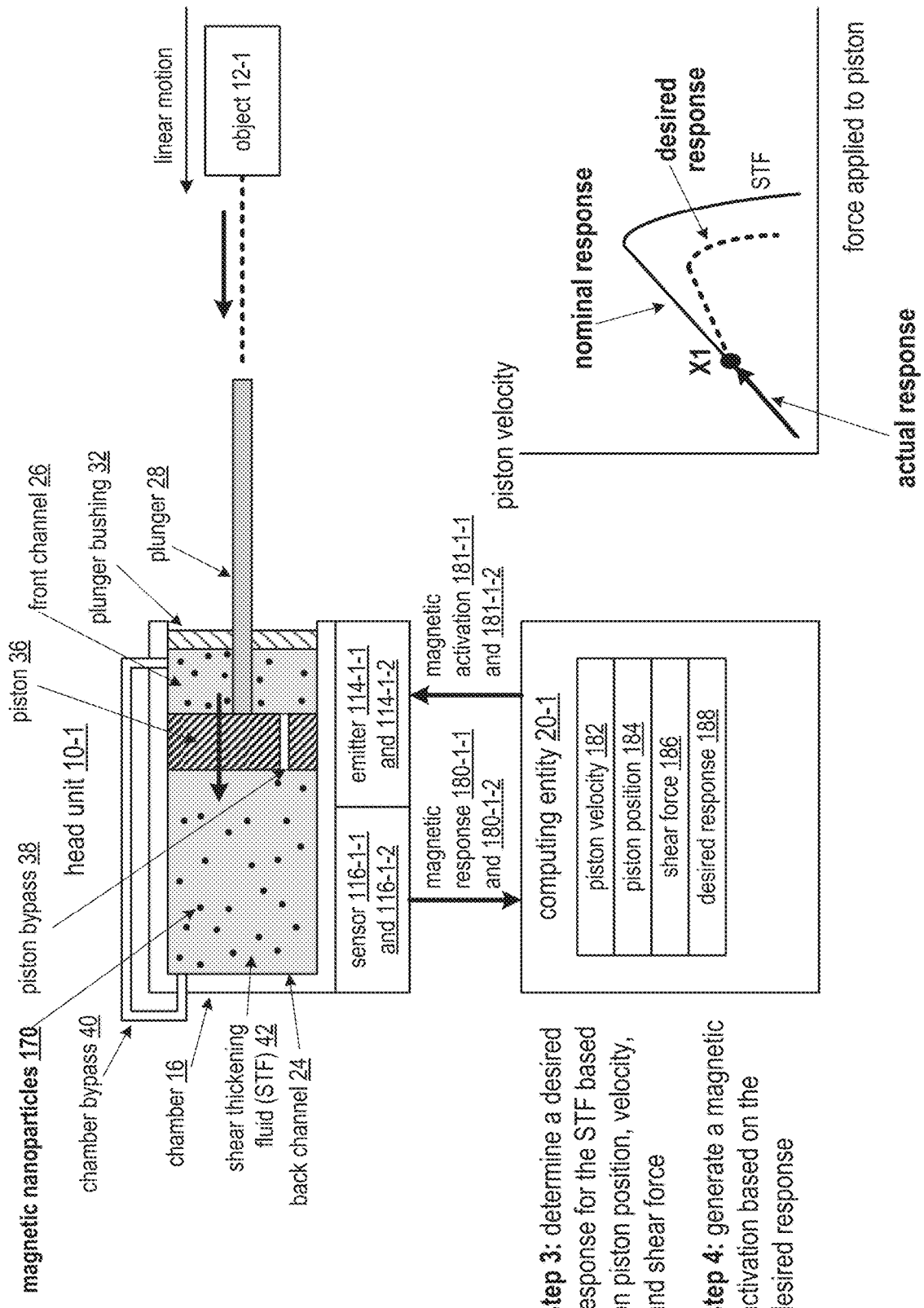
Figure 6C:
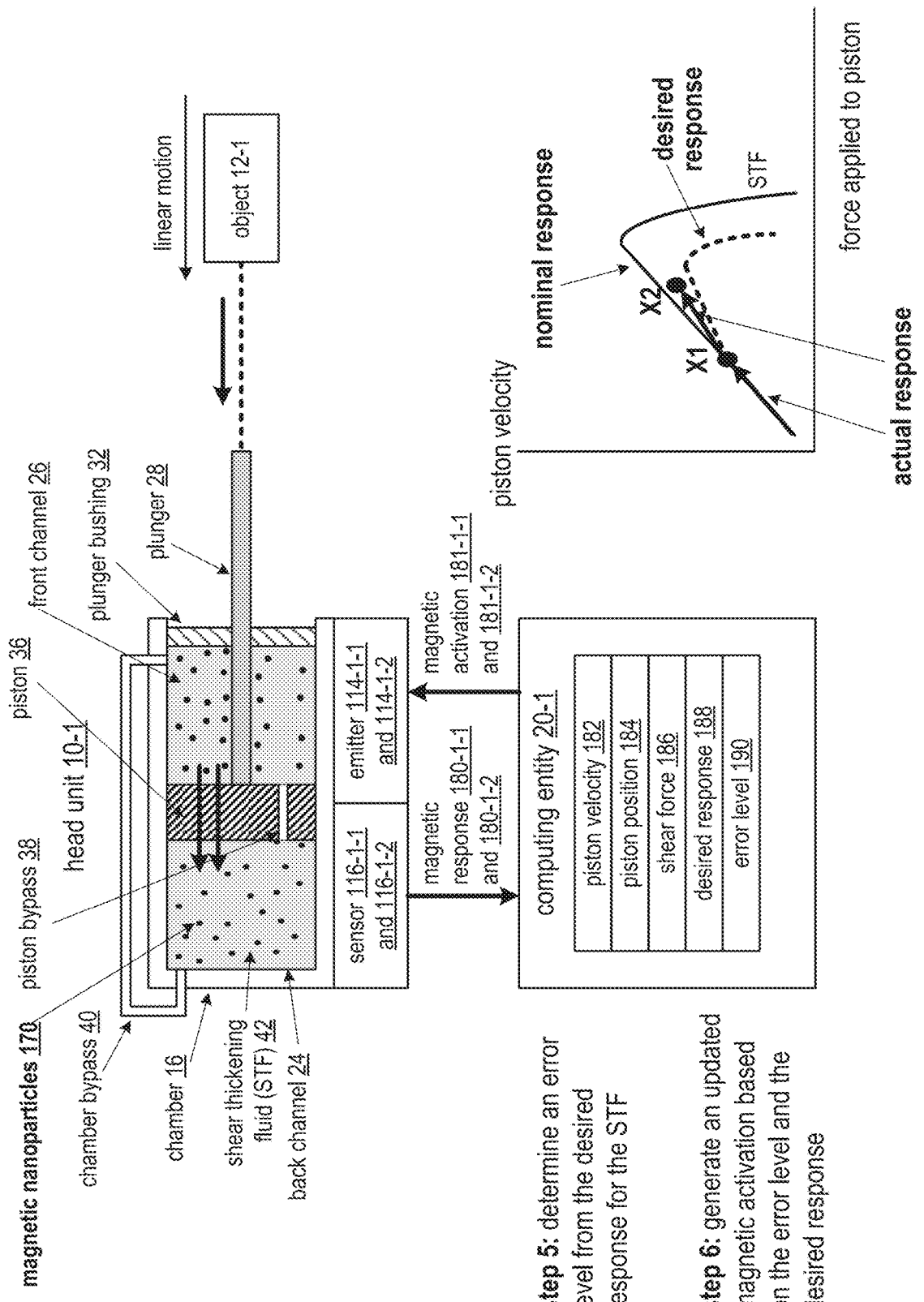

FIGS. 6A-6C are schematic block diagrams of another embodiment of a mechanical and computing system illustrating an example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42, where the STF includes a multitude of magnetic nanoparticles 170. The piston is housed at least partially radially within the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates.

The head unit 10-1 further includes a set of magnetic field sensors positioned proximal to the chamber 16 and a set of magnetic field emitters positioned proximal to the chamber 16. The set of magnetic field sensors provide a magnetic response from the multitude of magnetic nanoparticles. The set of magnetic field emitters provide a magnetic activation to the multitude of magnetic nanoparticles which in turn affects the STF. For example, sensors 116-1-1 and 116-1-2 and emitters 114-1-1 and 114-1-2, where the sensors and emitters sense and emit magnetic waves respectively to interact with the magnetic nanoparticles 170.

FIG. 6A illustrates an example of operation of a method for the controlling the operational aspects. A first step of the example of operation includes the computing entity 20-1 interpreting magnetic response 180-1-1 and 180-1-2 from the set of magnetic field sensors (e.g., in response to varying fields from the magnetic nanoparticles 170) to produce a piston velocity and piston position. The set of magnetic field sensors are positioned proximal to the head unit 10-1 for controlling motion of the object 12-1, where the head unit includes the chamber filled at least in part with a shear thickening fluid (STF).

The STF includes a multitude of magnetic nanoparticles. The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates.

The interpreting the magnetic response from the set of magnetic field sensors to produce the piston velocity and the piston position of the piston includes a series of sub-steps. A first sub-step includes inputting, from one or more magnetic field sensors of the set of magnetic field sensors, a set of magnetic field signals over a time range. For example, the computing entity 20-1 inputs a magnetic field signal from sensor 116-1-1 during a first timeframe of the time range and another magnetic field signal from sensor 116-1-2 during a second timeframe of the time range.

A second sub-step includes determining the magnetic response of the set of magnetic field sensors based on the set of magnetic field signals. For example, the computing entity 20-1 interprets the magnetic field signals based on a type of magnetic sensor to produce magnetic responses 180-1-1 and 180-1-2.

A third sub-step includes determining the piston velocity based on the magnetic response of the set of magnetic field sensors over the time range. For example, the computing entity 20-1 calculates velocity based on changes in the magnetic responses over the time range.

A fourth sub-step includes determining the piston position based on the piston velocity and a real-time reference. For example, the computing entity 20-1 calculates the piston position based on time and the piston velocity as the piston moves through the chamber.

As another example of interpreting the magnetic response 180-1-2, the computing entity 20-1 compares the magnetic response 180-1-2 to previous measurements of magnetic fields versus piston velocity and piston position to produce the piston velocity 182 and piston position 184. As a still further example of the interpreting the magnetic response 180-1-2, the computing entity 20-1 extracts the piston velocity 182 and the piston position 184 directly from the magnetic response 180-1-2 when the sensor 116-1-2 generates the piston velocity and piston position directly.

A second step of the example of operation includes the computing entity 20-1 determining a shear force 186 based on the piston velocity 182 and piston position 184. The determining the shear force based on the piston velocity and the piston position includes one approach of a variety of approaches. A first approach includes extracting the shear force directly from the magnetic response when one or more magnetic field sensors of the set of magnetic field sensors outputs a shear force encoded signal. For example, the computing entity 20-1 extracts the shear force 186 directly from the magnetic responses 180-1-1 and 180-1-2. In an instance, the shear force 186 reveals the piston velocity versus force applied to the piston curve as illustrated in FIG. 6A, where at a current time of interpreting the magnetic response, the force and piston velocity are at a point X1.

A second approach includes determining the shear force utilizing the piston velocity and stored data for piston velocity verses shear force for the STF. For example, the computing entity 20-1 compares the velocity and position to stored data for instantaneous velocity and position verses shear force for the STF 42.

A third approach includes determining the shear force utilizing the piston position and stored data for piston position verses shear force for the STF within the chamber. For example, the computing entity 20-1 compares the velocity and position to stored data for instantaneous velocity and position verses shear force for the STF 42.

FIG. 6B further illustrates the example of operation of the method for the controlling the operational aspects. A third step of the example of operation includes the computing entity 20-1 determining a desired response 188 for the STF based on one or more of the shear force 186 and the piston velocity 182 and the piston position 184. The desired response 188 includes continuing to follow a nominal response curve associated with the STF without modifying the functioning of the STF. The desired response 188 further includes modifying the function of the STF to further slow down the object 12-1 or to allow the object 12-1 to speed up at a velocity associated with the nominal response.

The determining the desired response for the STF based on one or more of the shear force, the piston velocity, and piston position includes one or more approaches. A first approach includes interpreting a request associated with modifying one or more of object velocity and object position. For example, the computing entity 20-1 interprets a request from another computing entity to update the desired response for the STF to increase viscosity to slow down the object 12-1.

A second approach includes interpreting guidance from a chamber database. For example, the computing entity 20-1 interprets data from the chamber database 34 of FIG. 1A to identify an updated response for the STF. For instance, the response for the STF is updated to decrease viscosity when historical information in the chamber database 34 indicates that a decrease in viscosity is desired based on a current piston position and current shear force.

A third approach includes establishing the desired response to include facilitating the second range of shear rates to slow down the object when detecting that the piston position is greater than a maximum piston position threshold level. A fourth approach includes establishing the desired response to include facilitating the first range of shear rates to speed up the object when detecting that the piston position is less than a minimum piston position threshold level.

A fifth approach includes establishing the desired response to include facilitating the second range of shear rates to slow down the object when detecting that the piston velocity is greater than a maximum piston velocity threshold level. A sixth approach includes establishing the desired response to include facilitating the first range of shear rates to speed up the object when detecting that the piston velocity is less than a minimum piston velocity threshold level.

A seventh approach includes establishing the desired response to include facilitating the second range of shear rates to slow down the object when detecting that the shear force is less than a minimum shear force threshold level. An eighth approach includes establishing the desired response to include facilitating the first range of shear rates to speed up the object when detecting that the shear force is greater than a maximum shear force threshold level.

A ninth approach includes detecting an environmental condition warranting a change in viscosity of the STF. For example, the computing entity 20-1 determines to change the viscosity of the STF when a triggering of a vehicular airbag sensor is detected. As another example, the computing entity 20-1 determines to change the viscosity of the STF when detecting an earthquake. As yet another example, the computing entity 20-1 determines to change the viscosity of the STF when detecting a proximity warning (e.g., of a certain collision).

Having determined the desired response 188 for the STF, a fourth step of the example method of operation includes the computing entity 20-1 generating a magnetic activation based on the desired response for the STF, where the magnetic activation is output to the set of magnetic field emitters positioned proximal to the chamber 16. The generating the magnetic activation based on the desired response for the STF includes one or more approaches. A first approach includes determining magnetic output values for the magnetic activation based on a difference between actual viscosity of the STF and a desired viscosity of the STF. For example, the computing entity 20-1 determines the magnetic activation to affect the STF such that the viscosity is raised to lead to an abrupt slow down of the piston through the STF.

A second approach includes determining the magnetic activation based on the desired response for the STF and utilizing a magnetic activation table for magnetic output values versus the desired viscosity of the STF. For example, the computing entity 20-1 performs a lookup in a magnetic activation table for magnetic output values versus desired viscosity increases.

A third approach includes receiving the magnetic activation from another computing device. Having determined the magnetic activation, in a fourth approach, the computing entity 20-1 outputs the magnetic activation to the set of magnetic field emitters. For instance, the computing entity 20-1 outputs the magnetic activation 181-1-1 and 181-1-2 to the emitters 114-1-1 and 114-1-2 respectively to affect the viscosity of the STF 42.

FIG. 6C further illustrates the example of operation of the method for the controlling the operational aspects where, having generated the magnetic activation, the computing entity 20-1 determines an error level 190 from the desired response for the STF 42. For example, the computing entity 20-1 re-measures the magnetic response to determine one or more of piston velocity 182, piston position 184, and shear force 186. Having determined velocity and position, the computing entity 20-1 determines actual response at a time X2 and compares the piston velocity versus force applied to the piston to the desired response curve. The computing entity 20-1 determines the error level 190 based on the comparison.

Having determined the error level, a sixth step of the example of operation of the method for the controlling the operational aspects includes the computing entity 20-1 generating an updated magnetic activation based on the error level and the desired response. The error level is at least one of substantially zero (e.g., the actual response is on top of the desired response), a positive error level (e.g., when the actual response includes a piston velocity that is too high for the force applied to the piston), and a negative error level (e.g., when the actual response includes a piston velocity that is too low for the force applied to the piston). In an example of generating the updated magnetic activation, the computing entity 20-1 determines that the error level 190 is a positive error level, determines the updated magnetic activation to further increase the viscosity of the STF 42, and outputs magnetic activation 181-1-1 and 181-1-2 to the emitters 114-1-1 and 114-1-2 respectively to facilitate slowing down the piston velocity back to the desired response curve.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

FIGS. 7A-7D are schematic block diagrams of another embodiment of a mechanical and computing system illustrating another example of determining operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes a chamber 16 filled at least in part with a shear thickening fluid (STF) 42, where the STF includes a multitude of reflective nanoparticles 200. The head unit 10-1 further includes a piston 36 housed at least partially radially within the chamber 16. The piston 36 is configured to exert pressure against the shear thickening fluid 42 in response to movement of the piston 36 from a force applied to the piston 36 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates. The head unit 10-1 further includes a set of optical sensors 116-1-1 and 116-1-2 positioned proximal to the chamber 16. For instance, the optical sensors are implemented utilizing image sensors (e.g., cameras).

Figure 7A:
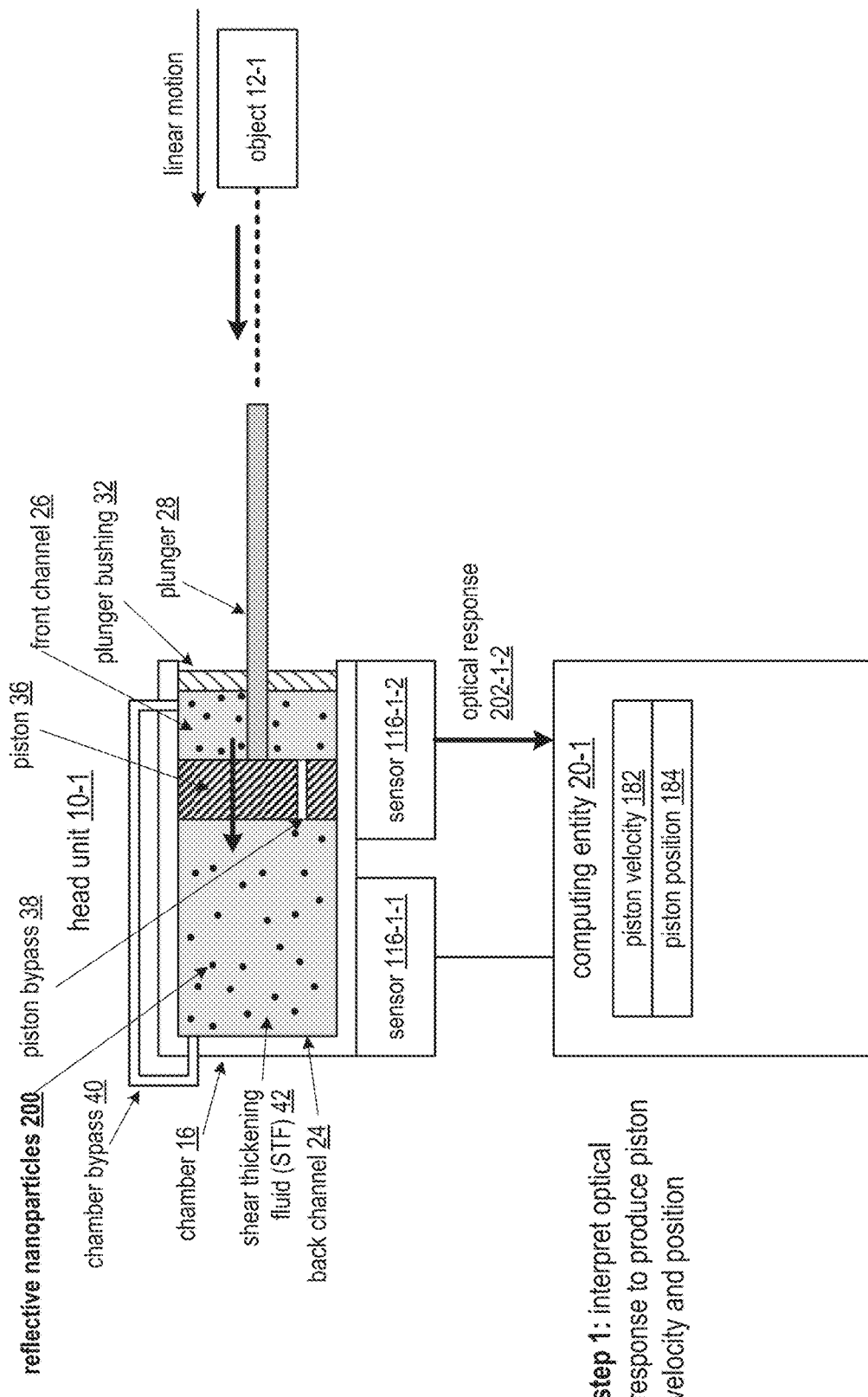
FIGS. 7A-7D are schematic block diagrams of another embodiment of a mechanical and computing system illustrating another example of determining operational aspects in accordance with the present invention.

FIG. 7A illustrates an example of operation of a method for the determining the operational aspects. A first step of the example of operation includes the computing entity 20-1 interpreting an optical response from the set of optical sensors (e.g., in response to varying light patterns from the reflective nanoparticles 200) to produce a piston velocity and position. The set of optical sensors are positioned proximal to the head unit 10-1 for controlling motion of the object 12-1, where the head unit includes the chamber filled at least in part with a shear thickening fluid (STF). The STF includes the multitude of reflective nanoparticles. The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates.

As an example of interpreting the optical response, the computing entity 20-1 compares the optical response 202-1-2 to previous measurements of light fields versus piston velocity and position to produce the piston velocity 182 and piston position 184. As another example of the interpreting the optical response 202-1-2, the computing entity 20-1 extracts the piston velocity 182 and the piston position 184 directly from the optical response 202-1-2 when the sensor 116-1-2 generates the velocity and piston position directly.

Figure 7B:
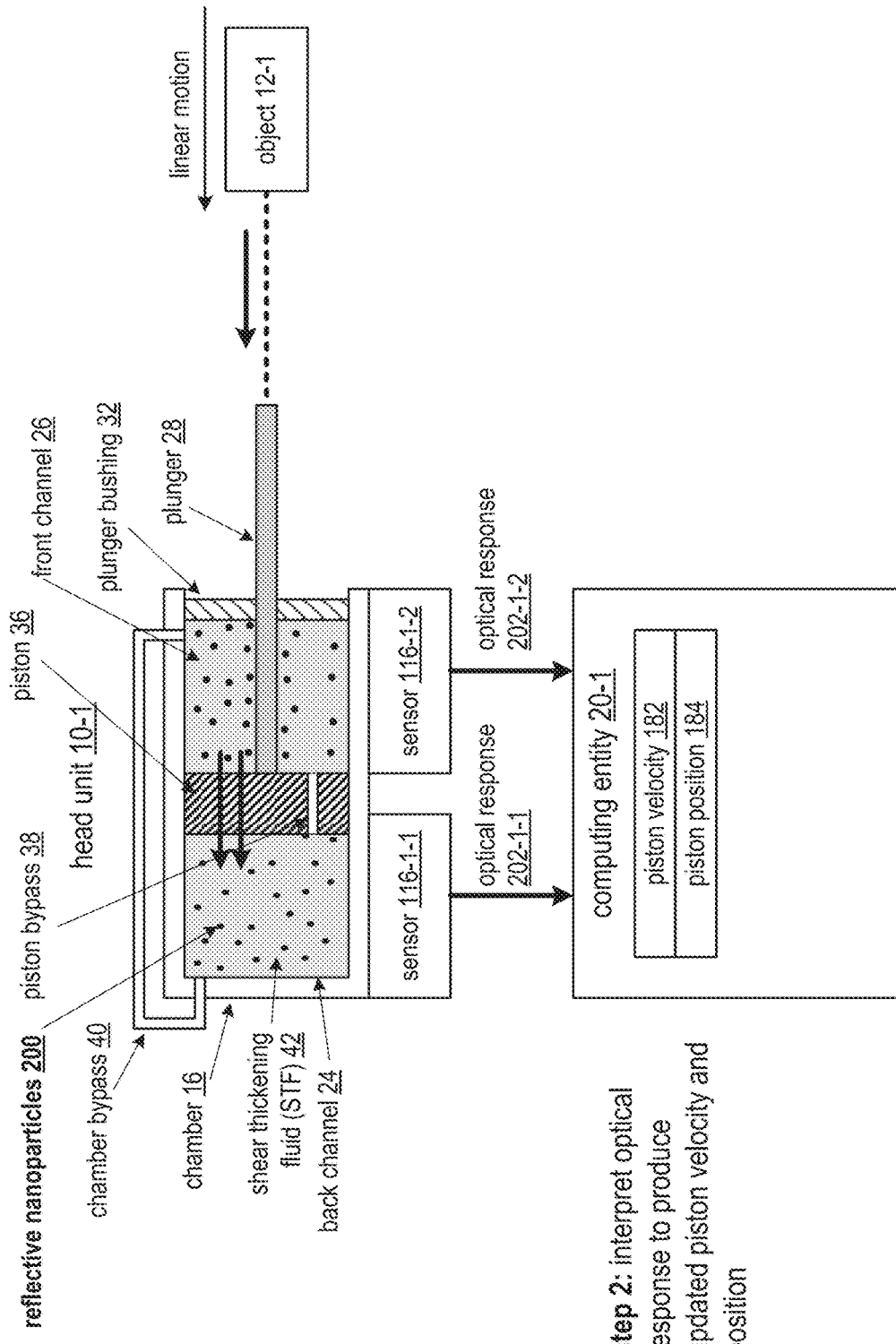

FIG. 7B further illustrates the example of operation of the method for the determining the operational aspects. A second step of the example of operation includes the computing entity 20-1 interpreting optical response 202-1-1 from the set of optical sensors to produce updated piston velocity and position as previously discussed. For example, the computing entity 20-1 interprets the optical response 202-1-1 to determine the updated piston velocity 182 and piston position 184. For instance, the computing entity 20-1 determines that the position of the piston is further inward within the chamber 16 and moving inward with a higher velocity as compared to the previous interpretation step.

Figure 7C:
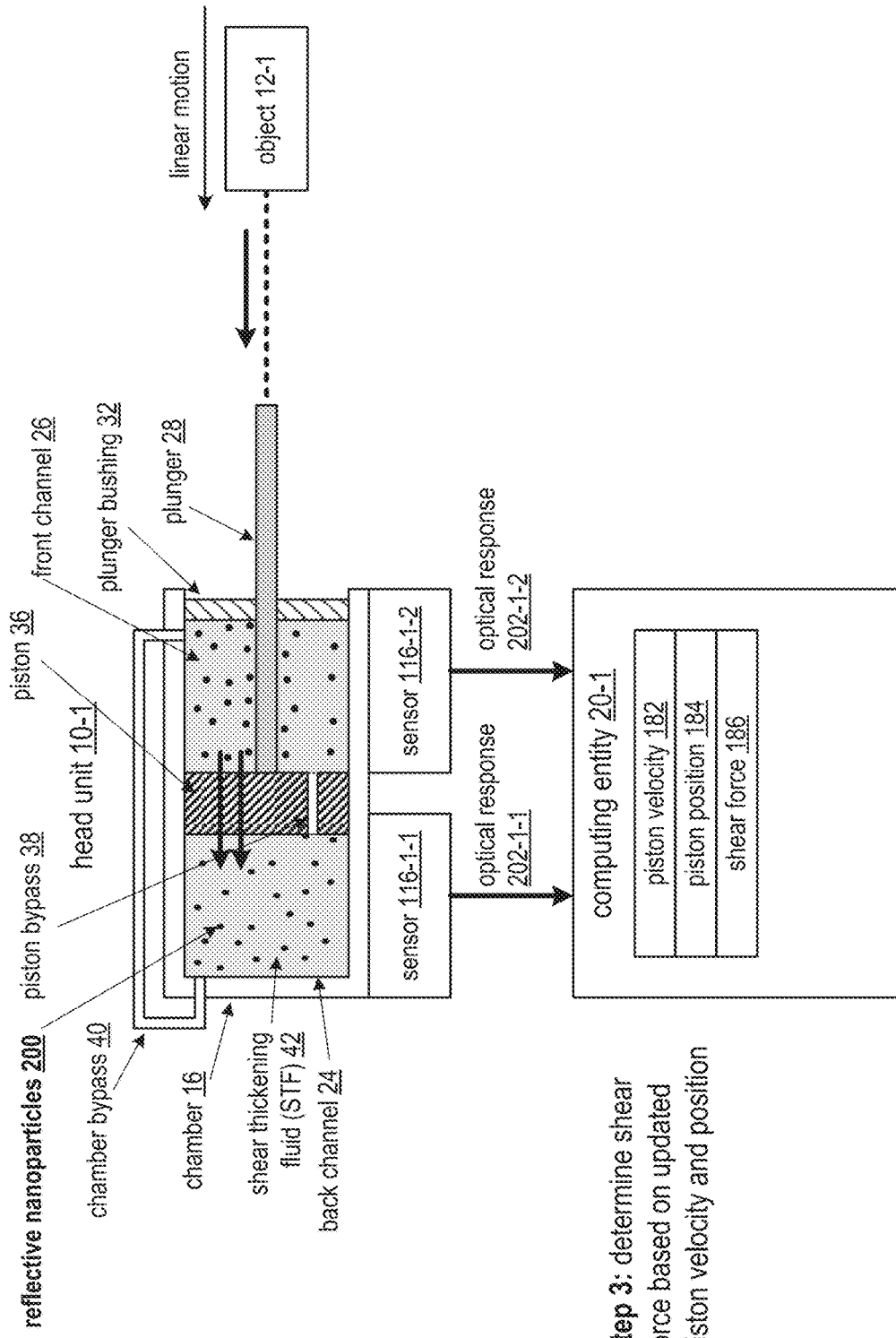

FIG. 7C further illustrates the example of operation of the method for the determining the operational aspects. A third step of the example of operation includes the computing entity 20-1 determining a shear force 186 based on the updated piston velocity 182 and piston position 184. For example, the computing entity 20-1 compares the updated velocity and position to stored data for instantaneous velocity and position verses shear force for the STF 42. As another example, the computing entity 20-1 receives the shear force 186 from at least one of the set of sensors when at least one sensor provides the shear force 186 directly.

Figure 7D:
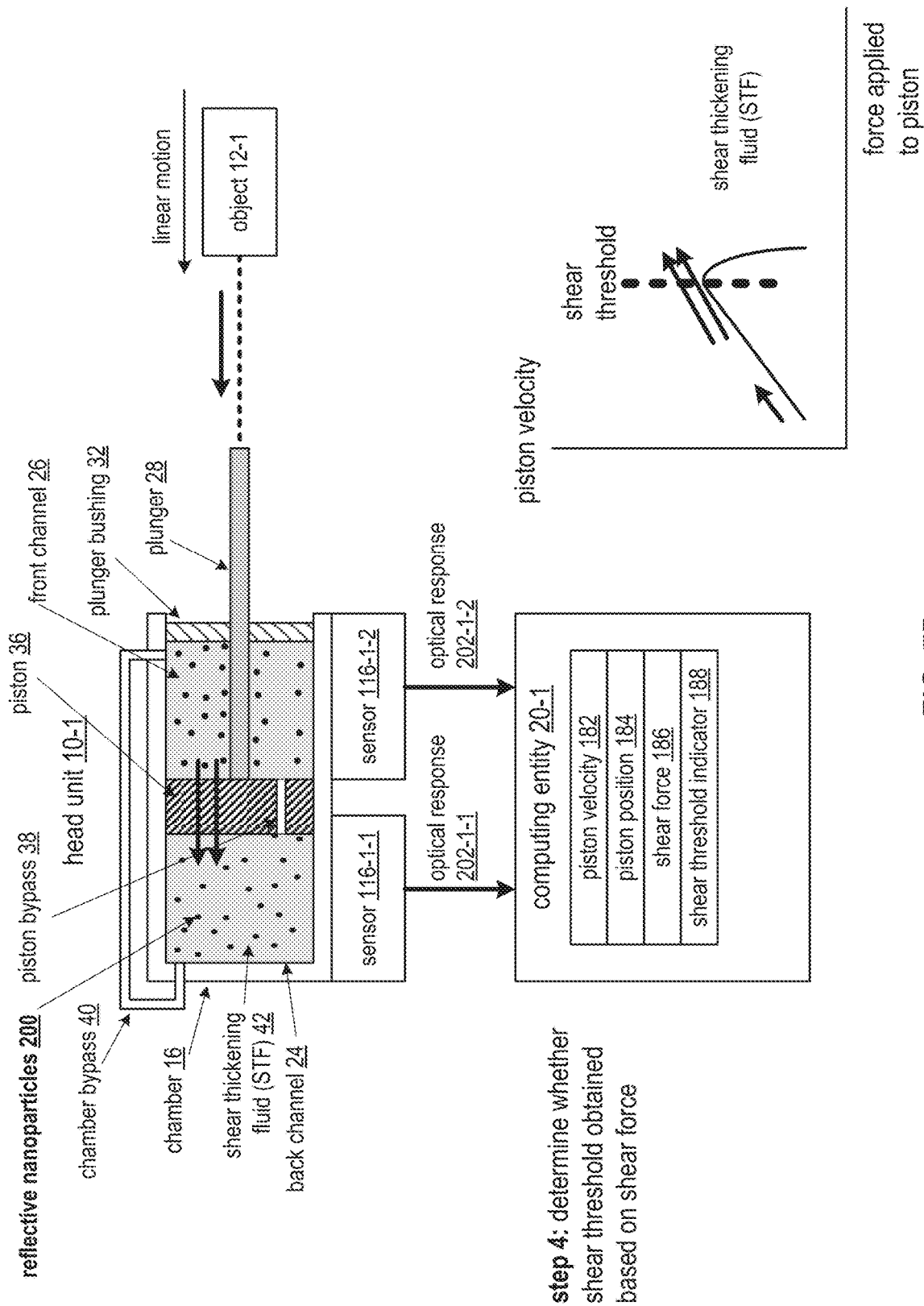

FIG. 7D further illustrates the example of operation of the method for the determining the operational aspects. A fourth step of the example of operation includes the computing entity 20-1 determining whether a shear threshold has been obtained based on the shear force 186. The shear threshold is associated with the increasing viscosity in response to the second range of shear rates. For example, the computing entity 20-1 compares the shear force 186 to data associated with the viscosity versus shear rate curve and indicates via a shear threshold indicator 188 that the shear threshold has been obtained when the shear force 186 compares favorably to the data associated with the viscosity versus shear rate curve for the shear threshold effect. As another example, the computing entity 20-1 interprets the piston velocity 182 over time to produce acceleration and indicates the shear threshold via the shear threshold indicator 188 when detecting a sudden deceleration.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 8A:
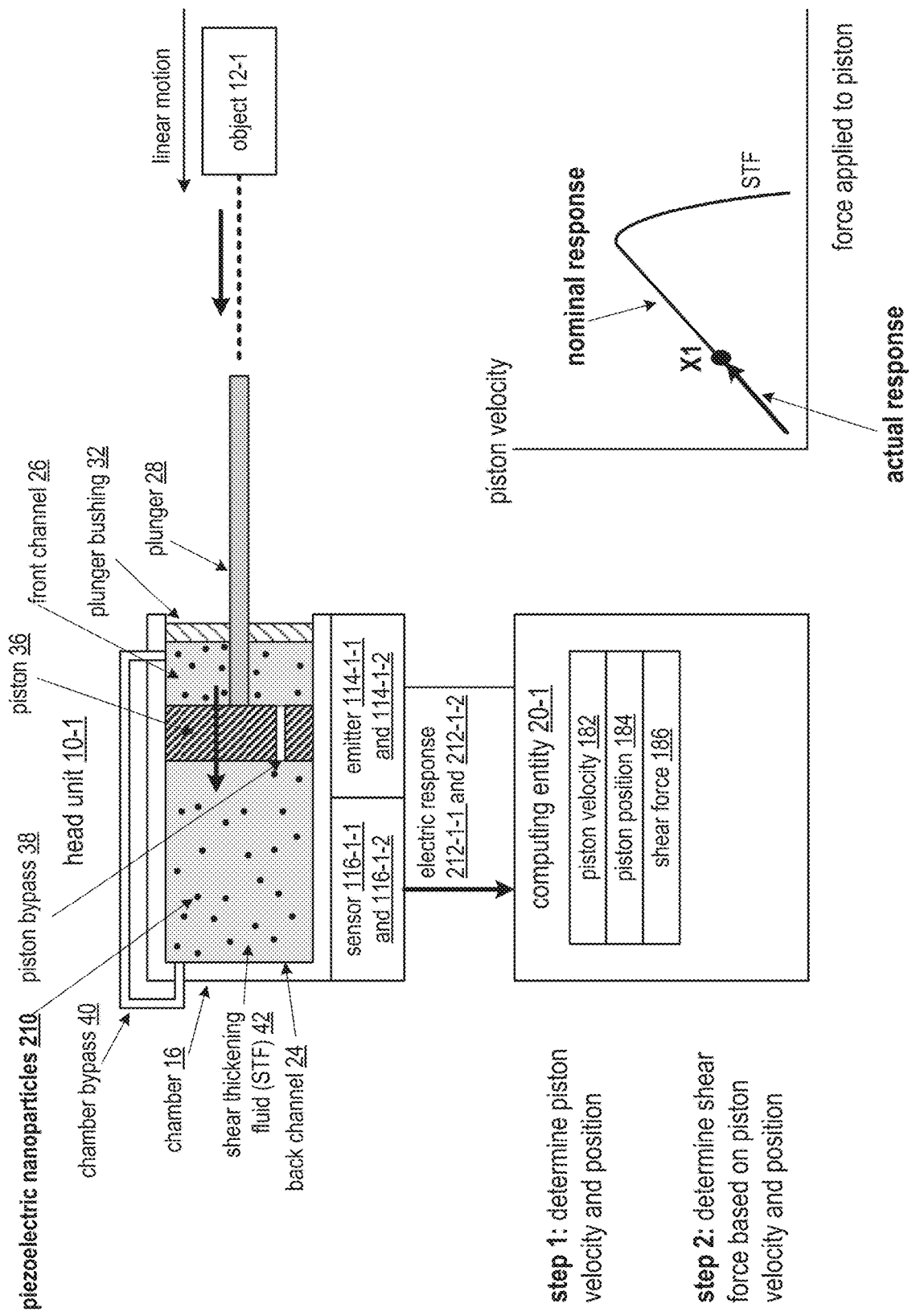
FIGS. 8A-8C are schematic block diagrams of another embodiment of a mechanical and computing system illustrating another example of controlling operational aspects in accordance with the present invention.
Figure 8B:
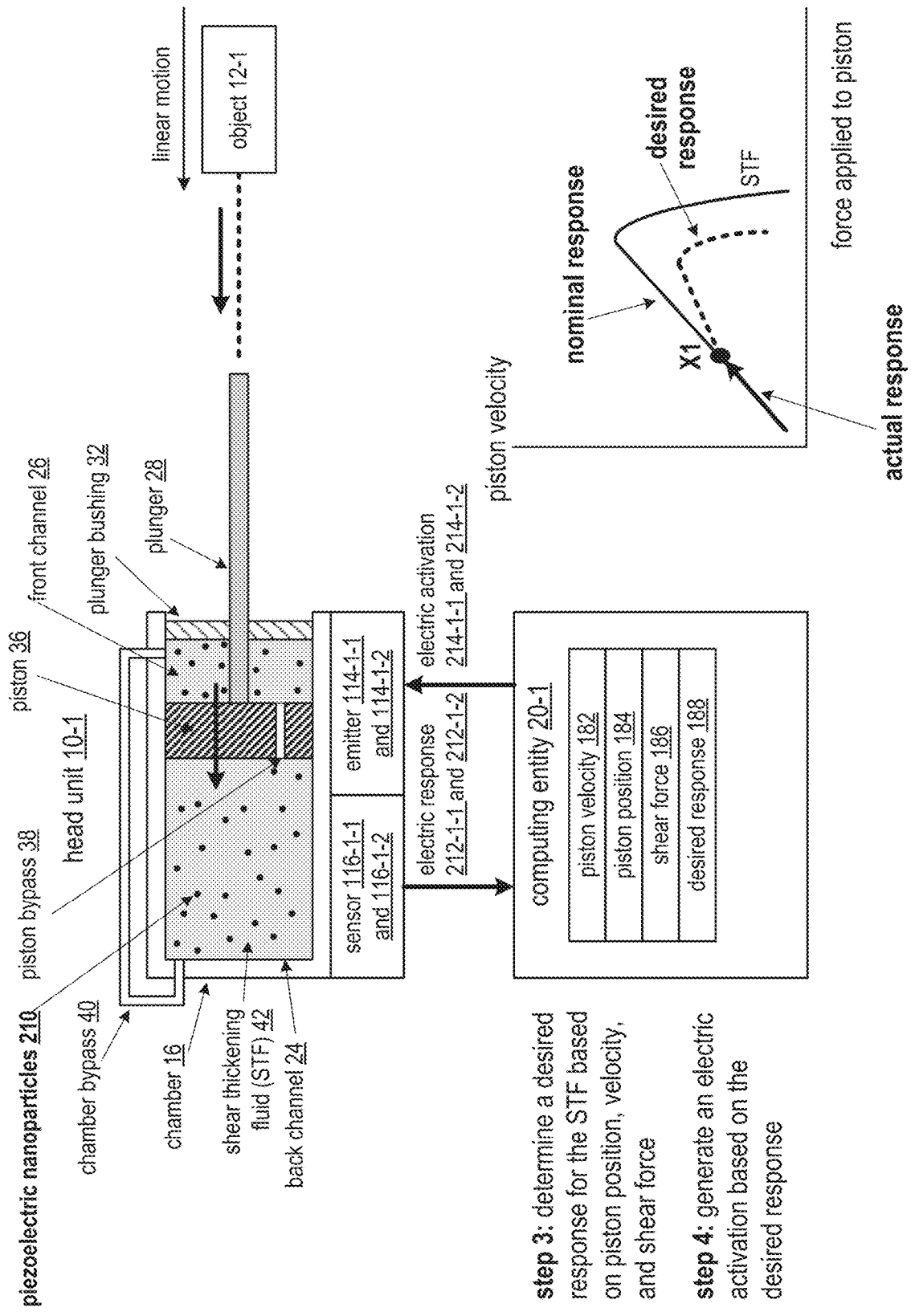
Figure 8C:
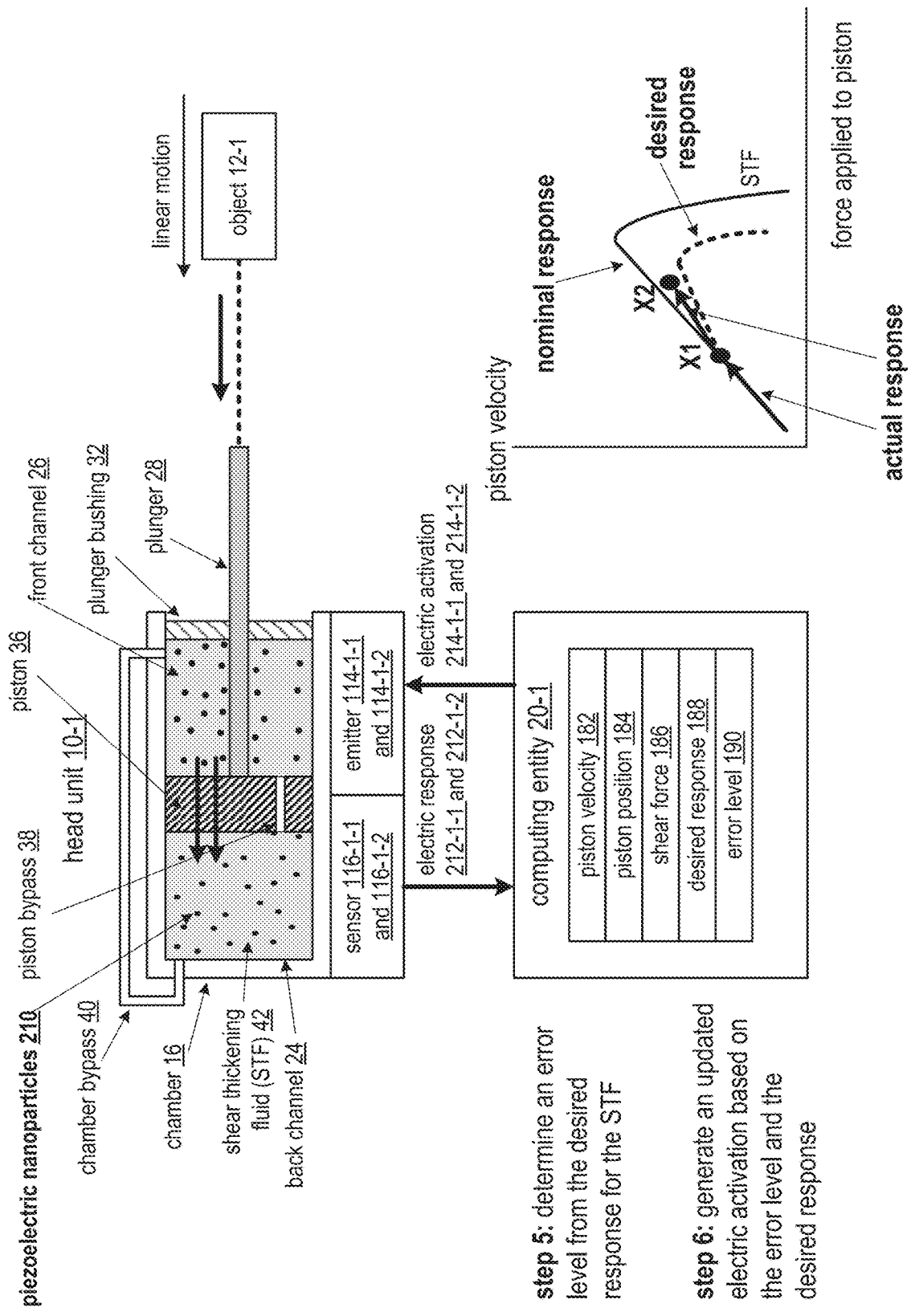

FIGS. 8A-8C are schematic block diagrams of another embodiment of a mechanical and computing system illustrating another example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42, where the STF includes a multitude of piezoelectric nanoparticles 210. The piston is housed at least partially radially within the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates.

The head unit 10-1 further includes a set of electric field sensors positioned proximal to the chamber 16 and a set of electric field emitters positioned proximal to the chamber 16. For example, sensors 116-1-1 and 116-1-2 and emitters 114-1-1 and 114-1-2, where the sensors and emitters sense and emit electric waves respectively to interact with the piezoelectric nanoparticles 210.

FIG. 8A illustrates an example of operation of a method for the controlling the operational aspects. A first step of the example of operation includes the computing entity 20-1 interpreting electric response 212-1-1 and 212-1-2 from the set of piezoelectric nanoparticles 210 (e.g., in response to varying fields from the piezoelectric nanoparticles 210) to produce a piston velocity and position. The set of electric field sensors are positioned proximal to the head unit 10-1 for controlling motion of the object 12-1, where the head unit includes the chamber filled at least in part with a shear thickening fluid (STF). The STF includes the multitude of piezoelectric nanoparticles 210. The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates.

As an example of interpreting the electric response 212-1-1 and 212-1-2, the computing entity 20-1 compares the electric response 212-1-1 and 212-1-2 to previous measurements of electric fields versus piston velocity and position to produce the piston velocity 182 and piston position 184. As another example of the interpreting the electric response 212-1-1 and 212-1-2, the computing entity 20-1 extracts the piston velocity 182 and the piston position 184 directly from the electric response 212-1-1 and 212-1-2 when the sensors 116-1-1 and 116-1-2 generate the velocity and piston position directly.

A second step of the example of operation includes the computing entity 20-1 determining a shear force 186 based on the piston velocity 182 and piston position 184. For example, the computing entity 20-1 compares the velocity and position to stored data for instantaneous velocity and position verses shear force for the STF 42. As another example, the computing entity 20-1 receives the shear force 186 from at least one of the set of sensors when at least one sensor provides the shear force 186 directly. In an instance, the shear force 186 reveals the piston velocity versus force applied to the piston curve as illustrated in FIG. 8A, where at a current time of interpreting the electric response, the force and piston velocity are at a point X1.

FIG. 8B further illustrates the example of operation of the method for the controlling the operational aspects. A third step of the example of operation includes the computing entity 20-1 determining a desired response 188 for the STF based on one or more of the shear force 186 and the piston velocity 182 and the piston position 184. The desired response 188 includes continuing to follow a nominal response curve associated with the STF without modifying the functioning of the STF. The desired response 188 further includes modifying the function of the STF to further slow down the object 12-1 or to allow the object 12-1 to speed up at a velocity associated with the nominal response.

The determining the desired response 188 includes one or more of interpreting a request, interpreting guidance from the chamber database 34, detecting that the piston velocity is greater than a maximum piston velocity threshold level (e.g., too fast), detecting that the piston velocity is less than a minimum piston velocity threshold level (e.g., too slow), and detecting an environmental condition warranting changing the viscosity (e.g., a triggering of a vehicular airbag sensor, detection of an earthquake, a proximity warning, etc.). For instance, the computing entity 20-1 determines that the desired response 188 to slow down the object 12-1 is warranted based on reaching a maximum piston velocity threshold level for object 12-1.

Having determined the desired response 188 for the STF, a fourth step of the example method of operation includes the computing entity 20-1 generating an electric activation based on the desired response for the STF, where the electric activation is output to a set of electric field emitters positioned proximal to the chamber 16. The generating of the electric activation includes one or more of performing a lookup in an electric activation table for electric field output values versus desired viscosity increases, dynamically calculating the electric field output values based on a gap in viscosity levels, and receiving the electric activation from another computing entity. For example, the computing entity 20-1 determines the electric activation to affect the STF such that the viscosity is raised to lead to an abrupt slow down of the piston through the STF. Having determined the electric activation, the computing entity 20-1 outputs electric activation 214-1-1 and 214-1-2 to the emitters 114-1-1 and 114-1-2 respectively to affect the viscosity of the STF 42.

FIG. 8C further illustrates the example of operation of the method for the controlling the operational aspects where, having generated the electric activation, the computing entity 20-1 determines an error level 190 from the desired response for the STF 42. For example, the computing entity 20-1 re-measures the electric response to determine one or more of piston velocity 182, piston position 184, and shear force 186. Having determined velocity and position, the computing entity 20-1 determines actual response at a time X2 and compares the piston velocity versus force applied to the piston to the desired response curve. The computing entity 20-1 determines the error level 190 based on the comparison.

Having determined the error level, a sixth step of the example of operation of the method for the controlling the operational aspects includes the computing entity 20-1 generating an updated electric activation based on the error level and the desired response. The error level is at least one of substantially zero (e.g., the actual response is on top of the desired response), a positive error level (e.g., when the actual response includes a piston velocity that is too high for the force applied to the piston), and a negative error level (e.g., when the actual response includes a piston velocity that is too low for the force applied to the piston). In an example of generating the updated electric activation, the computing entity 20-1 determines that the error level 190 is a positive error level, determines the updated electric activation to further increase the viscosity of the STF 42, and outputs electric activation 214-1-1 and 214-1-2 to the emitters 114-1-1 and 114-1-2 respectively to facilitate slowing down the piston velocity back to the desired response curve.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 9A:
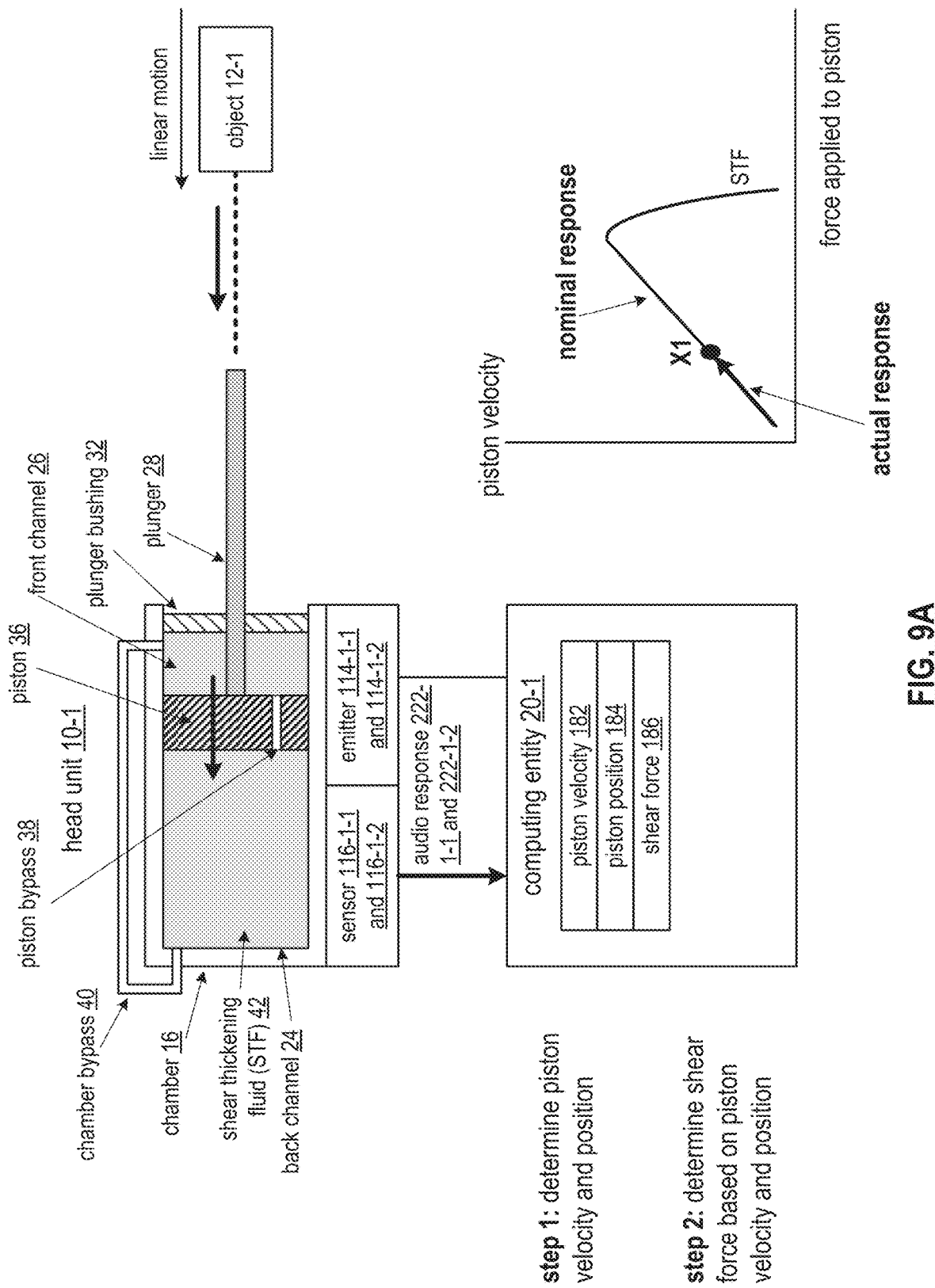
FIGS. 9A-9C are schematic block diagrams of another embodiment of a mechanical and computing system illustrating another example of controlling operational aspects in accordance with the present invention.
Figure 9B:
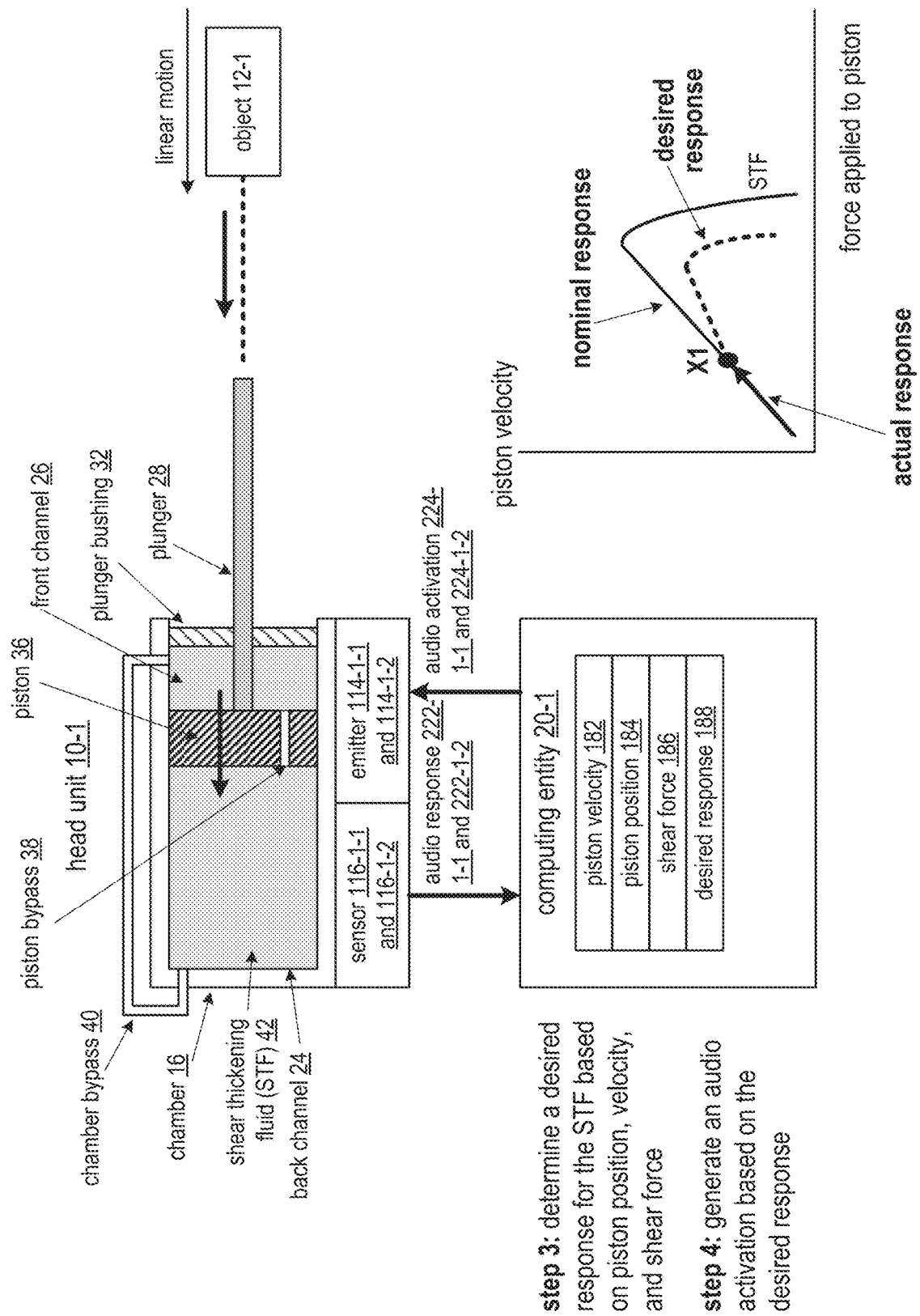
Figure 9C:
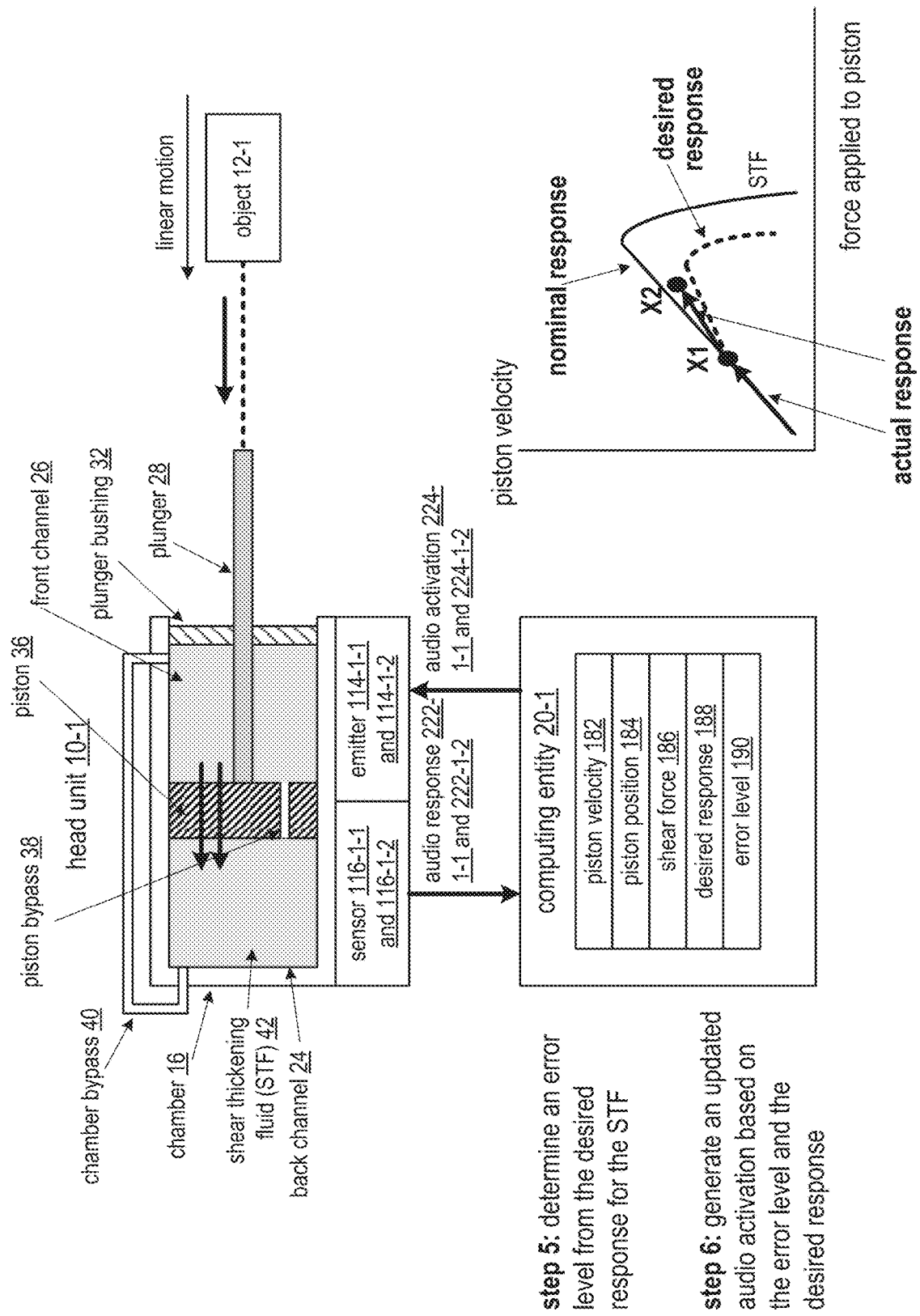

FIGS. 9A-9C are schematic block diagrams of another embodiment of a mechanical and computing system illustrating another example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42. The piston is housed at least partially radially within the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates.

The head unit 10-1 further includes a set of audio sensors positioned proximal to the chamber 16 and a set of audio emitters positioned proximal to the chamber 16. For example, sensors 116-1-1 and 116-1-2 and emitters 114-1-1 and 114-1-2, where the sensors and emitters sense and emit acoustic waves respectively to interact with the STF 42. For instance, sensor 116-1-1 is implemented utilizing a microphone and emitter 114-1-1 is implemented utilizing an ultrasonic transducer.

FIG. 9A illustrates an example of operation of a method for the controlling the operational aspects. A first step of the example of operation includes the computing entity 20-1 interpreting audio responses 222-1-1 and 222-1-2 from the STF 42 (e.g., in response to varying acoustic responsiveness of the particles of the STF) to produce a piston velocity and position. The set of audio sensors are positioned proximal to the head unit 10-1 for controlling motion of the object 12-1, where the head unit includes the chamber filled at least in part with a shear thickening fluid (STF). In another embodiment, the STF is mixed with acoustic nanoparticles to enhance the transmission of acoustic waves through the STF. The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates.

As an example of interpreting the audio response 222-1-1 and 222-1-2, the computing entity 20-1 compares the audio response 222-1-1 and 222-1-2 to previous measurements of audio waves versus piston velocity and position to produce the piston velocity 182 and piston position 184. As another example of the interpreting the audio response 222-1-1 and 222-1-2, the computing entity 20-1 extracts the piston velocity 182 and the piston position 184 directly from the audio response 222-1-1 and 222-1-2 when the sensors 116-1-1 and 116-1-2 generate the velocity and piston position directly.

A second step of the example of operation includes the computing entity 20-1 determining a shear force 186 based on the piston velocity 182 and piston position 184. For example, the computing entity 20-1 compares the velocity and position to stored data for instantaneous velocity and position verses shear force for the STF 42. As another example, the computing entity 20-1 receives the shear force 186 from at least one of the set of sensors when at least one sensor provides the shear force 186 directly. In an instance, the shear force 186 reveals the piston velocity versus force applied to the piston curve as illustrated in FIG. 9A, where at a current time of interpreting the audio response, the force and piston velocity are at a point X1.

FIG. 9B further illustrates the example of operation of the method for the controlling the operational aspects. A third step of the example of operation includes the computing entity 20-1 determining a desired response 188 for the STF based on one or more of the shear force 186 and the piston velocity 182 and the piston position 184. The desired response 188 includes continuing to follow a nominal response curve associated with the STF without modifying the functioning of the STF. The desired response 188 further includes modifying the function of the STF to further slow down the object 12-1 or to allow the object 12-1 to speed up at a velocity associated with the nominal response.

The determining the desired response 188 includes one or more of interpreting a request, interpreting guidance from the chamber database 34, detecting that the piston velocity is greater than a maximum piston velocity threshold level (e.g., too fast), detecting that the piston velocity is less than a minimum piston velocity threshold level (e.g., too slow), and detecting an environmental condition warranting changing the viscosity (e.g., a triggering of a vehicular airbag sensor, detection of an earthquake, a proximity warning, etc.). For instance, the computing entity 20-1 determines that the desired response 188 to slow down the object 12-1 is warranted based on reaching a maximum piston velocity threshold level for object 12-1.

Having determined the desired response 188 for the STF, a fourth step of the example method of operation includes the computing entity 20-1 generating an audio activation based on the desired response for the STF, where the audio activation is output to the set of audio emitters positioned proximal to the chamber 16. The generating of the audio activation includes one or more of performing a lookup in an audio activation table for audio wave output values versus desired viscosity increases, dynamically calculating the audio wave output values based on a gap in viscosity levels, and receiving the audio activation from another computing entity. For example, the computing entity 20-1 determines the audio activation to affect the STF such that the viscosity is raised to lead to an abrupt slow down of the piston through the STF. Having determined the audio activation, the computing entity 20-1 outputs audio activation 224-1-1 and 224-1-2 to the emitters 114-1-1 and 114-1-2 respectively to affect the viscosity of the STF 42.

FIG. 9C further illustrates the example of operation of the method for the controlling the operational aspects where, having generated the audio activation, the computing entity 20-1 determines an error level 190 from the desired response for the STF 42. For example, the computing entity 20-1 re-measures the audio response to determine one or more of piston velocity 182, piston position 184, and shear force 186. Having determined velocity and position, the computing entity 20-1 determines actual response at a time X2 and compares the piston velocity versus force applied to the piston to the desired response curve. The computing entity 20-1 determines the error level 190 based on the comparison.

Having determined the error level, a sixth step of the example of operation of the method for the controlling the operational aspects includes the computing entity 20-1 generating an updated audio activation based on the error level and the desired response. The error level is at least one of substantially zero (e.g., the actual response is on top of the desired response), a positive error level (e.g., when the actual response includes a piston velocity that is too high for the force applied to the piston), and a negative error level (e.g., when the actual response includes a piston velocity that is too low for the force applied to the piston). In an example of generating the updated audio activation, the computing entity 20-1 determines that the error level 190 is a positive error level, determines the updated audio activation to further increase the viscosity of the STF 42, and outputs audio activation 224-1-1 and 224-1-2 to the emitters 114-1-1 and 114-1-2 respectively to facilitate slowing down the piston velocity back to the desired response curve.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 10A:
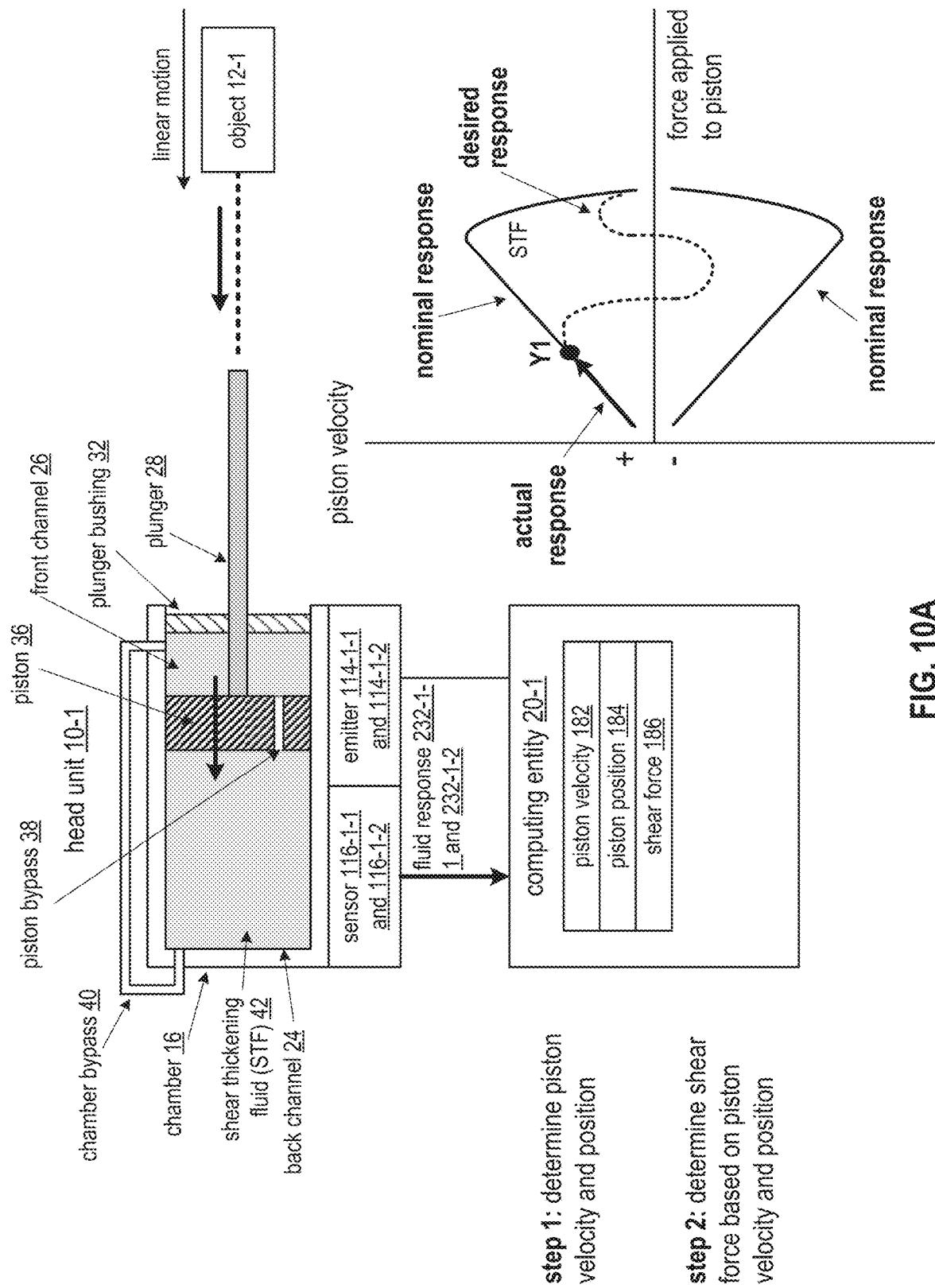
FIGS. 10A-10C are schematic block diagrams of another embodiment of a mechanical and computing system illustrating another example of controlling operational aspects in accordance with the present invention.
Figure 10B:
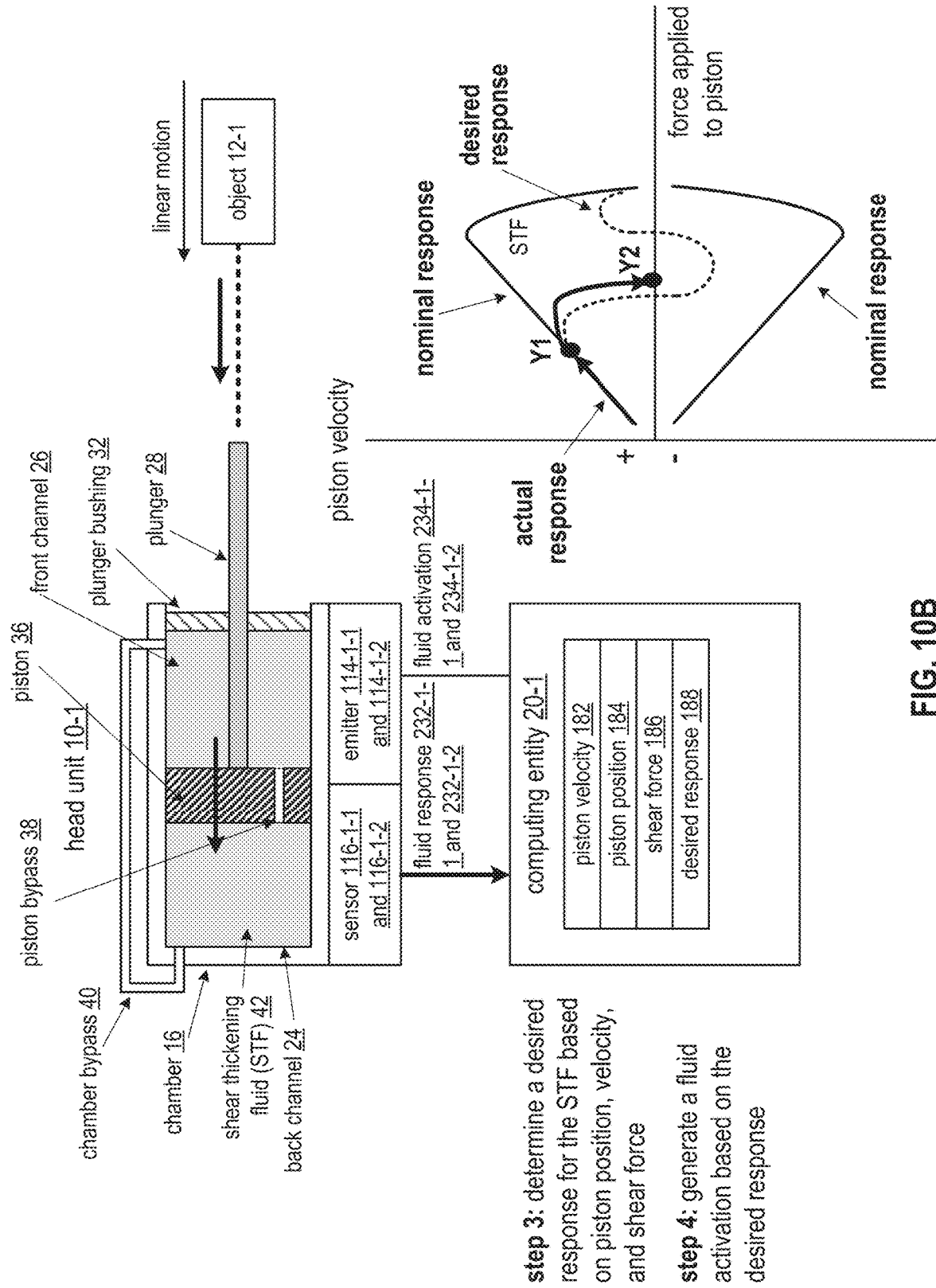
Figure 10C:
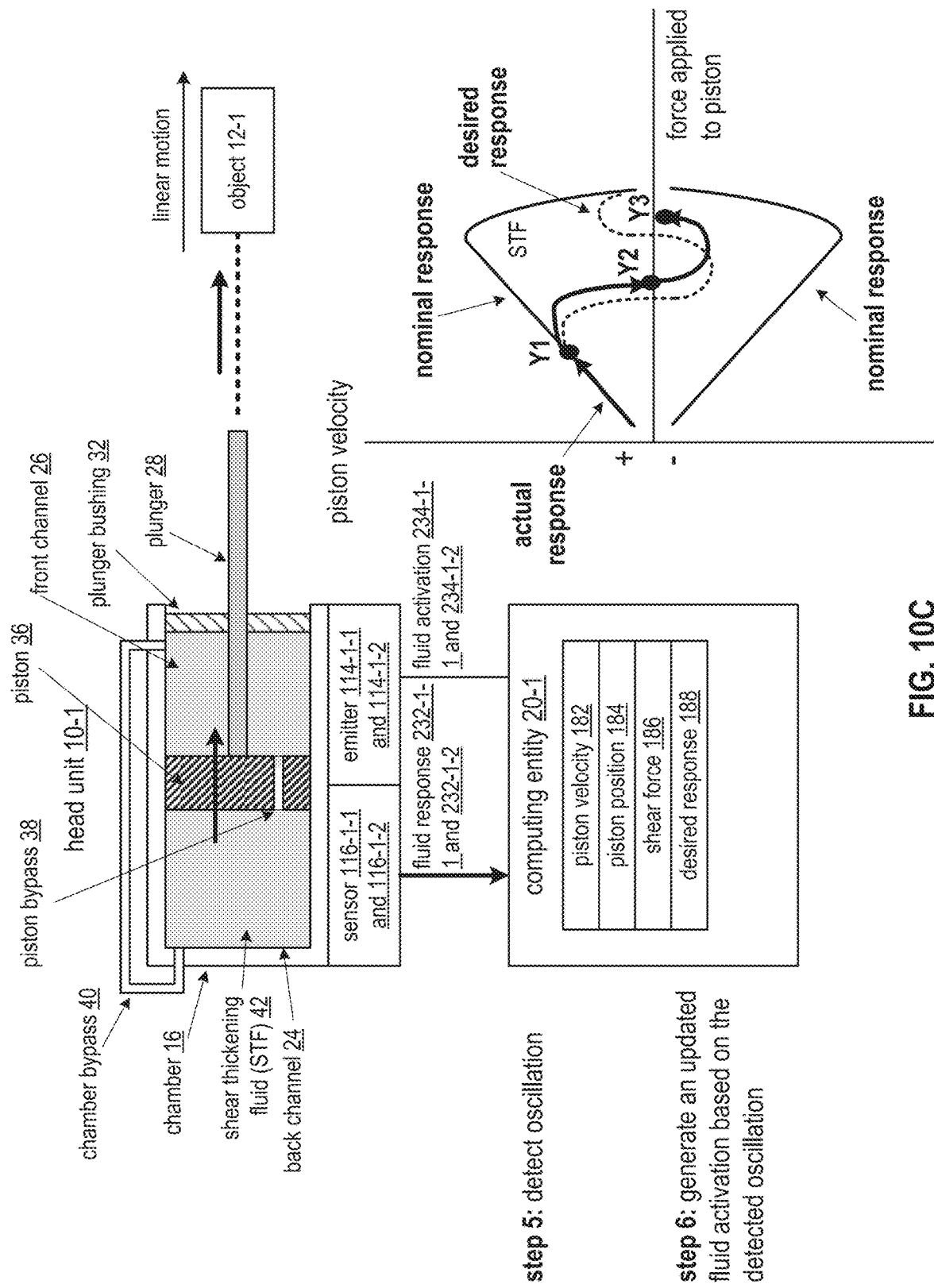

FIGS. 10A-10C are schematic block diagrams of another embodiment of a mechanical and computing system illustrating another example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42. The piston is housed at least partially radially within the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates.

The head unit 10-1 further includes a set of fluid flow sensors (e.g., any type) positioned proximal to the chamber 16 and a set of fluid manipulation emitters (e.g., any type) positioned proximal to the chamber 16. For example, sensors 116-1-1 and 116-1-2 and emitters 114-1-1 and 114-1-2, where the sensors and emitters sense and emit energy respectively to interact with the STF 42.

FIG. 10A illustrates an example of operation of a method for the controlling the operational aspects. A first step of the example of operation includes the computing entity 20-1 interpreting fluid responses 232-1-1 and 232-1-2 from the STF 42 (e.g., in response to varying responsiveness of the particles of the STF) to produce a piston velocity and position. The set of fluid flow sensors are positioned proximal to the head unit 10-1 for controlling motion of the object 12-1, where the head unit includes the chamber filled at least in part with the shear thickening fluid (STF) 42. In another embodiment, the STF is mixed with nanoparticles to enhance the transmission of energy through the STF. The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates.

As an example of interpreting the fluid response 232-1-1 and 232-1-2, the computing entity 20-1 compares the fluid response 232-1-1 and 232-1-2 to previous measurements of fluid responses versus piston velocity and position to produce the piston velocity 182 and piston position 184. As another example of the interpreting the fluid response 232-1-1 and 232-1-2, the computing entity 20-1 extracts the piston velocity 182 and the piston position 184 directly from the fluid response 232-1-1 and/or 232-1-2 when the sensors 116-1-1 and 116-1-2 generate the velocity and piston position directly.

A second step of the example of operation includes the computing entity 20-1 determining a shear force 186 based on the piston velocity 182 and piston position 184. For example, the computing entity 20-1 compares the velocity and position to stored data for instantaneous velocity and position verses shear force for the STF 42. As another example, the computing entity 20-1 receives the shear force 186 from at least one of the set of sensors when at least one sensor provides the shear force 186 directly. In an instance, the shear force 186 reveals the piston velocity versus force applied to the piston curve as illustrated in FIG. 10A, where at a current time of interpreting the audio response, the force and piston velocity are at a point Y1. That curve further illustrates nominal responses for both positive and negative velocities corresponding to inward and outward movement of the piston.

FIG. 10B further illustrates the example of operation of the method for the controlling the operational aspects. A third step of the example of operation includes the computing entity 20-1 determining a desired response 188 for the STF based on one or more of the shear force 186 and the piston velocity 182 and the piston position 184. The desired response 188 includes continuing to follow a nominal response curve associated with the STF without modifying the functioning of the STF. The desired response 188 further includes modifying the function of the STF to further slow down the object 12-1 or to allow the object 12-1 to speed up at a velocity associated with the nominal response.

The determining the desired response 188 includes one or more of interpreting a request, interpreting guidance from the chamber database 34, detecting that the piston velocity is greater than a maximum piston velocity threshold level (e.g., too fast), detecting that the piston velocity is less than a minimum piston velocity threshold level (e.g., too slow), and detecting an environmental condition warranting changing the viscosity (e.g., a triggering of a vehicular airbag sensor, detection of an earthquake, a proximity warning, etc.). For instance, the computing entity 20-1 determines that the desired response 188 to slow down the object 12-1 is warranted based on reaching a maximum piston velocity threshold level for object 12-1.

Having determined the desired response 188 for the STF, a fourth step of the example method of operation includes the computing entity 20-1 generating a fluid activation based on the desired response for the STF, where the fluid activation is output to the set of fluid manipulation emitters positioned proximal to the chamber 16. The generating of the fluid activation includes one or more of performing a lookup in a fluid activation table for fluid activation output values versus desired viscosity increases, dynamically calculating the fluid activation output values based on a gap in viscosity levels, and receiving the fluid activation from another computing entity. For example, the computing entity 20-1 determines the fluid activation to affect the STF such that the viscosity is raised to lead to an abrupt slow down of the piston through the STF as the actual response moves from a position at a time associated with Y1 to another position at another time associated with Y2. Having determined the fluid activation, the computing entity 20-1 outputs fluid activation 234-1-1 and 234-1-2 to the emitters 114-1-1 and 114-1-2 respectively to affect the viscosity of the STF 42.

FIG. 10C further illustrates the example of operation of the method for the controlling the operational aspects where, having generated the fluid activation, the computing entity 20-1 detects an oscillation associated with the object 12-1 and piston 36. For example, the computing entity 20-1 re-measures the fluid response to determine one or more of piston velocity 182, piston position 184, and shear force 186. Having determined velocity and position, the computing entity 20-1 determines actual response at a time Y2 going to Y3 and compares the piston velocity versus force applied to the piston to the desired response curve. The computing entity 20-1 indicates the acylation when the velocity changes between positive and negative for several cycles.

Having detected the oscillation, a sixth step of the example of operation of the method for the controlling the operational aspects includes the computing entity 20-1 generating an updated fluid activation based on the detected oscillation. The oscillation has an associated frequency and magnitude pattern. In an example of generating the updated fluid activation, the computing entity 20-1 determines that and updated desired response should include a dampened oscillation to lead the piston and object 12-12 lower magnitudes of the oscillation. The computing entity 20-1 outputs the fluid activation 234-1-1 and 234-1-2 to the emitters 114-1-1 and 114-1-2 respectively to facilitate slowing down the oscillation to that of the updated desired response.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 11A:
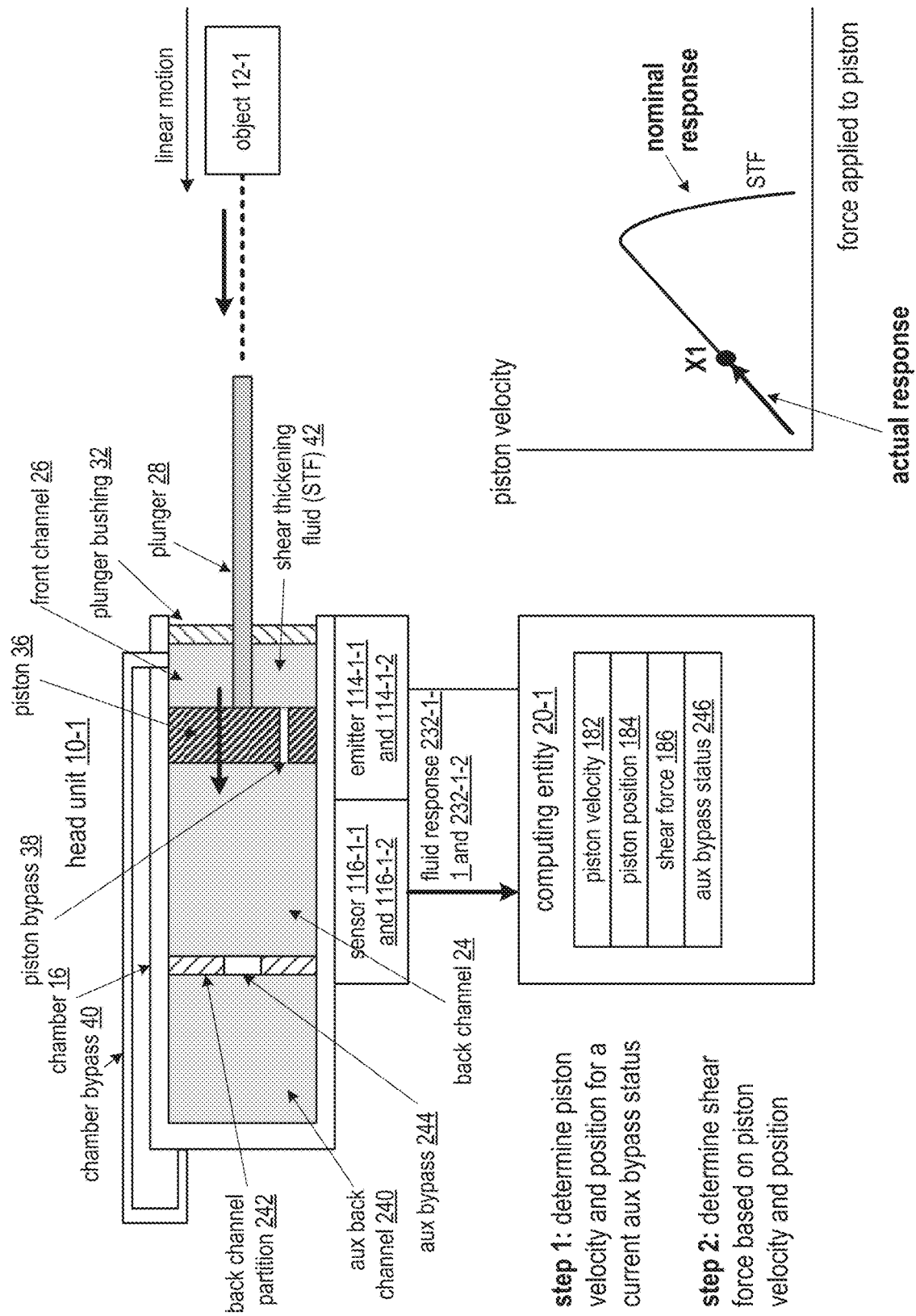
FIGS. 11A-11B are schematic block diagrams of another embodiment of a mechanical and computing system illustrating another example of controlling operational aspects in accordance with the present invention.

FIGS. 11A-111B are schematic block diagrams of another embodiment of a mechanical and computing system illustrating another example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42. The chamber 16 includes a piston compartment and an auxiliary compartment. The piston compartment includes the front channel 26 and the back channel 24. The auxiliary compartment includes an auxiliary back channel 240. An auxiliary bypass 244 couples the piston compartment and the auxiliary compartment controlling flow of the shear thickening fluid between the back channel 24 and the auxiliary back channel 240.

The piston is housed at least partially radially within the piston compartment of the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the piston compartment of the chamber 16 in an inward direction or traveling through the piston compartment of the chamber 16 in an outward direction. The STF is configured to have a decreasing viscosity in response to a first range of shear rates and an increasing viscosity in response to a second range of shear rates.

The head unit 10-1 further includes a set of fluid flow sensors positioned proximal to the chamber 16 and a set of fluid manipulation emitters positioned proximal to the chamber 16. For example, sensors 116-1-1 and 116-1-2 and emitters 114-1-1 and 114-1-2, where the sensors and emitters sense and emit energy respectively to interact with the STF 42.

FIG. 11A illustrates an example of operation of a method for the controlling the operational aspects. A first step of the example of operation includes the computing entity 20-1 interpreting fluid responses 232-1-1 and 232-1-2 from the STF 42 (e.g., in response to varying responsiveness of the particles of the STF) to produce a piston velocity and position. The set of fluid sensors are positioned proximal to the head unit 10-1 for controlling motion of the object 12-1, where the head unit includes the chamber filled at least in part with a shear thickening fluid (STF). The chamber includes the piston compartment and the auxiliary compartment. The auxiliary bypass couples the piston compartment and the auxiliary compartment controlling the flow of the STF between the piston compartment and the auxiliary compartment.

The piston is housed at least partially radially within the chamber and the piston configured to exert pressure against the shear thickening fluid in response to movement of the piston from a force applied to the piston from the object 12-1. The movement of the piston includes one of traveling through the piston compartment of the chamber in an inward direction or traveling through the piston compartment of the chamber in an outward direction. The STF is configured to have a decreasing viscosity in response to a first range of shear rates and an increasing viscosity in response to a second range of shear rates.

As an example of interpreting the fluid response 232-1-1 and 232-1-2, the computing entity 20-1 compares the fluid response 232-1-1 and 232-1-2, or a current auxiliary bypass status 246 (e.g., level of openness), to previous measurements of fluid flow versus piston velocity and position to produce the piston velocity 182 and piston position 184. As another example of the interpreting the fluid response 232-1-1 and 232-1-2, the computing entity 20-1 extracts the piston velocity 182 and the piston position 184 directly from the fluid response 232-1-1 and/or 232-1-2 when the sensors 116-1-1 and 116-1-2 generate the velocity and piston position directly.

A second step of the example of operation includes the computing entity 20-1 determining a shear force 186 based on the piston velocity 182 and piston position 184. For example, the computing entity 20-1 compares the velocity and position to stored data for instantaneous velocity and position verses shear force for the STF 42. As another example, the computing entity 20-1 receives the shear force 186 from at least one of the set of sensors when at least one sensor provides the shear force 186 directly. In an instance, the shear force 186 reveals the piston velocity versus force applied to the piston curve as illustrated in FIG. 11A, where at a current time of interpreting the audio response, the force and piston velocity are at a point X1.

Figure 11B:
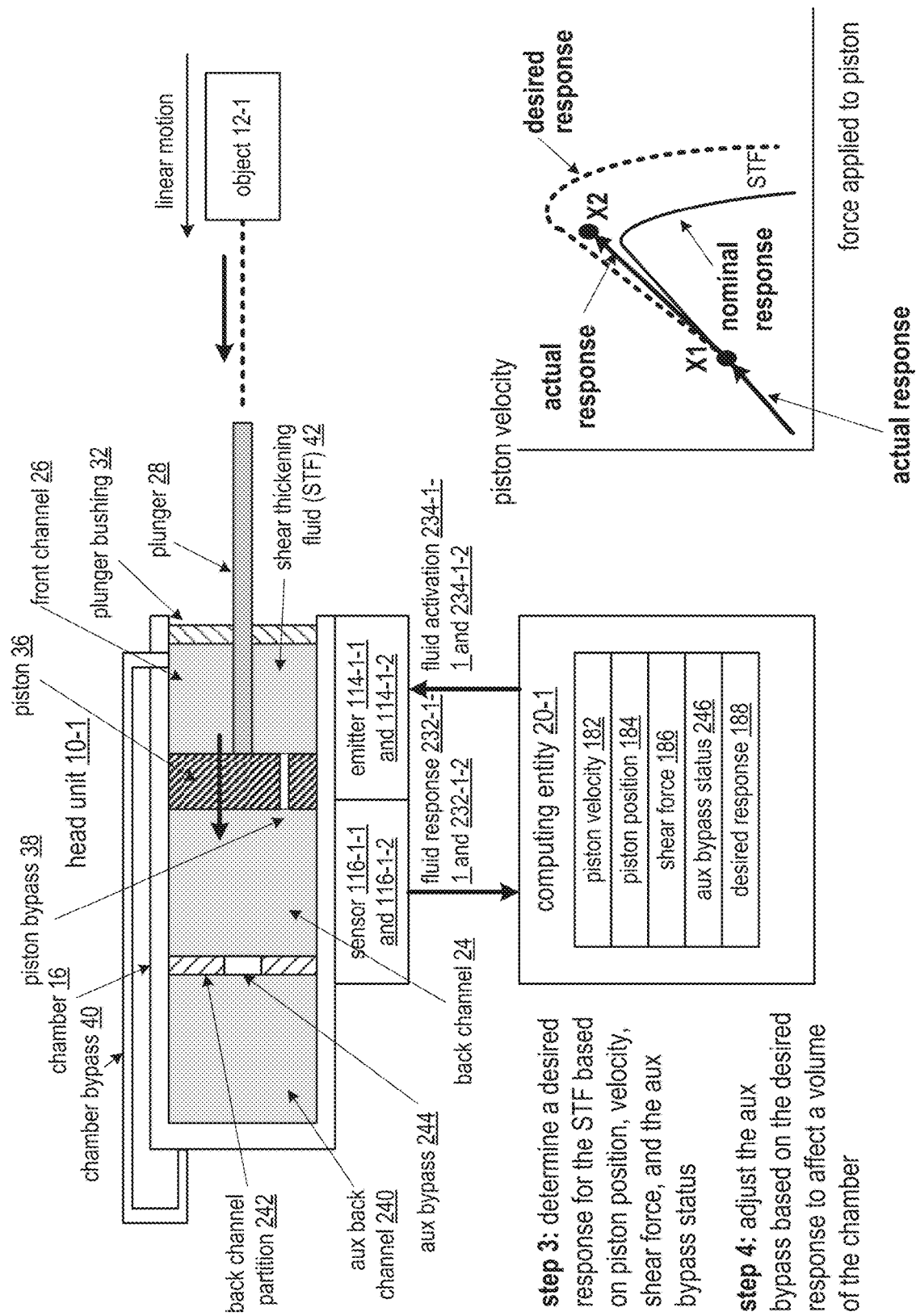

FIG. 11B further illustrates the example of operation of the method for the controlling the operational aspects. A third step of the example of operation includes the computing entity 20-1 determining a desired response 188 for the STF based on one or more of the shear force 186 and the piston velocity 182 and the piston position 184. The desired response 188 includes continuing to follow a nominal response curve associated with the STF without modifying the functioning of the STF. The desired response 188 further includes modifying the function of the STF to further slow down the object 12-1 or to allow the object 12-1 to speed up at a velocity associated with the nominal response.

The determining the desired response 188 includes one or more of interpreting a request, interpreting guidance from the chamber database 34, detecting that the piston velocity is greater than a maximum piston velocity threshold level (e.g., too fast), detecting that the piston velocity is less than a minimum piston velocity threshold level (e.g., too slow), and detecting an environmental condition warranting changing the viscosity (e.g., a triggering of a vehicular airbag sensor, detection of an earthquake, a proximity warning, etc.). For instance, the computing entity 20-1 determines that the desired response 188 to speed up the object 12-1 is warranted based on reaching a minimum piston velocity threshold level for object 12-1.

Having determined the desired response 188 for the STF, a fourth step of the example method of operation includes the computing entity 20-1 adjusting the auxiliary bypass 244 based on the desired response 188 to affect a volume of the chamber 16. Adjusting of the auxiliary bypass 244 includes direct adjustment and adjustment via one or more of the emitters. For example, the computing entity 20-1 determines an adjustment for the auxiliary bypass 244 to open the bypass to increase the volume of the chamber 16 such that the piston velocity can increase without a slow down due to a premature shear threshold effect as the actual response moves from a position X1 to a position X2.

In an embodiment, the process repeats where further fluid response is utilized to recalculate the desired response. The computing entity 20-1 updates the adjustment to the auxiliary bypass for based on the recalculated desired response.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 12A:
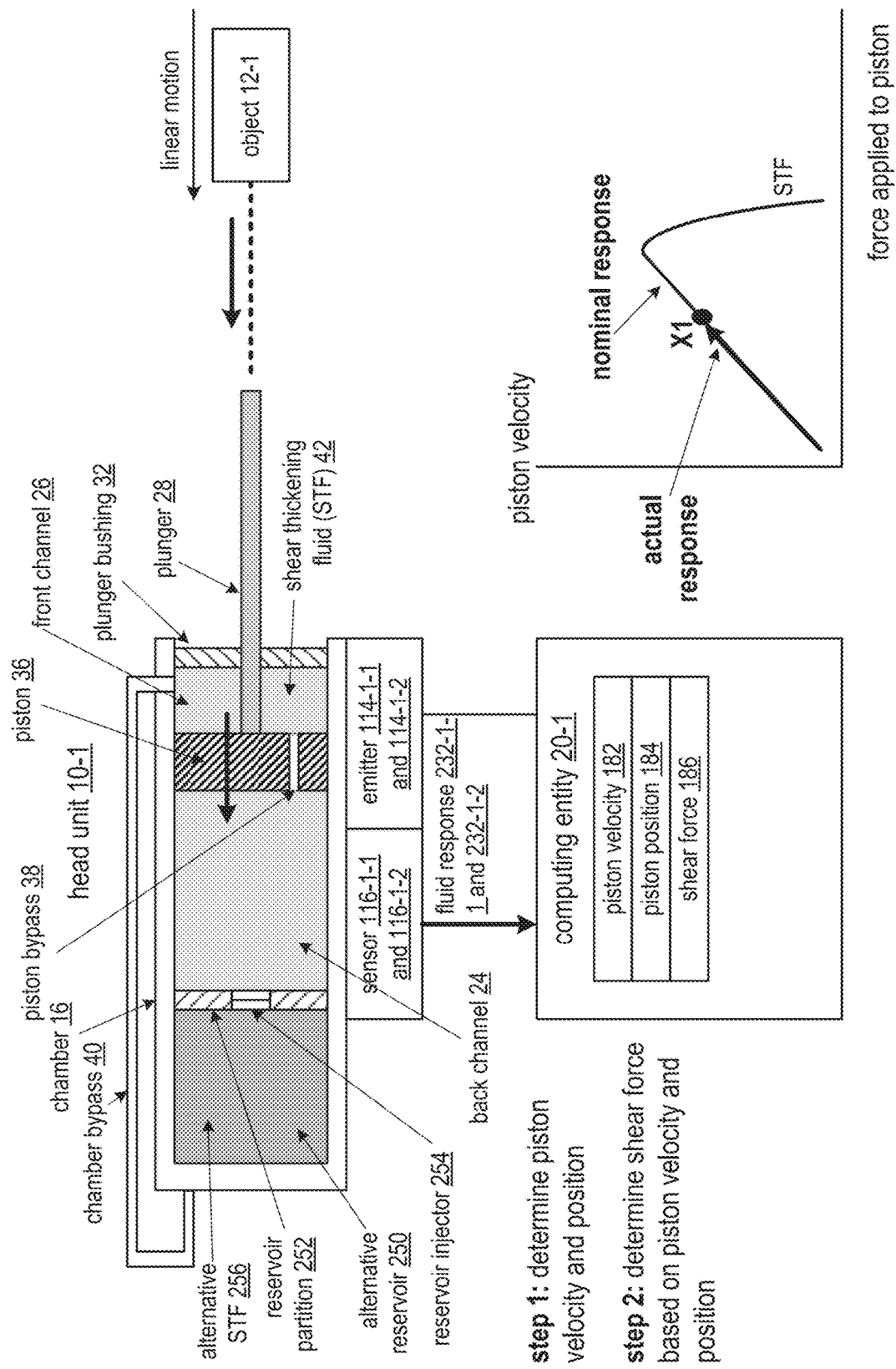
FIGS. 12A-12B are schematic block diagrams of another embodiment of a mechanical and computing system illustrating another example of controlling operational aspects in accordance with the present invention.
Figure 12B:
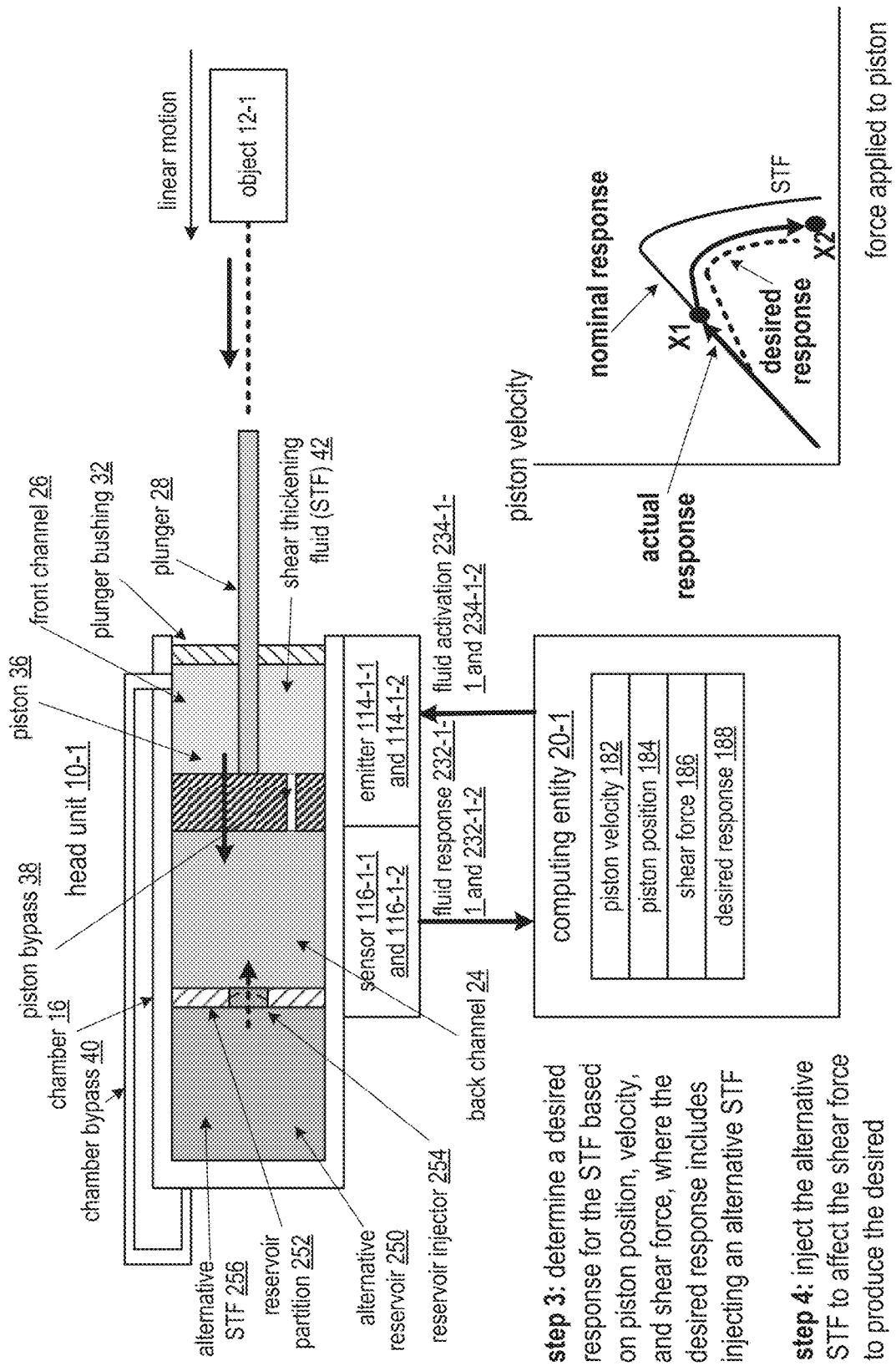

FIGS. 12A-12B are schematic block diagrams of another embodiment of a mechanical and computing system illustrating another example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42. The chamber 16 includes a piston compartment and an alternative reservoir 250. The piston compartment includes the front channel 26 and the back channel 24. A reservoir injector 254 couples the piston compartment and the alternative reservoir 250 controlling inflow of an alternative shear thickening fluid 256 from the alternative reservoir 250 to the piston compartment (e.g., into the back channel 24) to mix with the STF 42. In an example, such inflow occurs only once, during an emergency.

The piston is housed at least partially radially within the piston compartment of the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the piston compartment of the chamber 16 in an inward direction or traveling through the piston compartment of the chamber 16 in an outward direction. The STF is configured to have a decreasing viscosity in response to a first range of shear rates and an increasing viscosity in response to a second range of shear rates.

The head unit 10-1 further includes a set of fluid flow sensors positioned proximal to the chamber 16 and a set of fluid manipulation emitters positioned proximal to the chamber 16. For example, sensors 116-1-1 and 116-1-2 and emitters 114-1-1 and 114-1-2, where the sensors and emitters sense and emit energy respectively to interact with the STF 42.

FIG. 12A illustrates an example of operation of a method for the controlling the operational aspects. A first step of the example of operation includes the computing entity 20-1 interpreting fluid responses 232-1-1 and 232-1-2 from the STF 42 (e.g., in response to varying responsiveness of the particles of the STF) to produce a piston velocity and position. The set of fluid sensors are positioned proximal to the head unit 10-1 for controlling motion of the object 12-1, where the head unit includes the chamber filled at least in part with a shear thickening fluid (STF). The chamber includes the piston compartment and the alternative reservoir separated by a reservoir partition 252. The reservoir injector 254 couples the alternative reservoir to the piston compartment controlling inflow of the alternative STF 256 from the alternative reservoir to the piston compartment to mix with the STF 42.

The piston is housed at least partially radially within the chamber and the piston configured to exert pressure against the shear thickening fluid in response to movement of the piston from a force applied to the piston from the object 12-1. The movement of the piston includes one of traveling through the piston compartment of the chamber in an inward direction or traveling through the piston compartment of the chamber in an outward direction. The STF is configured to have a decreasing viscosity in response to a first range of shear rates and an increasing viscosity in response to a second range of shear rates.

As an example of interpreting the fluid response 232-1-1 and 232-1-2, the computing entity 20-1 compares the fluid response 232-1-1 and 232-1-2 to previous measurements of fluid flow versus piston velocity and position to produce the piston velocity 182 and piston position 184. As another example of the interpreting the fluid response 232-1-1 and 232-1-2, the computing entity 20-1 extracts the piston velocity 182 and the piston position 184 directly from the fluid response 232-1-1 and/or 232-1-2 when the sensors 116-1-1 and 116-1-2 generate the velocity and piston position directly.

A second step of the example of operation includes the computing entity 20-1 determining a shear force 186 based on the piston velocity 182 and piston position 184. For example, the computing entity 20-1 compares the velocity and position to stored data for instantaneous velocity and position verses shear force for the STF 42. As another example, the computing entity 20-1 receives the shear force 186 from at least one of the set of sensors when at least one sensor provides the shear force 186 directly. In an instance, the shear force 186 reveals the piston velocity versus force applied to the piston curve as illustrated in FIG. 12A, where at a current time of interpreting the audio response, the force and piston velocity are at a point X1.

FIG. 12B further illustrates the example of operation of the method for the controlling the operational aspects. A third step of the example of operation includes the computing entity 20-1 determining a desired response 188 for the STF based on one or more of the shear force 186 and the piston velocity 182 and the piston position 184, where the desired response 188 includes injecting the alternative STF 256 into the back channel 24. As an example, the desired response 188 further includes modifying the function of the STF by mixing it with the alternative STF to further slow down the object 12-1 associated with the new desired response.

The determining the desired response 188 includes one or more of interpreting a request, interpreting guidance from the chamber database 34, detecting that the piston velocity is greater than a maximum piston velocity threshold level (e.g., too fast), detecting that the piston velocity is less than a minimum piston velocity threshold level (e.g., too slow), and detecting an environmental condition warranting changing the viscosity (e.g., a triggering of a vehicular airbag sensor, detection of an earthquake, a proximity warning, etc.). For instance, the computing entity 20-1 determines that the desired response 188 to slow down the object 12-1 is warranted based on reaching an emergency piston velocity threshold level for object 12-1.

Having determined the desired response 188 for the STF, a fourth step of the example method of operation includes the computing entity 20-1 activating the reservoir injector 254 in accordance with the desired response 188 for the STF to adjust the inflow of the alternative STF from the alternative reservoir 250 to the piston compartment to mix with the STF 42. Activating the reservoir injector 254 includes direct activation and adjustment via one or more of the emitters. For example, the computing entity 20-1 determines to open the reservoir injector 254 to create a mixture of the alternative STF 256 and the STF 42 (e.g., with a significantly higher viscosity for the current shear force 186) in the back channel 24 to significantly slow down the velocity of the object 12-1 as the actual response moves from the X1 to a position X2.

In an alternative embodiment, the reservoir injector 254, on its own, mechanically detects an undesired attribute within the back channel 24 (e.g., pressure greater than a high pressure over threshold level) and opens to initiate the inflow of the alternative STF 256 into the back channel 24 to mix with the STF 42 to enable an emergency slow down of the object 12-1.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 13A:
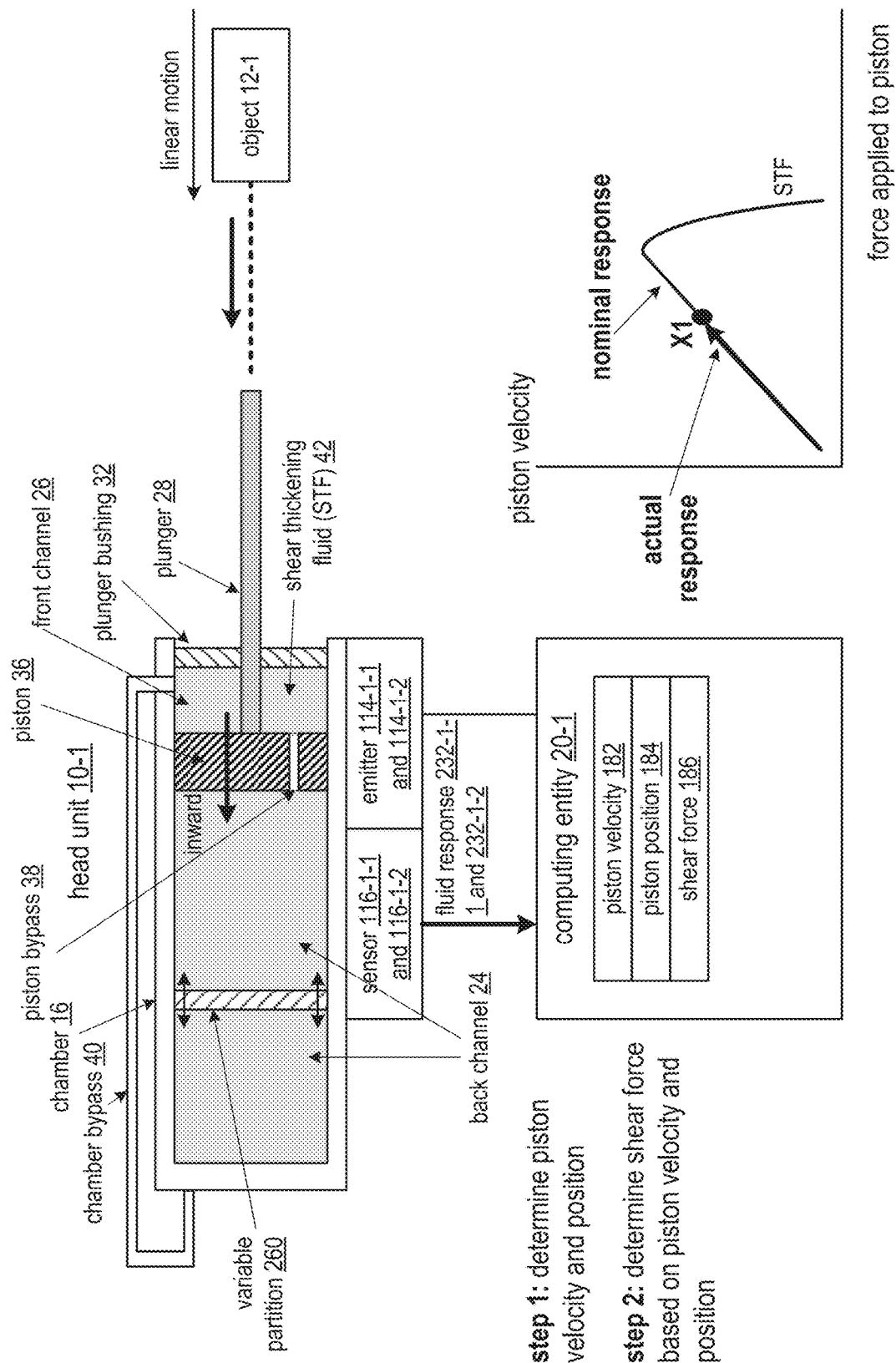
FIGS. 13A-13B are schematic block diagrams of another embodiment of a mechanical and computing system illustrating another example of controlling operational aspects in accordance with the present invention.
Figure 13B:
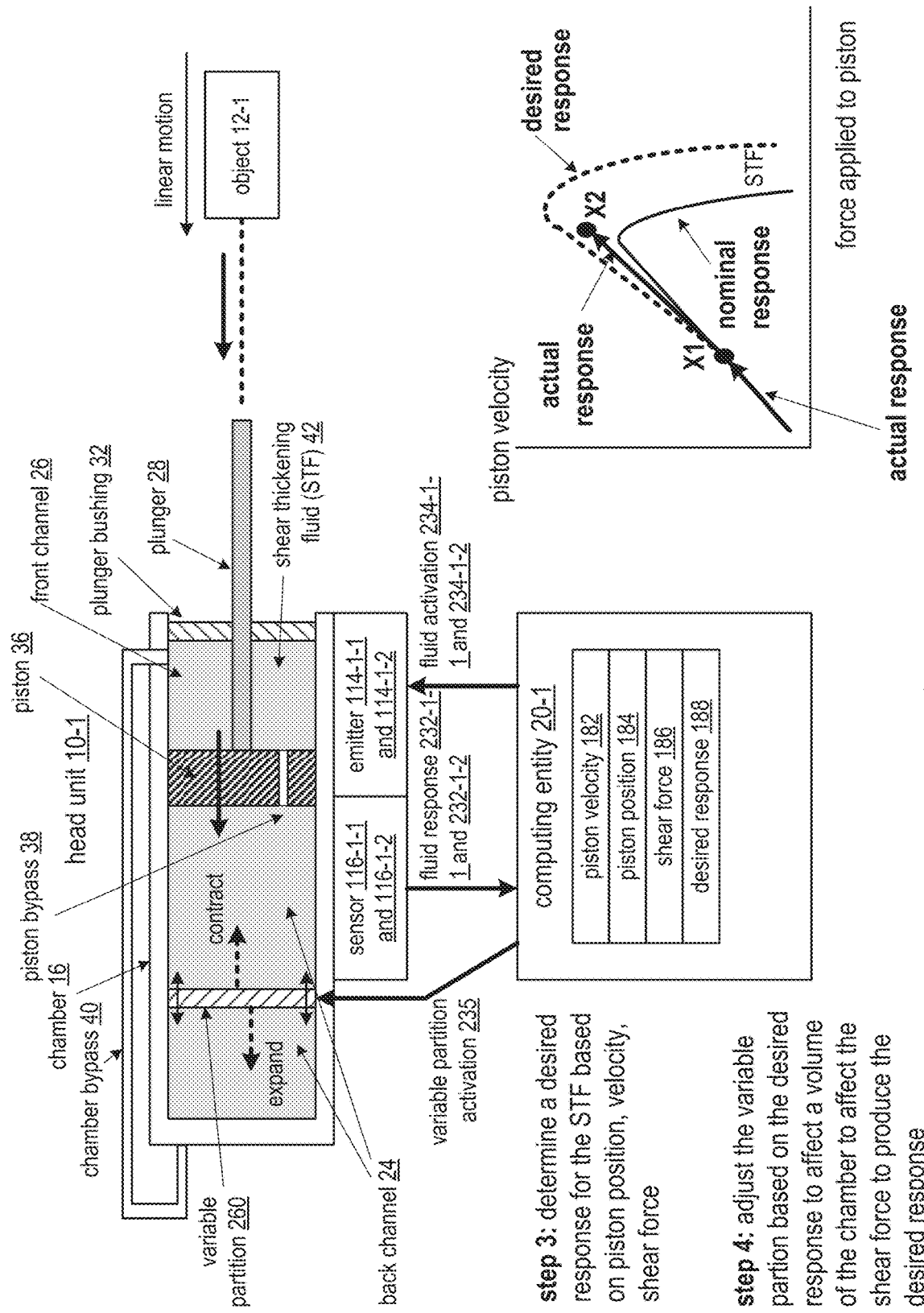

FIGS. 13A-13B are schematic block diagrams of another embodiment of a mechanical and computing system illustrating another example of controlling operational aspects. The mechanical and computing system includes the head unit 10-1 of FIG. 1, the object 12-1 of FIG. 1, and the computing entity 20-1 of FIG. 1.

In particular, the head unit 10-1 for controlling motion of the object 12-1 includes the chamber 16 filled at least in part with the shear thickening fluid (STF) 42. The chamber 16 includes a piston compartment. The piston compartment includes the front channel 26 and the back channel 24, where the variable partition 260 partitions the back channel 24.

The piston is housed at least partially radially within the piston compartment of the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the chamber 16 in an inward direction or traveling through the chamber 16 in an outward direction. The STF is configured to have a decreasing viscosity in response to a first range of shear rates and an increasing viscosity in response to a second range of shear rates.

The head unit 10-1 further includes a variable partition 260 positioned within the chamber between the piston and a closed end of the chamber to dynamically affect volume of the chamber based on activation of the variable partition. The head unit 10-1 further includes a set of fluid flow sensors positioned proximal to the chamber 16 and a set of fluid manipulation emitters positioned proximal to the chamber 16. The set of fluid flow sensors provide a fluid response from the STF. The set of fluid manipulation emitters provide a fluid activation to the STF. For example, sensors 116-1-1 and 116-1-2 and emitters 114-1-1 and 114-1-2 are proximal to the chamber, where the sensors and emitters sense and emit energy respectively to interact with the STF 42.

FIG. 13A illustrates an example of operation of a method for the controlling the operational aspects. A first step of the example of operation includes the computing entity 20-1 interpreting fluid responses 232-1-1 and 232-1-2 from the STF 42 (e.g., in response to varying responsiveness of the particles of the STF) to produce a piston velocity and a piston position of the piston 36. The set of fluid sensors are positioned proximal to the head unit 10-1 for controlling motion of the object 12-1, where the head unit includes the chamber filled at least in part with a shear thickening fluid (STF).

The piston is housed at least partially radially within the chamber and the piston configured to exert pressure against the shear thickening fluid in response to movement of the piston from a force applied to the piston from the object 12-1. The movement of the piston includes one of traveling through the chamber in an inward direction or traveling through the chamber in an outward direction. The STF is configured to have a decreasing viscosity in response to a first range of shear rates and an increasing viscosity in response to a second range of shear rates. The chamber includes the variable partition to dynamically affect volume of the chamber.

The interpreting the fluid flow response from the set of fluid flow sensors to produce the piston velocity and the piston position of the piston includes a series of sub-steps. A first sub-step includes inputting, from one or more fluid flow sensors of the set of fluid flow sensors, a set of fluid flow signals over a time range. For example, the computing entity 20-1 receives fluid responses 232-1-1 and 232-1-2 over the time range, where the fluid responses include the fluid flow signals.

A second sub-step includes determining the fluid flow response of the set of fluid flow sensors based on the set of fluid flow signals. For example, the computing entity 20-1 interprets the fluid flow signals to produce the fluid flow response.

A third sub-step includes determining the piston velocity based on the fluid flow response of the set of fluid flow sensors over the time range. For example, the computing entity 20-1 calculates piston velocity based on changes in the fluid flow response over the time range.

A fourth sub-step includes determining the piston position based on the piston velocity and a real-time reference. For example, the computing entity 20-1 calculates the piston position based on time in the piston velocity as the piston moves through the chamber.

As yet another example of interpreting the fluid response 232-1-1 and 232-1-2, the computing entity 20-1 compares the fluid response 232-1-1 and 232-1-2 to previous measurements of fluid flow versus piston velocity and piston position to produce the piston velocity 182 and piston position 184. As a still further example of the interpreting the fluid response 232-1-1 and 232-1-2, the computing entity 20-1 extracts the piston velocity 182 and the piston position 184 directly from the fluid response 232-1-1 and/or 232-1-2 when the sensors 116-1-1 and 116-1-2 generate the piston velocity and piston position directly.

A second step of the example of operation includes the computing entity 20-1 determining a shear force 186 based on the piston velocity 182 and the piston position 184. The determining the shear force based on the piston velocity and the piston position includes one approach of a variety of approaches. A first approach includes extracting the shear force directly from the fluid flow response when one or more fluid flow sensors of the set of fluid flow sensors outputs a shear force encoded signal. For example, the computing entity 20-1 extracts the shear force 186 directly from the fluid responses 232-1-1 and 232-1-2. In an instance, the shear force 186 reveals the piston velocity versus force applied to the piston curve as illustrated in FIG. 13A, where at a current time of interpreting the fluid flow response, the force and piston velocity are at a point X1.

A second approach includes determining the shear force utilizing the piston velocity and stored data for piston velocity verses shear force for the STF. For example, the computing entity 20-1 compares the velocity and position to stored data for instantaneous velocity and position verses shear force for the STF 42.

A third approach includes determining the shear force utilizing the piston position and stored data for piston position verses shear force for the STF within the chamber. For example, the computing entity 20-1 compares the velocity and position to stored data for instantaneous velocity and position verses shear force for the STF 42.

FIG. 13B further illustrates the example of operation of the method for the controlling the operational aspects. A third step of the example of operation includes the computing entity 20-1 determining a desired response 188 for the STF based on one or more of the shear force 186, the piston velocity 182, and the piston position 184, where the desired response 188 includes moving the variable partition 260 within the back channel 24. The determining the desired response for the STF based on one or more of the shear force, the piston velocity, and piston position includes one or more approaches. A first approach includes interpreting a request associated with modifying one or more of object velocity and object position. For example, the computing entity 20-1 interprets a request from another computing entity to update the desired response for the STF to increase viscosity to slow down the object 12-1.

A second approach includes interpreting guidance from a chamber database. For example, the computing entity 20-1 interprets data from the chamber database 34 of FIG. 1A to identify an updated response for the STF. For instance, the response for the STF is updated to decrease viscosity when historical information in the chamber database 34 indicates that a decrease in viscosity is desired based on a current piston position and current shear force.

A third approach includes establishing the desired response to include facilitating the second range of shear rates to slow down the object when detecting that the piston position is greater than a maximum piston position threshold level. A fourth approach includes establishing the desired response to include facilitating the first range of shear rates to speed up the object when detecting that the piston position is less than a minimum piston position threshold level.

A fifth approach includes establishing the desired response to include facilitating the second range of shear rates to slow down the object when detecting that the piston velocity is greater than a maximum piston velocity threshold level. A sixth approach includes establishing the desired response to include facilitating the first range of shear rates to speed up the object when detecting that the piston velocity is less than a minimum piston velocity threshold level.

A seventh approach includes establishing the desired response to include facilitating the second range of shear rates to slow down the object when detecting that the shear force is less than a minimum shear force threshold level. An eighth approach includes establishing the desired response to include facilitating the first range of shear rates to speed up the object when detecting that the shear force is greater than a maximum shear force threshold level.

A ninth approach includes detecting an environmental condition warranting a change in viscosity of the STF. For example, the computing entity 20-1 determines to change the viscosity of the STF when a triggering of a vehicular airbag sensor is detected. As another example, the computing entity 20-1 determines to change the viscosity of the STF when detecting an earthquake. As yet another example, the computing entity 20-1 determines to change the viscosity of the STF when detecting a proximity warning (e.g., of a certain collision).

A tenth approach includes establishing the desired response to include activation of the variable partition to expand the volume of the chamber (e.g., move the variable partition away from the piston) when establishing the desired response to include facilitating the first range of shear rates. An eleventh approach includes establishing the desired response to include activation of the variable partition to contract the volume of the chamber (e.g., move the variable partition towards the piston) when establishing the desired response to include facilitating the second range of shear rates.

Having determined the desired response 188 for the STF, a fourth step of the example method of operation includes the computing entity 20-1 activating the variable partition 260 in accordance with the desired response 188 for the STF to adjust the volume of the chamber. The activating the variable partition in accordance with the desired response for the STF to adjust the volume of the chamber includes one or more approaches. A first approach includes generating a variable partition activation 235 to expand the volume of the chamber when the desired response for the STF includes facilitating the first range of shear rates.

A second approach includes generating the variable partition activation to contract the volume of the chamber when the desired response for the STF includes facilitating the second range of shear rates. A third approach includes outputting the variable partition activation to the variable partition. For example, the computing entity 20-1 outputs the variable partition activation 235 to the variable partition 260 facilitate moving of the variable partition 260.

Alternatively, or in addition to, the activating the variable partition 260 includes adjustment via one or more of the emitters. For example, the computing entity 20-1 determines to move the variable partition 260 further inwards to lower the viscosity of the STF to affect increasing the velocity of the object 12-1 as the actual response moves from the X1 to a position X2 by outputting fluid activation 234-1-1 and 234-1-2 to the emitters 114-1-1 and 114-1-2 respectively to move the variable partition 260 further inwards.

In an alternative embodiment, the variable partition 260, on its own, mechanically detects an undesired attribute within the back channel 24 (e.g., pressure greater than a high pressure over threshold level) and moves further inward to initiate the speeding up of the object 12-1.

The method described above in conjunction with a processing module of any computing entity of the mechanical and computing system of FIG. 1 can alternatively be performed by other modules of the system of FIG. 1 or by other devices. In addition, at least one memory section that is non-transitory (e.g., a non-transitory computer readable storage medium, a non-transitory computer readable memory organized into a first memory element, a second memory element, a third memory element, a fourth element section, a fifth memory element, a sixth memory element, etc.) that stores operational instructions can, when executed by one or more processing modules of the one or more computing entities of the computing system 10, cause one or more computing devices of the mechanical and computing system of FIG. 1 to perform any or all of the method steps described above.

Figure 14A:
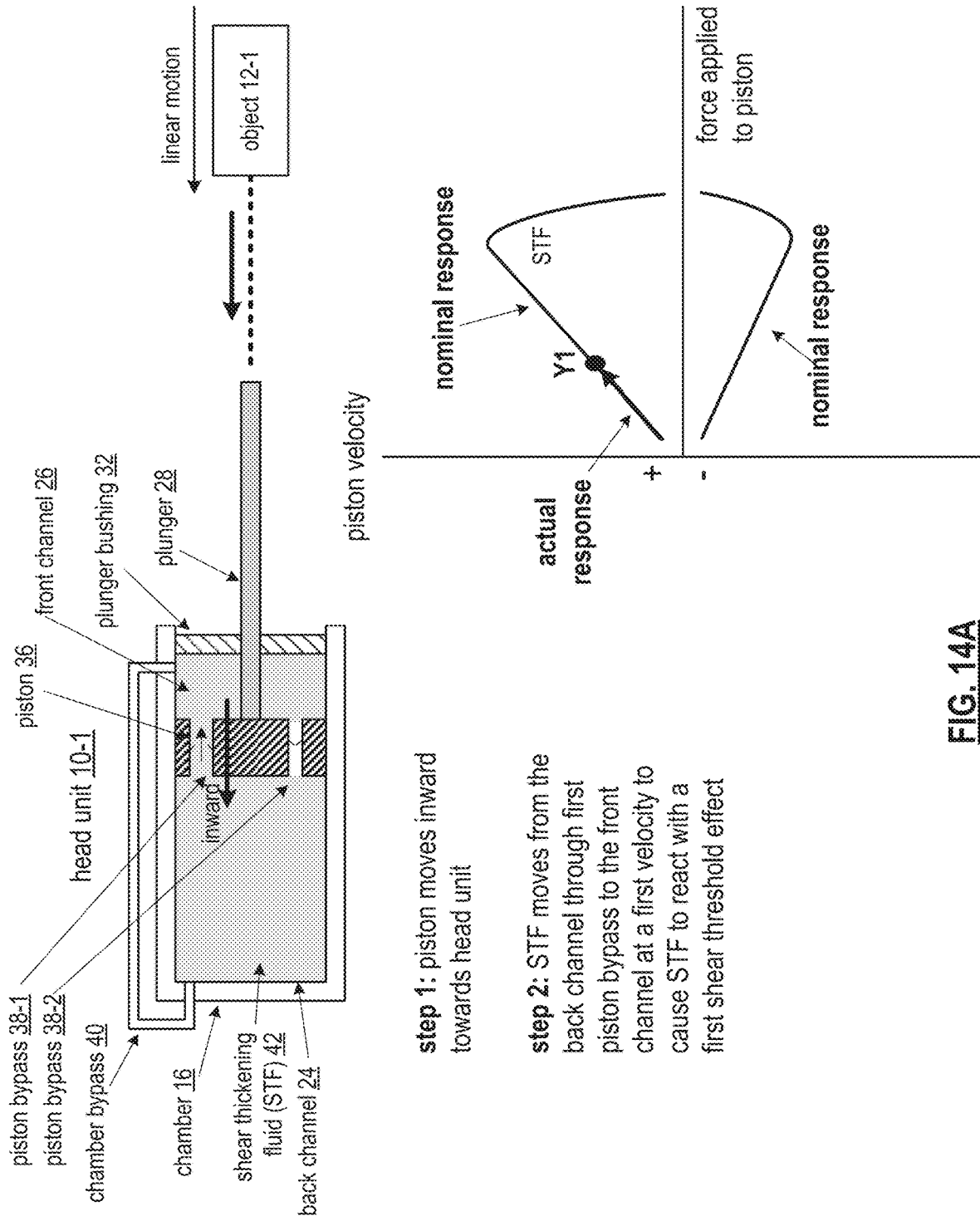
FIGS. 14A-14B are schematic block diagrams of an embodiment of a mechanical system illustrating an example of controlling operational aspects in accordance with the present invention.
Figure 14B:
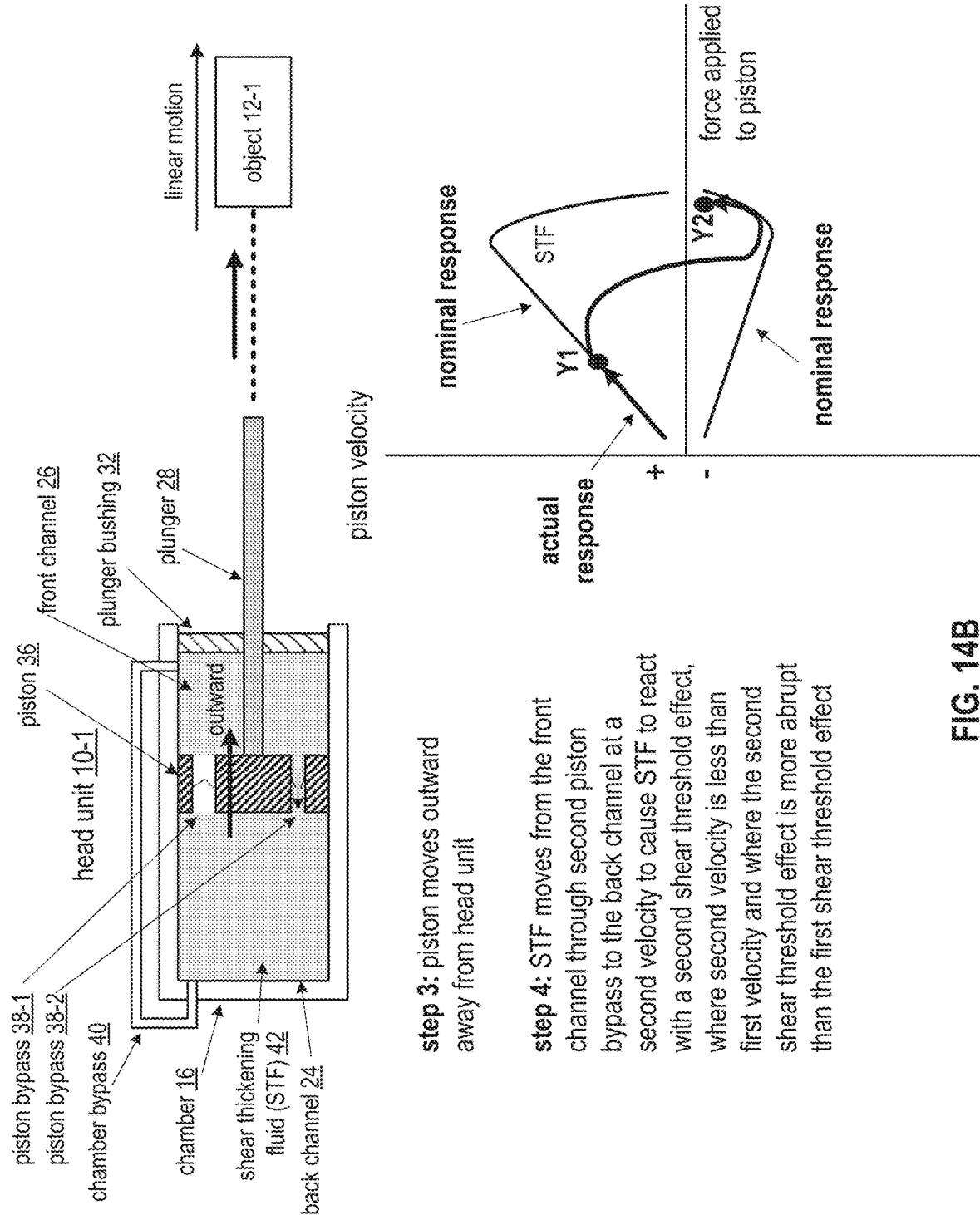

FIGS. 14A-14B are schematic block diagrams of an embodiment of a mechanical system illustrating an example of controlling operational aspects. The mechanical system includes the head unit 10-1 of FIG. 1 and the object 12-1 of FIG. 1.

In particular, the head unit 10-1 for controlling motion of the object 12-1 includes the chamber 16 filled at least in part with the shear thickening fluid (STF) 42. The chamber 16 includes the front channel 26 and the back channel 24.

The piston is housed at least partially radially within the piston compartment of the chamber 16. The piston 36 is configured to exert pressure against the shear thickening fluid in response to movement of the piston 36 from a force applied to the piston 36 via the plunger 28 from the object 12-1.

The movement of the piston 36 includes one of traveling through the chamber 16 in an inward direction or traveling through the chamber 16 in an outward direction. The piston 36 travels toward the back channel 24 and away from the front channel 26 when traveling in the inward direction. The piston travels toward the front channel 26 and away from the back channel 24 when traveling in the outward direction. The STF is configured to have a decreasing viscosity in response to a first range of shear rates and an increasing viscosity in response to a second range of shear rates.

The piston 36 includes a first piston bypass 38-1 between opposite sides of the piston that controls flow of the STF between the opposite sides of the piston from the back channel 24 to the front channel 26 when the piston is traveling through the chamber in the inward direction to cause the STF to react with a first shear threshold effect. The piston 36 further includes a second piston bypass 38-2 between the opposite sides of the piston that controls flow of the STF between the opposite sides of the piston from the front channel 26 to the back channel 24 when the piston 36 is traveling through the chamber in the outward direction to cause the STF to react with a second shear threshold effect.

In another embodiment, the piston includes a single piston bypass between opposite sides of the piston that controls flow of the STF between the opposite sides of the piston between the back channel and the front channel when the piston is traveling through the chamber to cause the STF to react with a shear threshold effect.

When the piston 36 includes two or more piston bypasses, each piston bypass includes a one-way check valve and a variable flow valve. When the piston includes one piston bypass, the piston bypass includes the variable flow valve.

The first piston bypass 38-1 and the second piston bypass 38-2 are configured with a particular diameter of the variable valve to allow the STF to flow through from one channel to the other of the chamber in accordance with a desired overall effect on viscosity of the STF 42. The graph of FIG. 14A illustrates a nominal response curve for plunger velocity versus force applied to the plunger taking into account different diameters of the piston bypasses. For example, when the first piston bypass 38-1 has a larger diameter opening as compared to the opening of the second piston bypass 38-2, the (positive) velocity of the piston is allowed to travel faster since the effect on the viscosity is to lower the viscosity and hence raise the velocity of the piston traveling inward within the chamber.

FIG. 14A illustrates an example of operation of the mechanical system for the controlling the operational aspects. A first step of the example of operation includes the piston moving inwards in response to the object 12-1 applying an inward force to the plunger 28 (e.g., pushing). The actual response is depicted on the graph of FIG. 14A where the actual response follows the nominal response expected for the STF as a point in time of Y1 is reached.

When the piston is traveling through the chamber in the inward direction, the first shear threshold effect includes the first range of shear rates when the STF is configured to have the decreasing viscosity and the second range of shear rates when the STF is configured to have the increasing viscosity. A first setting of the variable flow valve of the first piston bypass 38-1 facilitates the first range of shear rates when the STF is to have the decreasing viscosity and a second setting of the variable flow valve facilitates the second range of shear rates when the STF is to have the increasing viscosity. When the piston is traveling through the chamber in the inward direction, the one-way check valve of the second piston bypass 38-2 prevents STF flow through second piston bypass 38-2.

In the alternative embodiment with the one piston bypass, when the piston is traveling through the chamber, a first setting of the variable flow valve of the one piston bypass facilitates the first range of shear rates when the STF is to have the decreasing viscosity and a second setting of the variable flow valve of the one piston bypass facilitates the second range of shear rates when the STF is to have the increasing viscosity.

A second step of the example of operation includes the STF moving from the back channel 24 through the first piston bypass 38-1 to the front channel 26 at a first velocity to cause the STF to react with a first shear threshold effect. Larger diameters of the first piston bypass 38-1 lowers pressure and shear force within the back channel 24 leading to higher piston velocity as the piston moves inwards.

FIG. 14B further illustrates the example of operation of the mechanical system for the controlling the operational aspects. A third step of the example of operation includes the piston 36 moving outwards in response to the object 12-1 applying an outward force to the plunger 28 (e.g., pulling). The actual response is depicted on a graph of FIG. 14B where the actual response moves to follow the nominal response expected for the STF, at a point in time of Y2, when moving in the outward direction (e.g., negative piston velocity).

When the piston is traveling through the chamber in the outward direction, the second shear threshold effect includes the first range of shear rates when the STF is configured to have the decreasing viscosity and the second range of shear rates when the STF is configured to have the increasing viscosity. In the alternative embodiment with the one piston bypass, when the piston is traveling through the chamber, the shear threshold effect includes the first range of shear rates when the STF is configured to have the decreasing viscosity and the second range of shear rates when the STF is configured to have the increasing viscosity.

When the piston is traveling through the chamber in the outward direction, the one-way check valve of the first piston bypass prevents STF flow through the first piston bypass 38-1. When the piston is traveling through the chamber in the outward direction a first setting of the variable flow valve of the second piston bypass facilitates the first range of shear rates when the STF is to have the decreasing viscosity and a second setting of the variable flow valve of the second piston bypass facilitates the second range of shear rates when the STF is to have the increasing viscosity.

A third step of the example of operation includes the STF moving from the front channel 26 through the second piston bypass 38-2 to the back channel 24 at a second velocity to cause the STF 42 to react with a second shear threshold effect. The second velocity is less than the first velocity and the second shear threshold effect is more abrupt than the first shear threshold effect when the diameter of the second piston bypass 38-2 is less than the diameter of the first piston bypass 38-1. As a result, the mechanical system provides an unequal bidirectional response for the inward and outward motion of the object 12-1.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules, and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A head unit device for controlling motion of an object, comprising:
    a chamber filled at least in part with a shear thickening fluid (STF);
    a piston housed at least partially radially within the chamber, the piston configured to exert pressure against the shear thickening fluid in response to movement of the piston from a force applied to the piston from the object, wherein the movement of the piston includes one of traveling through the chamber in an inward direction and traveling through the chamber in an outward direction, wherein the STF is configured to have a decreasing viscosity in response to a first range of shear rates and an increasing viscosity in response to a second range of shear rates;
    a variable partition positioned within the chamber between the piston and a closed end of the chamber to dynamically affect volume of the chamber based on activation of the variable partition;
    a set of fluid flow sensors positioned proximal to the chamber, wherein the set of fluid flow sensors provide a fluid response from the STF; and
    a set of fluid manipulation emitters positioned proximal to the chamber, wherein the set of fluid manipulation emitters provide a fluid activation to the STF.

2. The head unit device of claim 1, wherein the head unit device further comprises:
    a plunger between the object and the piston, the plunger configured to apply the force from the object to move the piston within the chamber.

3. The head unit device of claim 2, wherein the head unit device further comprises:
    a plunger bushing to guide the plunger into the chamber in response to the force from the object, wherein the plunger bushing facilitates containment of the STF within the chamber, wherein the plunger bushing remains in a fixed position relative to the chamber when the force from the object moves the piston within the chamber.

4. The head unit device of claim 1, wherein the STF comprises:
    a plurality of nanoparticles, wherein the plurality of nanoparticles includes one or more of an oxide, calcium carbonate, synthetically occurring minerals, naturally occurring minerals, polymers, SiO2, polystyrene, polymethylmethacrylate, or a mixture thereof.

5. The head unit device of claim 1, wherein the STF comprises:
    one or more of ethylene glycol, polyethylene glycol, ethanol, silicon oils, phenyltrimethicone, or a mixture thereof.

6. The head unit device of claim 1, wherein the head unit device further comprises:
    a piston bypass between opposite sides of the piston, wherein the piston bypass facilitates flow of a portion of the STF between the opposite sides of the piston when the piston travels through the chamber in the inward or outward direction.

7. The head unit device of claim 1, wherein the head unit device further comprises:
    a chamber bypass between opposite ends of the chamber, wherein the chamber bypass facilitates flow of a portion of the STF between the opposite ends of the chamber when the piston travels through the chamber in the inward or outward direction.

8. The head unit device of claim 1, wherein the set of fluid flow sensors comprises one or more of:
    a mechanical position sensor,
    an image sensor,
    a light sensor,
    an audio sensor,
    a microphone,
    an ultrasonic sound sensor,
    an electric field sensor,
    a magnetic field sensor, and
    a radio frequency wireless field sensor.

9. The head unit device of claim 1, wherein the set of fluid manipulation emitters comprises one or more of:
    a mechanical vibration generator,
    an image generator,
    a light emitter,
    an audio transducer, a speaker,
an ultrasonic sound transducer,
an electric field generator,
a magnetic field generator, and
a radio frequency wireless field transmitter.

10. A method for execution by a computing device, the method comprises:
   interpreting a fluid flow response from a set of fluid flow sensors to produce a piston velocity and a piston position of a piston associated with a head unit device, wherein the set of fluid flow sensors are positioned proximal to the head unit device for controlling motion of an object, wherein the head unit device includes:
      a chamber filled at least in part with a shear thickening fluid (STF),
      the piston housed at least partially radially within the chamber, the piston configured to exert pressure against the shear thickening fluid in response to movement of the piston from a force applied to the piston from the object, wherein the movement of the piston includes one of traveling through the chamber in an inward direction and traveling through the chamber in an outward direction, wherein the STF is configured to have a decreasing viscosity in response to a first range of shear rates and an increasing viscosity in response to a second range of shear rates, and
      a variable partition positioned within the chamber between the piston and a closed end of the chamber to dynamically affect volume of the chamber based on activation of the variable partition;
   determining a shear force based on the piston velocity and the piston position;
   determining a desired response for the STF based on one or more of the shear force, the piston velocity, and the piston position; and
   activating the variable partition in accordance with the desired response for the STF to adjust the volume of the chamber.

11. The method of claim 10, wherein the interpreting the fluid flow response from the set of fluid flow sensors to produce the piston velocity and the piston position of the piston comprises:
   inputting, from one or more fluid flow sensors of the set of fluid flow sensors, a set of fluid flow signals over a time range;
   determining the fluid flow response of the set of fluid flow sensors based on the set of fluid flow signals;
   determining the piston velocity based on the fluid flow response of the set of fluid flow sensors over the time range; and
   determining the piston position based on the piston velocity and a real-time reference.

12. The method of claim 10, wherein the determining the shear force based on the piston velocity and the piston position comprises one of:
   extracting the shear force directly from the fluid flow response when one or more fluid flow sensors of the set of fluid flow sensors outputs a shear force encoded signal;
   determining the shear force utilizing the piston velocity and stored data for piston velocity verses shear force for the STF; and
   determining the shear force utilizing the piston position and stored data for piston position and a position of the variable partition verses shear force for the STF within the chamber.

13. The method of claim 10, wherein the determining the desired response for the STF based on one or more of the shear force, the piston velocity, and the piston position comprises one or more of:
   interpreting a request associated with modifying one or more of object velocity and object position;
   interpreting guidance from a chamber database;
   establishing the desired response to include facilitating the second range of shear rates to slow down the object when detecting that the piston position is greater than a maximum piston position threshold level;
   establishing the desired response to include facilitating the first range of shear rates to speed up the object when detecting that the piston position is less than a minimum piston position threshold level;
   establishing the desired response to include facilitating the second range of shear rates to slow down the object when detecting that the piston velocity is greater than a maximum piston velocity threshold level;
   establishing the desired response to include facilitating the first range of shear rates to speed up the object when detecting that the piston velocity is less than a minimum piston velocity threshold level;
   establishing the desired response to include facilitating the second range of shear rates to slow down the object when detecting that the shear force is less than a minimum shear force threshold level;
   establishing the desired response to include facilitating the first range of shear rates to speed up the object when detecting that the shear force is greater than a maximum shear force threshold level;
   detecting an environmental condition warranting a change in viscosity of the STF;
   establishing the desired response to include activation of the variable partition to expand the volume of the chamber when establishing the desired response to include facilitating the first range of shear rates; and
   establishing the desired response to include activation of the variable partition to contract the volume of the chamber when establishing the desired response to include facilitating the second range of shear rates.

14. The method of claim 10, wherein the activating the variable partition in accordance with the desired response for the STF to adjust the volume of the chamber comprises one or more of:
   generating a variable partition activation to expand the volume of the chamber when the desired response for the STF includes facilitating the first range of shear rates;
   generating the variable partition activation to contract the volume of the chamber when the desired response for the STF includes facilitating the second range of shear rates; and
   outputting the variable partition activation to the variable partition.

15. A non-transitory computer readable memory comprises:
   a first memory element that stores operational instructions that, when executed by a processing module, causes the processing module to:
      interpret a fluid flow response from a set of fluid flow sensors to produce a piston velocity and a piston position of a piston associated with a head unit device, wherein the set of fluid flow sensors are positioned proximal to the head unit device for controlling motion of an object, wherein the head unit device includes:

a chamber filled at least in part with a shear thickening fluid (STF), the piston housed at least partially radially within the chamber, the piston configured to exert pressure against the shear thickening fluid in response to movement of the piston from a force applied to the piston from the object, wherein the movement of the piston includes one of traveling through the chamber in an inward direction and traveling through the chamber in an outward direction, wherein the STF is configured to have a decreasing viscosity in response to a first range of shear rates and an increasing viscosity in response to a second range of shear rates, and a variable partition positioned within the chamber between the piston and a closed end of the chamber to dynamically affect volume of the chamber based on activation of the variable partition;

a second memory element that stores operational instructions that, when executed by the processing module, causes the processing module to:
determine a shear force based on the piston velocity and the piston position;

a third memory element that stores operational instructions that, when executed by the processing module, causes the processing module to:
determine a desired response for the STF based on one or more of the shear force, the piston velocity, and the piston position; and a fourth memory element that stores operational instructions that, when executed by the processing module, causes the processing module to:
activate the variable partition in accordance with the desired response for the STF to adjust the volume of the chamber.

16. The non-transitory computer readable memory of claim 15, wherein the processing module performs functions to execute the operational instructions stored by the first memory element to cause the processing module to interpret the fluid flow response from the set of fluid flow sensors to produce the piston velocity and the piston position of the piston by:
inputting, from one or more fluid flow sensors of the set of fluid flow sensors, a set of fluid flow signals over a time range;
determining the fluid flow response of the set of fluid flow sensors based on the set of fluid flow signals;
determining the piston velocity based on the fluid flow response of the set of fluid flow sensors over the time range; and
determining the piston position based on the piston velocity and a real-time reference.

17. The non-transitory computer readable memory of claim 15, wherein the processing module performs functions to execute the operational instructions stored by the second memory element to cause the processing module to determine the shear force based on the piston velocity and the piston position by one of:
extracting the shear force directly from the fluid flow response when one or more fluid flow sensors of the set of fluid flow sensors outputs a shear force encoded signal;
determining the shear force utilizing the piston velocity and stored data for piston velocity verses shear force for the STF; and determining the shear force utilizing the piston position and stored data for piston position and a position of the variable partition verses shear force for the STF within the chamber.

18. The non-transitory computer readable memory of claim 15, wherein the processing module performs functions to execute the operational instructions stored by the third memory element to cause the processing module to determine the desired response for the STF based on one or more of the shear force, the piston velocity, and the piston position by one or more of:
interpreting a request associated with modifying one or more of object velocity and object position;
interpreting guidance from a chamber database;
establishing the desired response to include facilitating the second range of shear rates to slow down the object when detecting that the piston position is greater than a maximum piston position threshold level;
establishing the desired response to include facilitating the first range of shear rates to speed up the object when detecting that the piston position is less than a minimum piston position threshold level;
establishing the desired response to include facilitating the second range of shear rates to slow down the object when detecting that the piston velocity is greater than a maximum piston velocity threshold level;
establishing the desired response to include facilitating the first range of shear rates to speed up the object when detecting that the piston velocity is less than a minimum piston velocity threshold level;
establishing the desired response to include facilitating the second range of shear rates to slow down the object when detecting that the shear force is less than a minimum shear force threshold level;
establishing the desired response to include facilitating the first range of shear rates to speed up the object when detecting that the shear force is greater than a maximum shear force threshold level;
detecting an environmental condition warranting a change in viscosity of the STF;
establishing the desired response to include activation of the variable partition to expand the volume of the chamber when establishing the desired response to include facilitating the first range of shear rates; and
establishing the desired response to include activation of the variable partition to contract the volume of the chamber when establishing the desired response to include facilitating the second range of shear rates.

19. The non-transitory computer readable memory of claim 15, wherein the processing module performs functions to execute the operational instructions stored by the fourth memory element to cause the processing module to activate the variable partition in accordance with the desired response for the STF to adjust the volume of the chamber by one or more of:
generating a variable partition activation to expand the volume of the chamber when the desired response for the STF includes facilitating the first range of shear rates;
generating the variable partition activation to contract the volume of the chamber when the desired response for the STF includes facilitating the second range of shear rates; and
outputting the variable partition activation to the variable partition.

* * * * *